(12) United States Patent
Lu et al.

(10) Patent No.: US 10,554,110 B2
(45) Date of Patent: Feb. 4, 2020

(54) DISPLACEMENT DEVICES AND METHODS FOR FABRICATION, USE AND CONTROL OF SAME

(71) Applicant: The University of British Columbia, Vancouver (CA)

(72) Inventors: Xiaodong Lu, Vancouver (CA); Irfan-Ur-Rab Usman, Richmond (CA)

(73) Assignee: The University of British Columbia, Vancouver (CA)

(*) Notice: Subject to any disclaimer, the term of this patent is extended or adjusted under 35 U.S.C. 154(b) by 210 days.

(21) Appl. No.: 15/920,309

(22) Filed: Mar. 13, 2018

(65) Prior Publication Data
US 2018/0269764 A1    Sep. 20, 2018

Related U.S. Application Data

(63) Continuation of application No. 15/595,941, filed on May 15, 2017, now Pat. No. 10,008,915, which is a
(Continued)

(51) Int. Cl.
*H02K 41/02* (2006.01)
*H02K 21/24* (2006.01)
(Continued)

(52) U.S. Cl.
CPC .......... *H02K 41/02* (2013.01); *H01L 21/67* (2013.01); *H02K 1/26* (2013.01); *H02K 1/2793* (2013.01);
(Continued)

(58) Field of Classification Search
CPC ........ H01L 21/67; H02K 1/2793; H02K 3/28; H02K 7/09; H02K 21/24; H02K 41/02;
(Continued)

(56) References Cited

U.S. PATENT DOCUMENTS

| 3,376,578 A | 4/1968 | Sawyer |
| 3,894,276 A | 7/1975 | Janssen |

(Continued)

FOREIGN PATENT DOCUMENTS

| CN | 201956875 | 8/2011 |
| EP | 1357434 | 10/2003 |

(Continued)

OTHER PUBLICATIONS

Xiaodong Lu et al.: 6D direct-drive technology for planar motion stages, CIRP Annals, vol. 61, No. 1, pp. 359-362, XP028511153, ISSN: 0007-8506, DOI: 10.1016/J.CIRP.2012.03.145.
(Continued)

*Primary Examiner* — Bickey Dhakal
(74) *Attorney, Agent, or Firm* — Todd A. Rattray, Oyen Wiggs Green & Mutala LLP

(57) ABSTRACT

Displacement devices comprise a stator and a moveable stage. The stator comprises a plurality of coils shaped to provide pluralities of generally linearly elongated coil traces in one or more layers. Layers of coils may overlap in the Z-direction. The moveable stage comprises a plurality of magnet arrays. Each magnet array may comprise a plurality of magnetization segments generally linearly elongated in a corresponding direction. Each magnetization segment has a magnetization direction generally orthogonal to the direction in which it is elongated and at least two of the magnetization directions are different from one another. One or more amplifiers may be connected to selectively drive current in the coil traces and to thereby effect relative movement between the stator and the moveable stage.

20 Claims, 32 Drawing Sheets

Related U.S. Application Data continuation of application No. 14/920,885, filed on Oct. 23, 2015, now Pat. No. 9,685,849, which is a continuation of application No. 14/354,515, filed as application No. PCT/CA2012/050751 on Oct. 22, 2012, now Pat. No. 9,202,719.

(60) Provisional application No. 61/694,776, filed on Aug. 30, 2012, provisional application No. 61/551,953, filed on Oct. 27, 2011.

(51) Int. Cl.
  *H02K 41/03* (2006.01)
  *H02K 1/27* (2006.01)
  *H02K 3/28* (2006.01)
  *H02K 7/09* (2006.01)
  *H01L 21/67* (2006.01)
  *H02K 1/26* (2006.01)

(52) U.S. Cl.
  CPC ............... *H02K 3/28* (2013.01); *H02K 7/09* (2013.01); *H02K 21/24* (2013.01); *H02K 41/031* (2013.01); *H02K 2201/18* (2013.01)

(58) Field of Classification Search
  CPC .... H02K 41/031; H02K 2201/18; H02K 3/26; H02K 15/095; H02K 3/18; H02K 3/522; H02K 11/0021; H02K 11/0026; H02K 11/0073; H02K 16/04; H02K 11/0015; H02K 15/12; H02K 1/17
  See application file for complete search history.

(56) References Cited

U.S. PATENT DOCUMENTS

| | | | |
|---|---|---|---|
| 4,535,278 A | 8/1985 | Asakawa | |
| 4,654,571 A | 3/1987 | Hinds | |
| 4,835,424 A | 5/1989 | Hoffman et al. | |
| 5,196,745 A | 3/1993 | Trumper | |
| 5,334,892 A | 8/1994 | Chitayat | |
| 5,925,956 A | 7/1999 | Ohzeki | |
| 6,003,230 A | 12/1999 | Trumper et al. | |
| 6,005,309 A | 12/1999 | Chitayat | |
| 6,069,418 A * | 5/2000 | Tanaka ................. G03F 7/70758 29/760 |
| 6,072,251 A | 6/2000 | Markle | |
| 6,097,114 A | 8/2000 | Hazelton | |
| 6,144,119 A | 11/2000 | Hazelton | |
| 6,208,045 B1 | 3/2001 | Hazelton et al. | |
| 6,252,234 B1 | 6/2001 | Hazelton et al. | |
| 6,304,320 B1 | 10/2001 | Tanaka et al. | |
| 6,339,266 B1 | 1/2002 | Tanaka | |
| 6,437,463 B1 | 8/2002 | Hazelton et al. | |
| 6,441,514 B1 | 8/2002 | Markle | |
| 6,445,093 B1 | 9/2002 | Binnard | |
| 6,452,292 B1 | 9/2002 | Binnard | |
| 6,495,934 B1 | 12/2002 | Hayashi et al. | |
| 6,531,793 B1 | 3/2003 | Frissen et al. | |
| 6,590,355 B1 | 7/2003 | Kikuchi et al. | |
| 6,650,079 B2 | 11/2003 | Binnard | |
| 6,710,495 B2 | 3/2004 | Lipo et al. | |
| 6,720,680 B1 | 4/2004 | Tanaka | |
| 6,777,896 B2 | 8/2004 | Teng | |
| 6,835,941 B1 | 12/2004 | Tanaka | |
| 6,847,134 B2 | 1/2005 | Frissen et al. | |
| 6,879,063 B2 | 4/2005 | Frissen et al. | |
| 6,885,430 B2 | 4/2005 | Tanaka et al. | |
| 6,949,844 B2 | 9/2005 | Cahill et al. | |
| 6,987,335 B2 | 1/2006 | Korenaga | |
| 7,057,370 B2 | 6/2006 | Touzov | |
| 7,075,198 B2 | 7/2006 | Korenaga | |
| 7,084,534 B2 | 8/2006 | Ohishi | |
| 7,199,493 B2 | 4/2007 | Ohishi | |
| 7,224,252 B2 | 5/2007 | Meadow, Jr. et al. | |
| 7,227,284 B2 | 6/2007 | Korenaga | |
| 7,436,135 B2 | 10/2008 | Miyakawa | |
| 7,550,890 B2 | 6/2009 | Kloeppel et al. | |
| 7,696,653 B2 | 4/2010 | Tanaka | |
| 7,808,133 B1 | 10/2010 | Widdowson et al. | |
| 7,948,122 B2 | 5/2011 | Compter et al. | |
| 8,031,328 B2 | 10/2011 | Asano et al. | |
| 8,046,904 B2 | 11/2011 | Kloeppel et al. | |
| 8,129,984 B2 | 3/2012 | Hosek et al. | |
| 8,384,317 B2 | 2/2013 | Shikayama et al. | |
| 8,593,016 B2 | 11/2013 | Pelrine et al. | |
| 8,686,602 B2 | 4/2014 | Pelrine et al. | |
| 8,736,133 B1 | 5/2014 | Smith et al. | |
| 9,202,719 B2 * | 12/2015 | Lu ........................ H02K 21/24 |
| 9,685,849 B2 | 6/2017 | Lu et al. | |
| 2002/0149270 A1 | 10/2002 | Hazelton | |
| 2002/0149271 A1 | 10/2002 | Bartolotti | |
| 2002/0180395 A1 | 12/2002 | Binnard | |
| 2003/0085627 A1 | 5/2003 | Lipo et al. | |
| 2004/0007920 A1 | 1/2004 | Teng | |
| 2004/0140780 A1 | 7/2004 | Cahill et al. | |
| 2005/0001579 A1 | 1/2005 | Touzov | |
| 2005/0090902 A1 | 4/2005 | Masini | |
| 2005/0093378 A1 | 5/2005 | Ohishi | |
| 2005/0194843 A1 | 9/2005 | Korenaga | |
| 2005/0194918 A1 | 9/2005 | Takeuchi | |
| 2006/0175993 A1 | 8/2006 | Shibata et al. | |
| 2006/0214518 A1 | 9/2006 | Ohishi | |
| 2007/0035267 A1 | 2/2007 | Gao et al. | |
| 2007/0046127 A1 | 3/2007 | Kloeppel et al. | |
| 2007/0046221 A1 | 3/2007 | Miyakawa | |
| 2007/0145831 A1 | 6/2007 | Antonius Theodorus Dams |
| 2008/0203828 A1 | 8/2008 | Cornelis et al. | |
| 2008/0285005 A1 | 11/2008 | Gery et al. | |
| 2008/0290741 A1 | 11/2008 | Cardon et al. | |
| 2009/0058199 A1 | 3/2009 | Ito | |
| 2009/0195195 A1 | 8/2009 | Huang | |
| 2009/0251678 A1 | 10/2009 | Ohishi | |
| 2009/0315413 A1 | 12/2009 | Iwatani et al. | |
| 2010/0090545 A1 | 4/2010 | Binnard et al. | |
| 2010/0167556 A1 | 7/2010 | Totsu et al. | |
| 2010/0238425 A1 | 9/2010 | Binnard | |
| 2011/0050007 A1 | 3/2011 | Kubo | |
| 2011/0062901 A1 | 3/2011 | Busch | |
| 2011/0101896 A1 | 5/2011 | Shikayama et al. | |
| 2012/0113405 A1 | 5/2012 | Yang et al. | |
| 2012/0127447 A1 | 5/2012 | Yang et al. | |
| 2012/0139455 A1 | 6/2012 | Tojo et al. | |
| 2012/0300186 A1 | 11/2012 | Butler et al. | |
| 2013/0140372 A1 | 6/2013 | Mahadeswaraswamy et al. |
| 2013/0164687 A1 | 6/2013 | Binnard et al. | |
| 2013/0241575 A1 | 9/2013 | Finkler | |
| 2014/0285122 A1 | 9/2014 | Lu et al. | |
| 2015/0097498 A1 | 4/2015 | Hemati et al. | |
| 2015/0137624 A1 | 5/2015 | Wu et al. | |
| 2015/0338750 A1 | 11/2015 | Yang et al. | |
| 2016/0065043 A1 | 3/2016 | Lu et al. | |
| 2016/0161288 A1 | 6/2016 | Lu | |

FOREIGN PATENT DOCUMENTS

| | | |
|---|---|---|
| JP | 4008006642 | 1/1996 |
| JP | 2002112526 | 4/2002 |
| JP | 2003209963 | 7/2003 |
| JP | 2004047981 | 2/2004 |
| JP | 2004254489 | 9/2004 |
| TW | 201330485 | 7/2013 |
| WO | 2001018944 | 3/2001 |
| WO | 20050909202 | 9/2005 |
| WO | 2013059934 | 5/2013 |
| WO | 2015017933 | 2/2015 |
| WO | 2015179962 | 12/2015 |
| WO | 2015184553 | 12/2015 |
| WO | 2015188281 | 12/2015 |
| WO | 2016012157 | 1/2016 |
| WO | 2016012158 | 1/2016 |
| WO | 2016012159 | 1/2016 |

(56) References Cited

FOREIGN PATENT DOCUMENTS

| WO | 2016012160 | 1/2016 |
|---|---|---|
| WO | 2016012171 | 1/2016 |
| WO | 2016091441 | 6/2016 |

OTHER PUBLICATIONS

Cho et al., "Magnetic Field Analysis of 2-D Permanent Magnet Array for Planar Motor", IEEE Tran. On Magnetics, 2001, vol. 37 No. 5, pp. 3762-3766.

Filho, A.F.F., "Investigation of the Forces Produced by a New Electromagnetic Planar Actuator", Electric Machines and Drives Conference, IEMDC 2001. IEEE International, pp. 8-13.

Filho, A.F., "Analysis of a DC XY-Actuator", XIX International Conference on Electrical Machines—ICEM 2010, Rome.

Filho, A.F., "Development of a novel planar actuator", Ninth International Conference on Electrical Machines and Drives, Conference Publication No. 468, 1999.

Fujii et al., "X-Y Linear Synchronous Motors Without Force Ripple and Core Loss for Precision Two-Dimensional Drives", IEEE Transactions On Magnetics, vol. 38, No. 5, Sep. 2002.

Buckley et al., "Step-and-scan lithography using reduction optics", J. Vae. Sci. Technol. B 7 (6), Nov./Dec. 1989.

Hesse et al., "Interferometric Controlled Planar Nanopositioning System With 100 MM Circular Travel Range", ASPE 2011 Annual Meeting, Denver, Co.

Tomita et al., "Study on a surface-motor driven precise positioning system", Journal of Dynamic Systems, Measurement, and Control Sep. 1995, vol. 117/311-319.

Ueda et al., "A planar actuator with a small mover traveling over large yaw and translational dispalcements", IEEE Transactions On Magnetics, vol. 44, No. 5, May 2008.

Kajiyama et al., "Development of ironless type surface motor", XIX International Conference on Electrical Machines—ICEM 2010, Rome.

Shinno et al., "A Newly Developed Linear Motor-Driven Aerostatic X-Y Planar Motion Table System for Nano-Machining", Annals of the CIRP, 2007, 56/1:369-372.

Gao et al., "A surface motor-driven planar motion stage integrated with an XY0Z surface encoder for precision positioning", Precision Engineering, 2004, 28/3:329-337.

In et al., "Design of a planar-type high speed parallel mechanism positioning platform with the capability of 180 degrees orientation", Annals of the CIRP, 2008, 57/1:421-424.

Lee et al., "Dynamic Modeling and Control of a Ball-Joint-Like Variable-Reluctance Spherical Motor", Journal of Dynamic Systems, Measurement, and Control, 1996, 118/1:29-40.

Weck et al., "Design of a Spherical Motor with Three Degrees of Freedom", Annals of the CIRP, 2000, 49/1:289-294.

Hollis et al., "A six-degree-of-freedom magnetically levitated variable compliance fine-motion wrist: Design, modeling, control", IEEE Trans. Robot. Automat, 1991, 7/3:320-332.

Verma et al., "Six-axis nanopositioning device with precision magnetic levitation technology", IEEE Tran. On Mechatronics, 2004, 9/2:384-391.

Kim et al., "High-precision magnetic levitation stage for photolithography", Precision Engineering, 1998, 22/2:66-77.

Holmes et al., "The Long-Range Scanning Stage: a Novel Platform for Scanned-Probe Microscopy", Precision Engineering, 2000, 24/3:191-209.

Etxaniz et al., "Magnetic Levitated 2D Fast Drive", IEEJ Transactions on Industry Applications, 2006, 126/12:1678-1681.

Compter, J., "Electro-dynamic planar motor", Precision Engineering, 2003, 28/2: 171-180.

Jansen et al., "Modeling of magnetically levitated planar actuators with moving magnets", IEEE Tran. Magnetic, 2007, 43/1:15-25.

Trumper et al., "Magnet arrays for synchronous machines", IEEE Industry Applications Society Annual Meeting, 1993, 1:9-18.

Jansen et al., "Magnetically Levitated Planar Actuator with Moving Magnets", IEEE Tran. Ind. App.,vol. 44, No. 4, 2008.

Kim, W.J., "High-Precision Planar Magnetic Levitation", Massachusetts Institute of Technology, Jun. 1997.

Jansen, J.W., "Magnetically levitated planar actuator with moving magnets: Electromechanical analysis and design", IOP-EMVT, SenterNovem, an agency of the Dutch Ministry of Economic Affairs, 2007.

Khan et al., "A Long Stroke Electromagnetic XY Positioning Stage for Micro Applications", IEEE/ASME Transactions on Mechatronics, vol. 17, No. 5, Oct. 2012, pp. 866-875.

\* cited by examiner

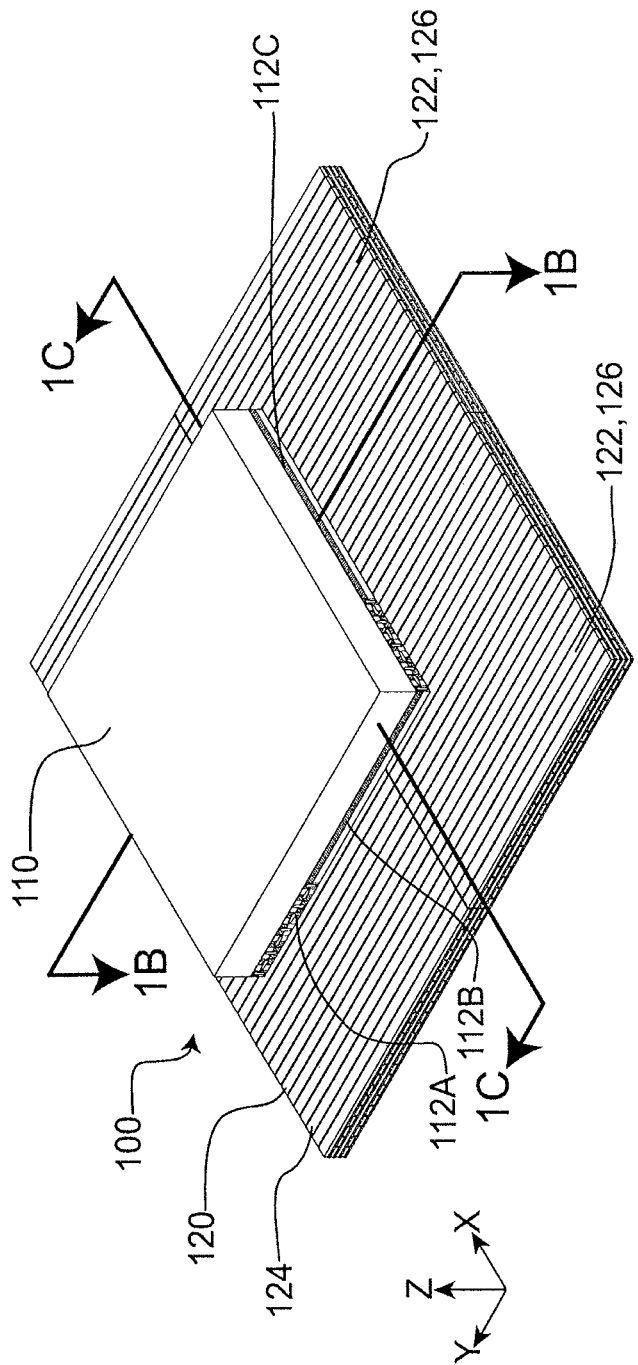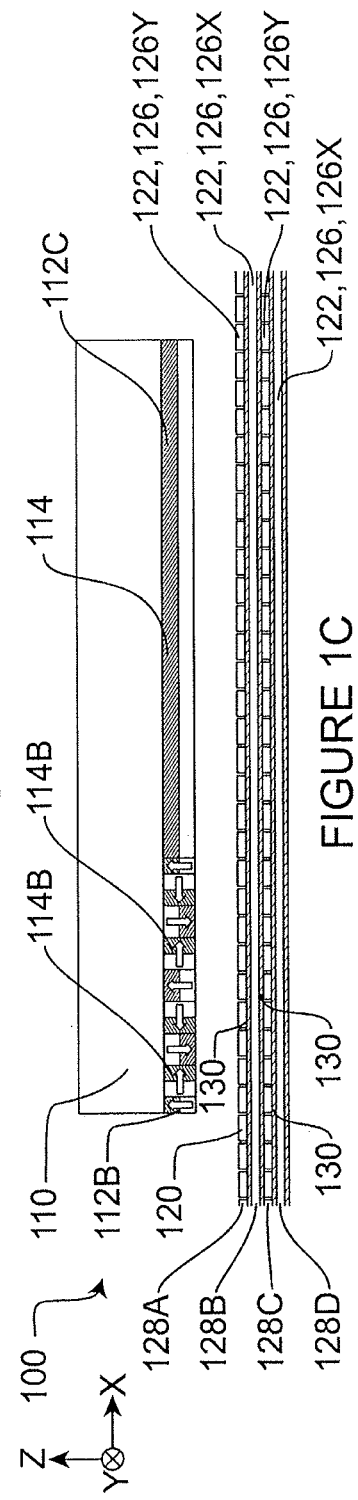
FIGURE 1A
FIGURE 1C

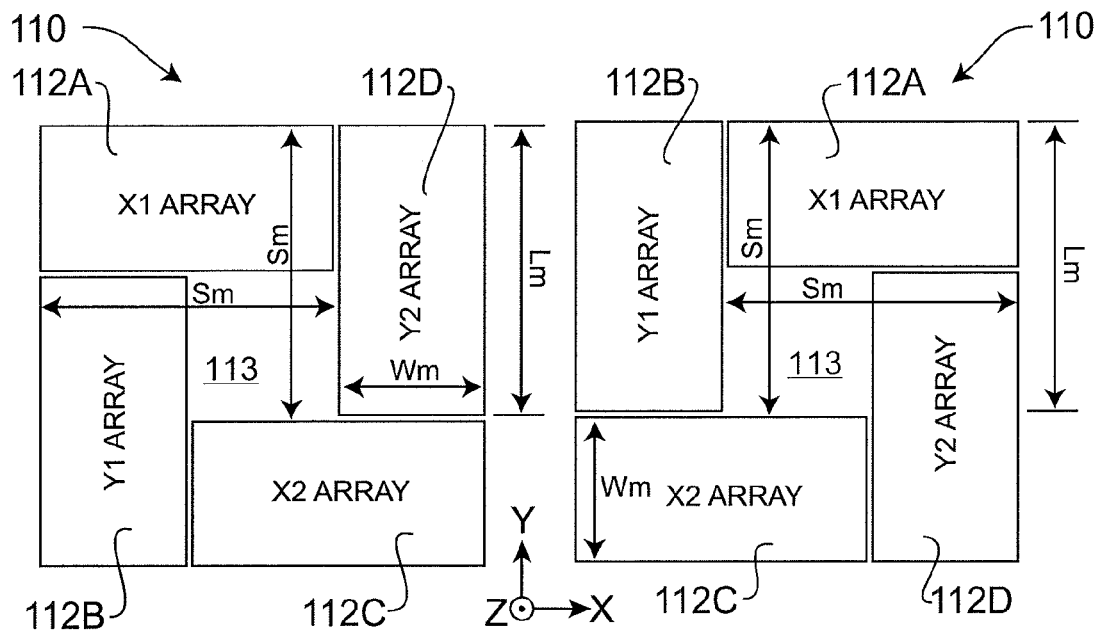
FIGURE 6A
FIGURE 6B
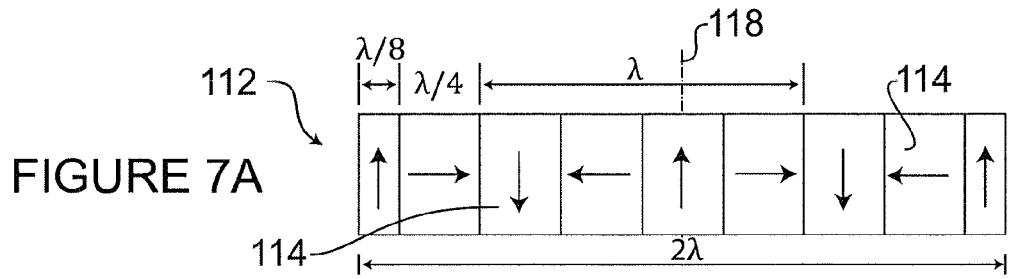
FIGURE 7A
FIGURE 7B
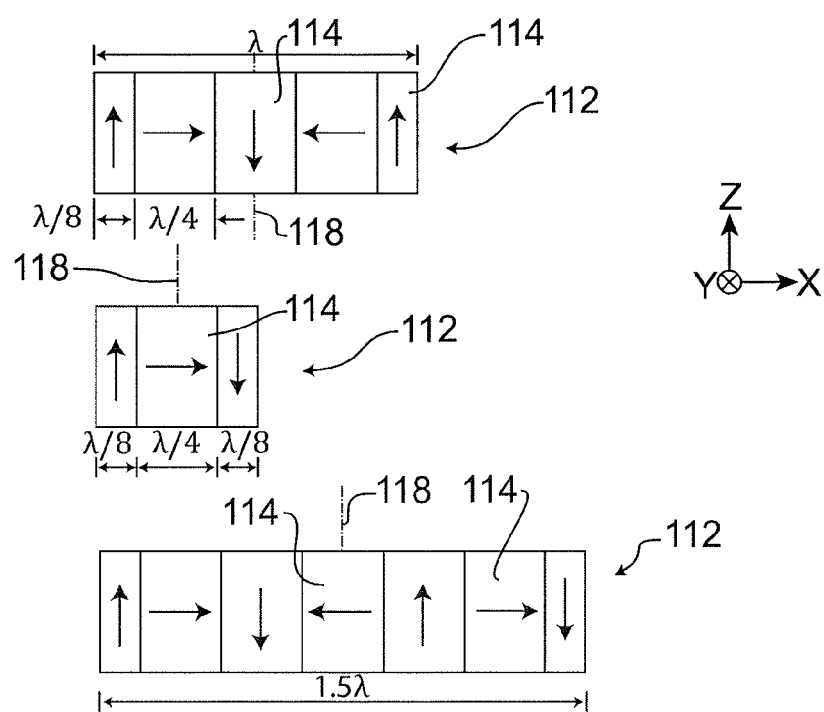
FIGURE 7C
FIGURE 7D

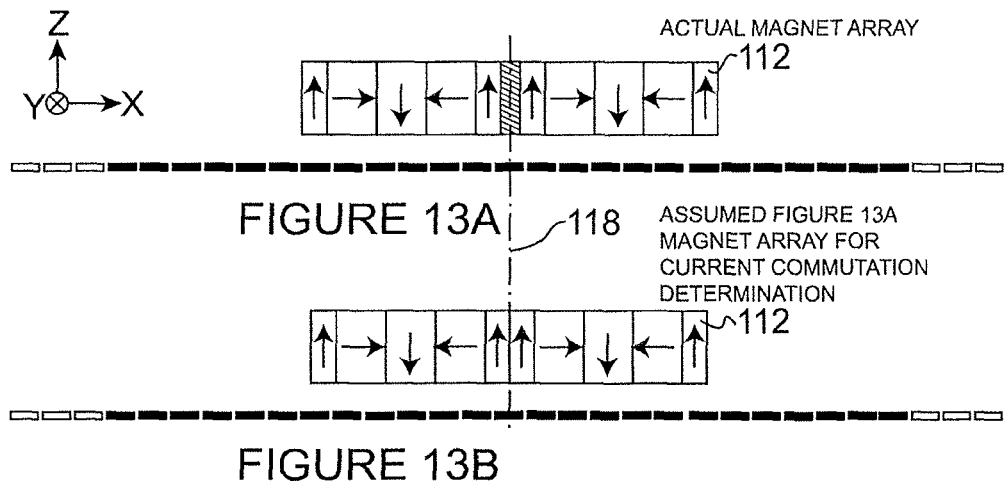
FIGURE 13A
FIGURE 13B
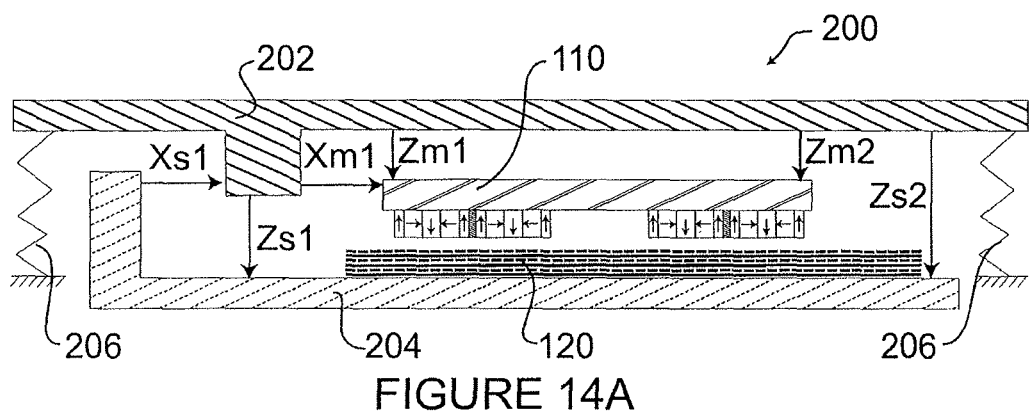
FIGURE 14A
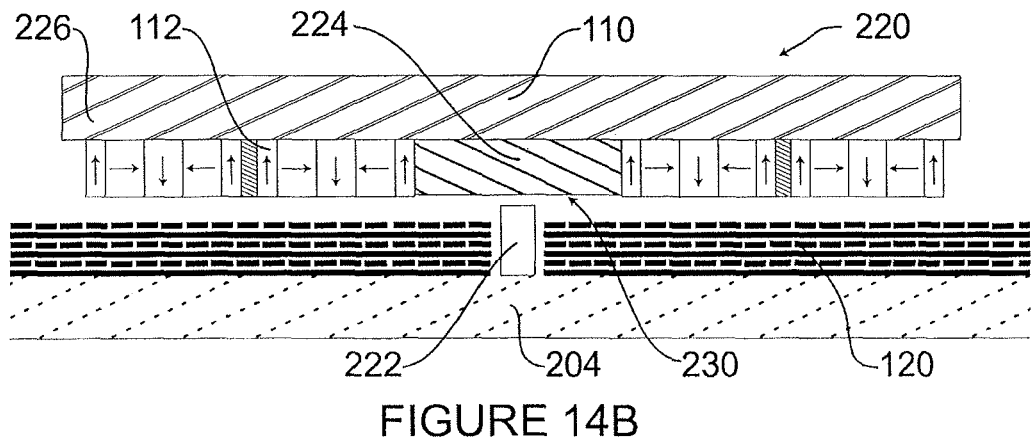
FIGURE 14B

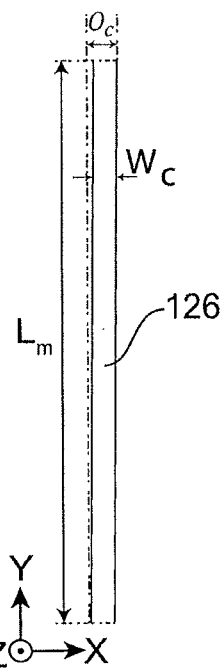
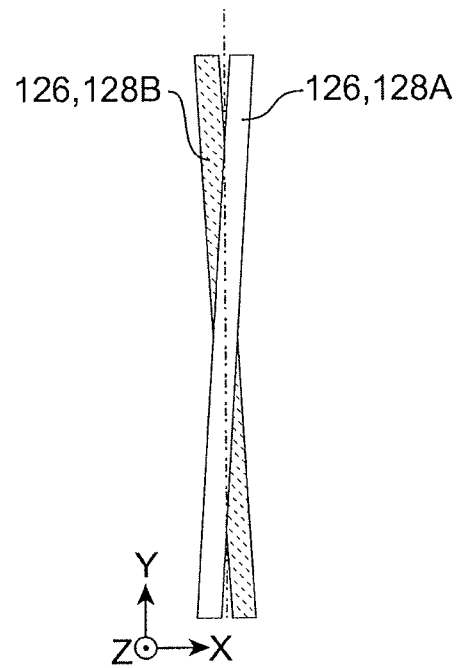
FIGURE 22A     FIGURE 22B
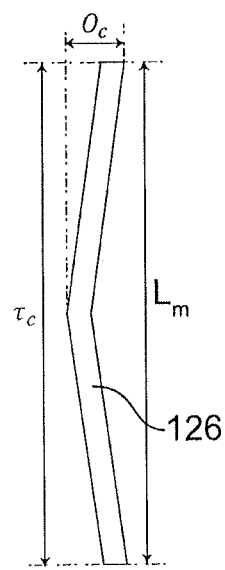
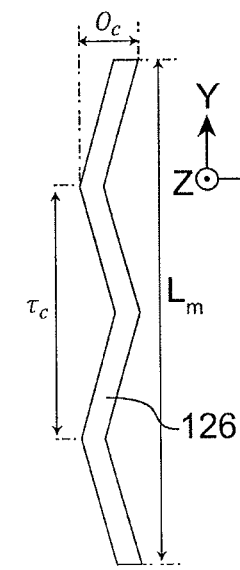
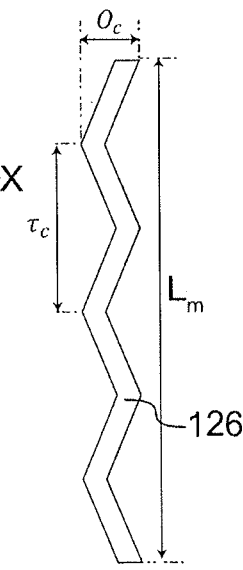
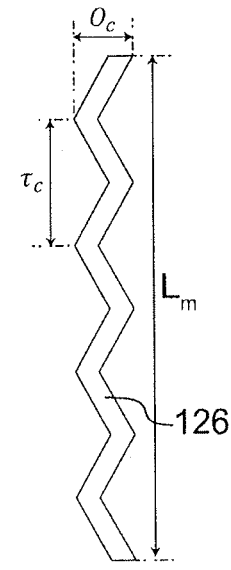
$\tau_c = L_m$    $\tau_c = L_m/2$    $\tau_c = L_m/3$    $\tau_c = L_m/4$
FIGURE 23A    FIGURE 23B    FIGURE 23C    FIGURE 23D

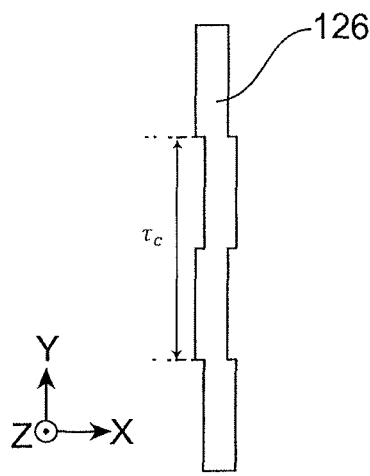 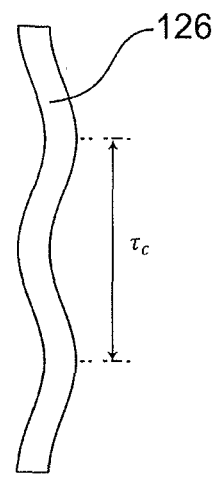
FIGURE 23E  FIGURE 23F
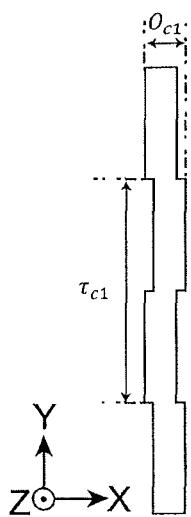 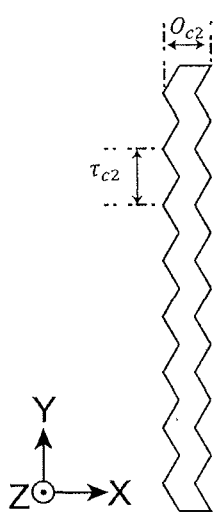 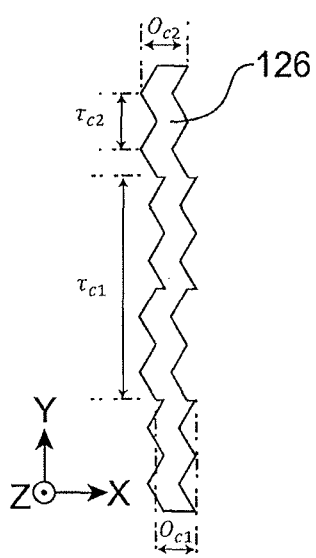
Square wave    Triangle wave    Square wave, superimposed with triangle wave
FIGURE 24A    FIGURE 24B    FIGURE 24C

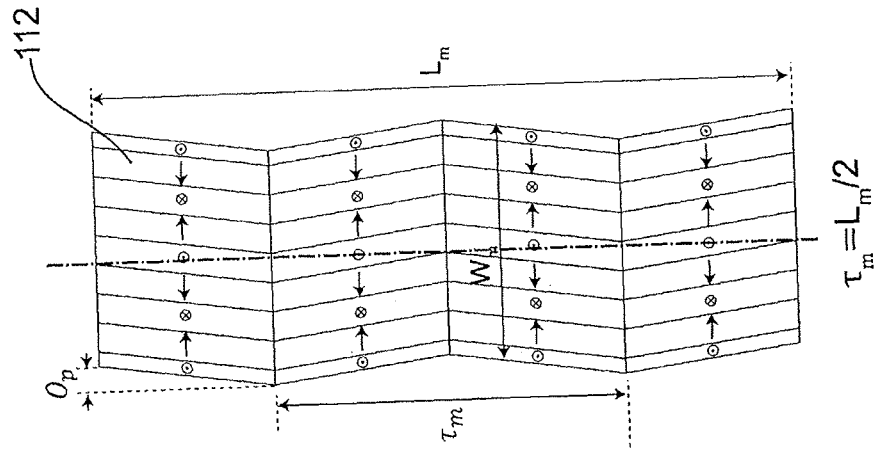
FIGURE 26C
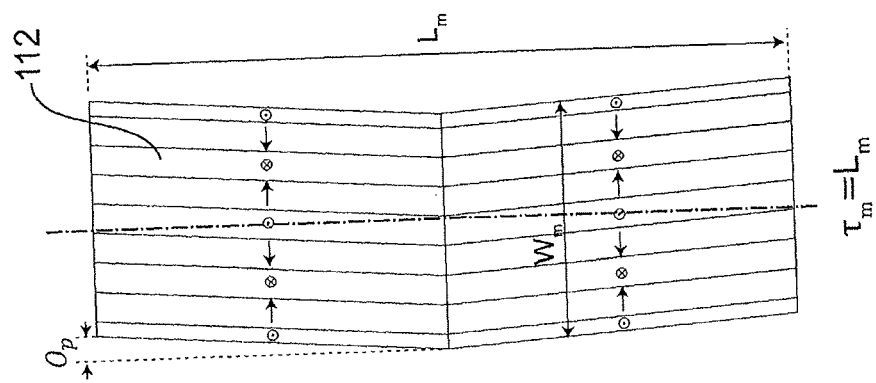
FIGURE 26B
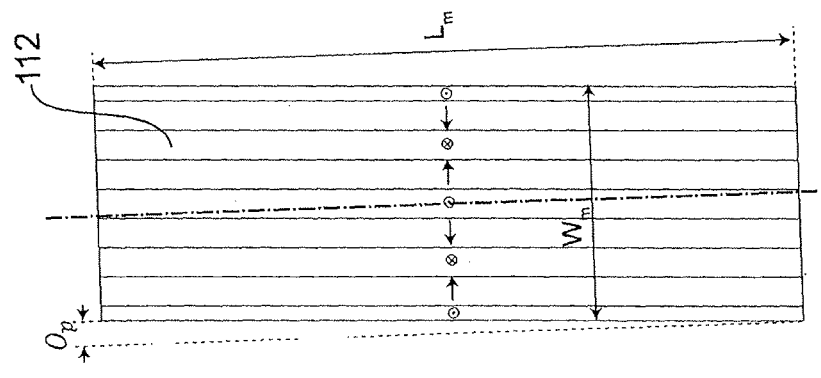
FIGURE 26A
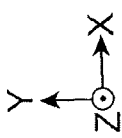

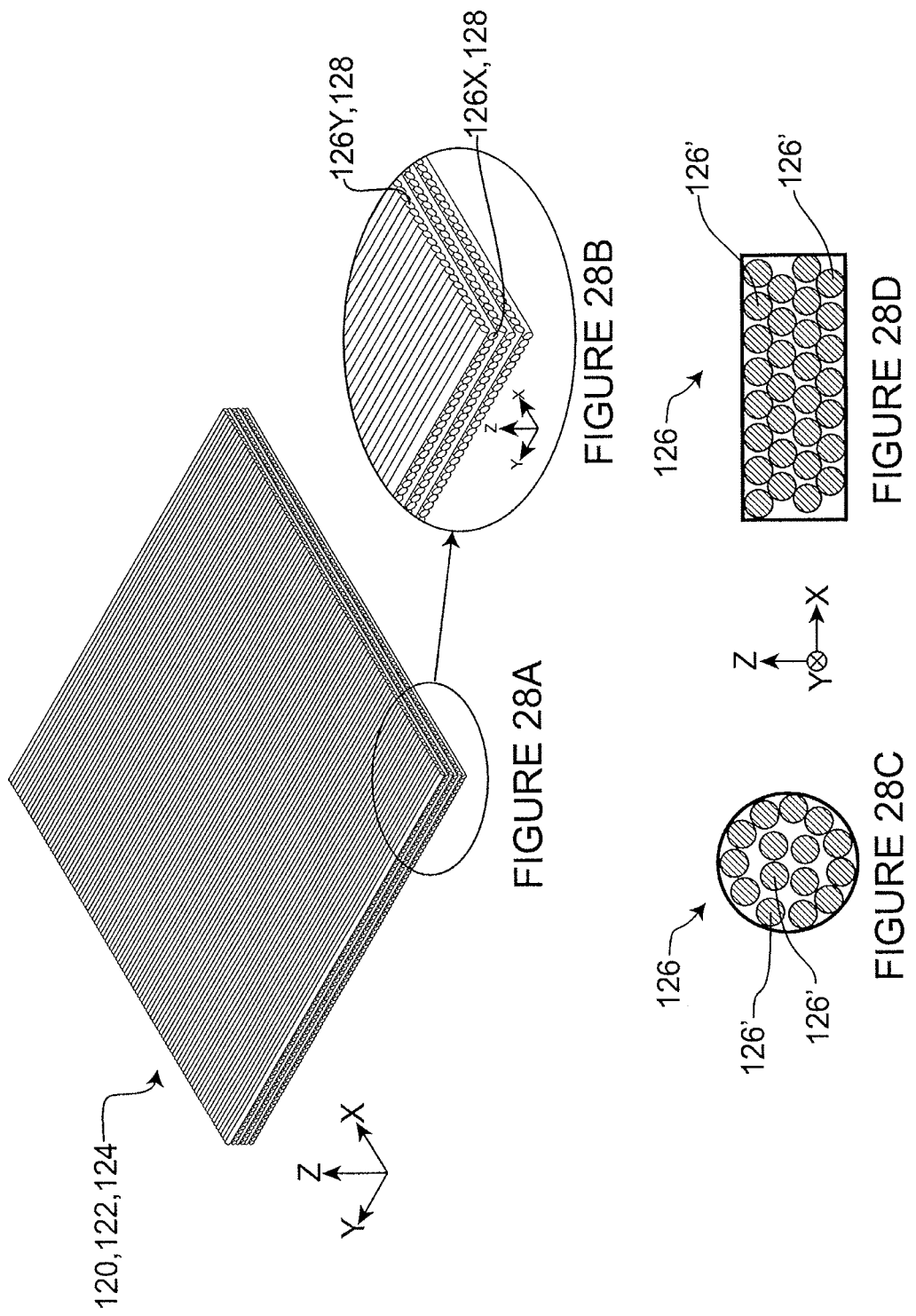

DISPLACEMENT DEVICES AND METHODS FOR FABRICATION, USE AND CONTROL OF SAME

RELATED APPLICATIONS

This application is a continuation of U.S. patent application Ser. No. 15/595,941 filed 15 May 2017, which is, in turn, a continuation of U.S. patent application Ser. No. 14/920,885 filed 23 Oct. 2015, which is, in turn, a continuation of U.S. patent application Ser. No. 14/354,515 having a 35 USC 371 date of 25 Apr. 2014, which is, in turn, a national phase entry of PCT application No. PCT/CA2012/050751 having an international filing date of 22 Oct. 2012. PCT application No. PCT/CA2012/050751 claims the benefit of the priority of U.S. application No. 61/551,953 filed 27 Oct. 2011 and of U.S. application No. 61/694,776 filed 30 Aug. 2012. All of the prior applications in referred to in this paragraph are hereby incorporated herein by reference.

TECHNICAL FIELD

The invention relates to displacement devices. Particular non-limiting embodiments provide displacement devices for use in the semiconductor fabrication industry.

BACKGROUND

Motion stages (XY tables and rotary tables) are widely used in various manufacturing, inspection and assembling processes. A common solution currently in use achieves XY motion by stacking two linear stages (i.e. a X-stage and a Y-stage) together via connecting bearings.

A more desirable solution involves having a single moving stage capable of XY motion, eliminating additional bearings. It might also be desirable for such a moving stage to be able to provide at least some Z motion. Attempts have been made to design such displacement devices using the interaction between current-carrying coils and permanent magnets. Examples of efforts in this regard include the following: U.S. Pat. Nos. 6,003,230; 6,097,114; 6,208,045; 6,441,514; 6,847,134; 6,987,335; 7,436,135; 7,948,122; US patent publication No. 2008/0203828; W. J. Kim and D. L. Trumper, High-precision magnetic levitation stage for photolithography. *Precision Eng.* 22 2 (1998), pp. 66-77; D. L. Trumper, et al, "Magnet arrays for synchronous machines", IEEE Industry Applications Society Annual Meeting, vol. 1, pp. 9-18, 1993; and J. W. Jansen, C. M. M. van Lierop, E. A. Lomonova, A. J. A. Vandenput, "Magnetically Levitated Planar Actuator with Moving Magnets", IEEE Tran. Ind. App., Vol 44, No 4, 2008.

There is a general desire to provide displacement devices having characteristics that improve upon those known in the prior art.

The foregoing examples of the related art and limitations related thereto are intended to be illustrative and not exclusive. Other limitations of the related art will become apparent to those of skill in the art upon a reading of the specification and a study of the drawings.

BRIEF DESCRIPTION OF THE DRAWINGS

Exemplary embodiments are illustrated in referenced figures of the drawings. It is intended that the embodiments and figures disclosed herein are to be considered illustrative rather than restrictive.

FIG. 1A is a partial schematic isometric view of a displacement device according to a particular embodiment of the invention.

FIG. 1C is a partial schematic cross-sectional view of the FIG. 1A displacement device along the line 1C-1C.

FIGS. 6A and 6B are schematic partial cross-sectional views of layouts of magnet arrays which may be used in the FIG. 1 displacement device and which are useful for showing a number of magnet array parameters.

FIGS. 7A-7L show additional details of magnet arrays suitable for use with the FIG. 1 displacement device in accordance with particular embodiments.

FIGS. 13A and 13B schematically depict an assumed magnet array configuration which can be used to determine suitable currents for magnet arrays having non-magnetic spacers.

FIG. 14A schematically illustrates one embodiment of a sensing system suitable for use with the FIG. 1 displacement device for separately measuring the positions of the moveable stage and stator relative to a metrology frame. FIGS. 14B and 14C schematically illustrate other embodiments of sensor systems suitable for use with the FIG. 1 displacement device.

FIG. 22A shows a coil trace layout according to another embodiment which may be used in the FIG. 1 displacement device. FIG. 22B illustrates a pair of adjacent layers of Y-oriented coil traces which may be used in the FIG. 1 displacement device.

FIGS. 23A-23F show a number of Y-oriented coil traces which (while generally linearly elongated in the Y-direction) exhibit periodic spatial variation which extends in the X-direction over their respective Y-dimensions and which may be used in the FIG. 1 displacement device.

FIGS. 24A and 24B show a pair of Y-oriented coil traces which have periodic variation which may be superposed to provide the Y-oriented coil trace of FIG. 24C.

FIGS. 26A, 26B and 26C show a number of Y-magnet arrays which exhibit periodic spatial variation which extends in the X-direction over their respective Y-dimensions and which may be used in the FIG. 1 displacement device.

FIGS. 28A and 28B show various views of circular cross-section coil traces according to another embodiment which may be used with the FIG. 1 displacement device. FIGS. 28C and 28D show embodiments of how coil traces may comprise multiple sub-traces having circular cross-section.

DESCRIPTION

Throughout the following description specific details are set forth in order to provide a more thorough understanding to persons skilled in the art. However, well known elements may not have been shown or described in detail to avoid unnecessarily obscuring the disclosure. Accordingly, the description and drawings are to be regarded in an illustrative, rather than a restrictive, sense.

Displacement devices are provided which comprise a stator and a moveable stage. The stator comprises a plurality of coils shaped to provide pluralities of generally linearly elongated coil traces in one or more layers. Layers of coils may overlap in the Z-direction. The moveable stage comprises a plurality of magnet arrays. Each magnet array may comprise a plurality of magnetization segments generally linearly elongated in a corresponding direction. Each magnetization segment has a magnetization direction generally orthogonal to the direction in which it is elongated and at least two of the of the magnetization directions are different from one another. One or more amplifiers may be selectively connected to drive current in the coil traces and to thereby effect relative movement between the stator and the moveable stage.

Particular Embodiment

Figure 1B:
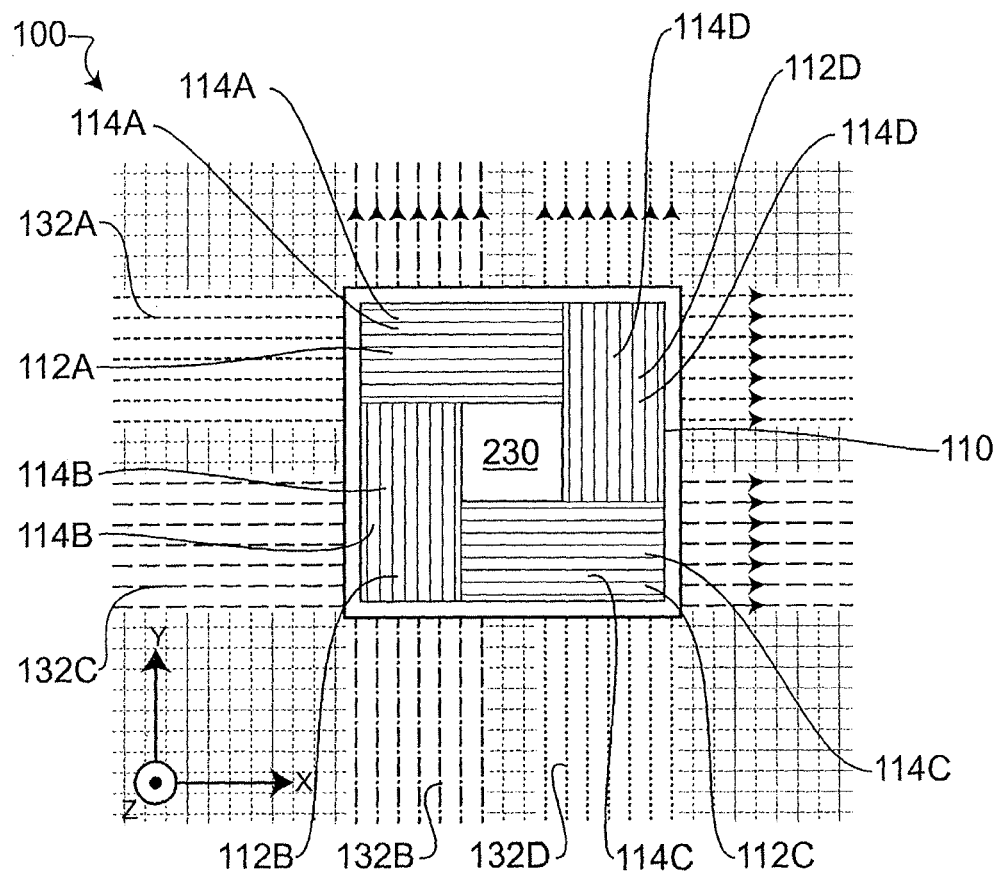
FIG. 1B is a partial schematic cross-sectional view of the FIG. 1A displacement device along the line 1B-1B.

FIG. 1A is a partial schematic isometric view of a displacement device 100 according to a particular embodiment of the invention. FIGS. 1B and 1C are partial schematic cross-sectional views of displacement device 100 along the lines 1B-1B and 1C-1C respectively. Displacement device 100 comprises a moveable stage 110 and a stator stage 120. Moveable stage 110 comprises a plurality (e.g. 4 in the illustrated embodiment) of arrays of permanent magnets 112A, 112B, 112C, 112D (collectively, magnet arrays 112). Stator stage 120 comprises a plurality of coils 122. As explained in more detail below, each of coils 122 is elongated along a particular dimension, such that in a working region 124 of stator 120 (i.e. a region of stator 120 over which moving stage 110 can move), coils 122 effectively provide linearly elongated coil traces 126. As explained in more detail below, each of coil traces 126 comprises a corresponding axis along which it is linearly elongated. For clarity, only a portion of the working area 124 of stator 120 is shown in the views of FIGS. 1A-1C. It will be appreciated that outside of the partial views of FIGS. 1A-1C, coils 122 have loops which are not linearly elongated. The loops of coils 122 are located sufficiently far outside of the working area 124 of stator 120 that these loops do not have an impact on the operation of device 100.

In the illustrated embodiment (as best seen in FIG. 1C), stator 120 comprises a plurality (e.g. 4 in the illustrated embodiment) of layers 128A, 128B, 128C, 128D (collectively, layers 128) of coil traces 126, with each pair of coil trace layers 128 separated from one another by an electrically insulating layer 130. It will be appreciated that the number of layers 128 in stator 120 may be varied for particular implementations and that the number of layers 128 shown in the illustrated embodiment is convenient for the purposes of explanation. In the illustrated embodiment, each layer 128 comprises coil traces 126 that are linearly elongated along axes that are parallel to one another. In the case of the illustrated embodiment, layers 128A, 128C comprise coil traces 126Y which are generally linearly elongated in directions parallel to the Y-axis and layers 128B, 128D comprise coil traces 126X which are generally linearly oriented in directions parallel to the X-axis. Coil traces 126Y which are generally linearly oriented along the Y-axis may be referred to herein as "Y-coils" or "Y-traces" and, as explained in more detail below, may be used to move moveable stage 110 in the X and Z directions. Similarly, coil traces 126X which are generally linearly oriented along the X-axis may be referred to herein as "X-coils" or "X-traces" and, as explained in more detail below, may be used to move moveable stage 110 in the Y and Z directions.

In the illustrated embodiment (as shown best in FIG. 1B), moveable stage 110 comprises four magnet arrays 112. In some embodiments, moveable stage 110 may comprise more than four magnet arrays 112. Each magnet array 112A, 112B, 112C, 112D comprises a plurality of corresponding magnetization segments 114A, 114B, 114C, 114D (collectively, magnetization segments 114) having different magnetization directions. In the illustrated embodiment, each magnetization segment 114 is generally elongated along a corresponding axial dimension. The elongated shape of magnetization segments 114 of the illustrated embodiment is shown best in FIG. 1B. It can be seen that in the case of the illustrated embodiment, magnetization segments 114A of magnet array 112A and magnetization segments 114C of magnet array 112C are generally elongated in directions parallel to the X-axis and magnetization segments 114B of magnet array 112B and magnetization segments 114D of magnet array 112D are generally elongated in directions parallel to the Y-axis. Because of the direction of elongation of their respective magnetization segments 114: magnet arrays 112A, 112C may be referred to herein as "X-magnet arrays" 112A, 112C and their corresponding magnetization segments 114A, 114C may be referred to herein as "X-magnetization segments"; and magnet arrays 112B, 112D may be referred to herein as "Y-magnet arrays" 112B, 112D and their corresponding magnetization segments 114B, 114D may be referred to herein as "Y-magnetization segments".

FIG. 1C schematically shows the orientation of the magnetization of the various magnetization segments 114B of Y-magnet array 112B in accordance with a particular non-limiting example. More particularly, the schematically illustrated arrows in Y-magnet array 112B of FIG. 1C show the magnetization directions of the various magnetization segments 114B. Also, within each magnetization segment 114B, the shaded regions represent the north poles of the magnets and the white regions represent the south poles of the magnets.

Figure 1D:
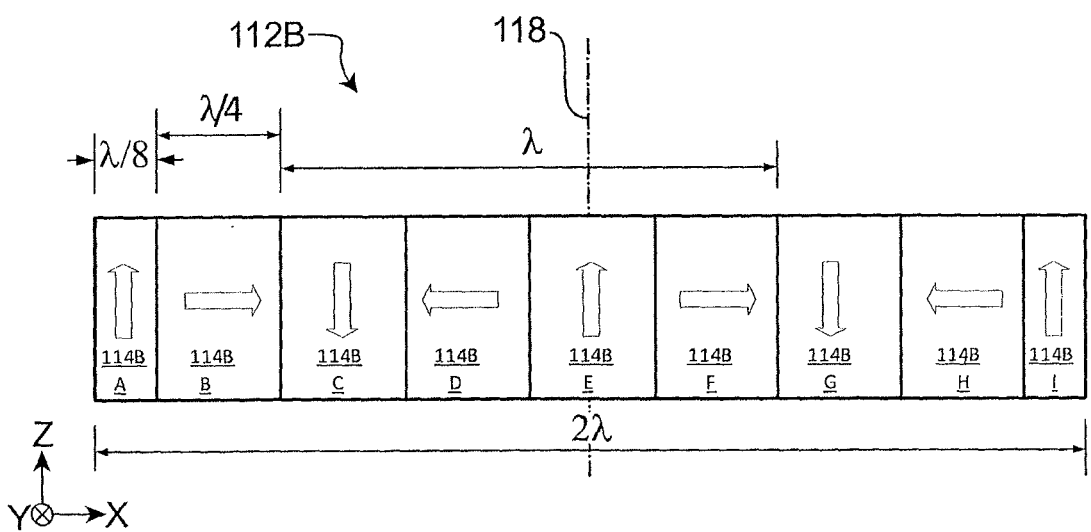
FIG. 1D shows additional detail of one of the Y-magnet arrays of the FIG. 1A displacement device in accordance with a particular embodiment.

FIG. 1D shows a cross-sectional view of Y-magnet array 112B in more detail. It can be seen that Y-magnet array 112B is divided into a number of magnetization segments 114B along the X-axis and that the magnetization directions of the various segments 114B are oriented in directions orthogonal to the Y-axis—i.e. the magnetization directions of the magnetization segments 114B are orthogonal to the Y-axis direction along which magnetization segments 114B are elongated. It may also be observed from FIG. 1D that the magnetization directions of magnetization segments 114B have a spatial periodicity with a period (or wavelength) $\lambda$ along the X-axis. This spatial periodicity $\lambda$ of the magnetization directions of the magnetization segments 114 of a magnet array 112 may be referred to herein as the magnetic period $\lambda$, magnetic spatial period $\lambda$, magnetic wavelength $\lambda$ or magnetic spatial wavelength $\lambda$.

In the illustrated FIG. 1D embodiment, Y-magnet array 112B has a total X-axis width of 2$\lambda$—i.e. two periods of the magnetic period $\lambda$. This is not necessary. In some embodiments, Y-magnet array 112B has a total X-axis width $W_m$ given by $W_m=N_m\lambda$ where $N_m$ is a positive integer.

In the case of the illustrated FIG. 1D embodiment, magnetization segments 114B comprise four different magnetization directions: +Z, −Z, +X, −X which together provide a magnetic spatial period $\lambda$. This is not necessary. In some embodiments, magnetization segments 114B may comprise as few as two magnetization directions to provide a magnetic spatial period $\lambda$ and in some embodiments, magnetization segments 114B may comprise more than four magnetization directions to provide a magnetic spatial period $\lambda$. The number of different magnetization directions of a magnet array 112 that make up a complete spatial magnetic period $\lambda$ may be referred to herein as $N_t$. Regardless of the number $N_t$ of magnetization directions of magnetization segments 114B, the magnetization direction of each segment 114B is oriented generally orthogonally to the Y-axis. FIG. 1D also shows that, in the illustrated embodiment, the X-axis width of a magnetization segment 114B is either: $\lambda/(2Nt)$ or $\lambda/N_t$. In the case of the FIG. 1D embodiment, where the number $N_t$ of magnetization directions is $N_t$=4, the X-axis width of magnetization sections 114B is either $\lambda/8$ (as is the case for the edge segments labeled A, I) or $\lambda/4$ (as is the case for the interior segments labeled B,C,D,E,F,G,H).

Another observation that may be made in the case of the illustrated FIG. 1D embodiment is that the magnetization of magnetization segments 114B is mirror symmetric about a central Y-Z plane 118 (i.e. a plane 118 that extends in the Y-axis and Z-axis directions and that intersects magnet array 112B at the center of its X-axis dimension). While not explicitly shown in FIG. 1D, in some embodiments magnet array 112B may be provided with a non-magnetic spacer at the center of its X-axis dimension. More particularly, magnetization segment 114B at the center of the X-axis dimension of magnet array 112B (i.e. the segment labeled E in the illustrated embodiment) may be divided into two segments of width $\lambda/(2Nt)=\lambda/8$ and a non-magnetic spacer may be inserted therebetween. As explained in more detail below, such a non-magnetic spacer can be used to cancel disturbance forces/torques generated by higher order magnetic fields. Even with such non-magnetic spacer, magnet array 112B and its magnetization segments 114B will still exhibit the properties that: that the magnetization directions of the various segments 114B are oriented in directions orthogonal to the Y-axis; the X-axis widths of the various segments 114B will be either: $\lambda/(2Nt)$ (for the outer segments A,I and the two segments formed by dividing segment E) or $\lambda/Nt$ (for the interior segments B,C,D,F,G,H); and the magnetization of magnetization segments 114B is mirror symmetric about central Y-Z plane 118.

Other than for its location on moveable stage 110, the characteristics of Y-magnet array 112D and its magnetization segments 114D may be similar to those of Y-magnet array 112B and its magnetization segments 114B.

Figure 1E:
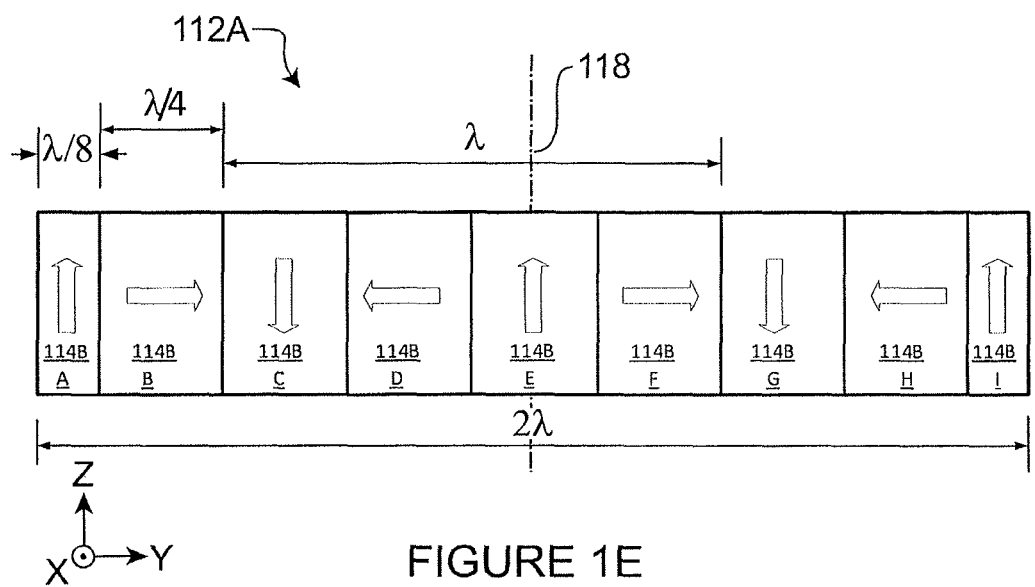
FIG. 1E shows additional detail of one of the X-magnet arrays of the FIG. 1A displacement device in accordance with a particular embodiment.

FIG. 1E shows a cross-sectional view of X-magnet array 112A in more detail. It will be appreciated that X-magnet array 112A is divided, along the Y-axis, into a number of magnetization segments 114A which are generally linearly elongated in the X-axis direction. In the illustrated embodiment, the characteristics of X-magnet array 112A and its magnetization segments 114A may be similar to those of Y-magnet array 112B and its magnetization segments 114B, except that the X and Y directions are swapped. For example, the magnetization directions of magnetization segments 114A have a spatial periodicity with a period (or wavelength) $\lambda$ along the Y-axis; the width $W_m$ of X-magnet array 112A in the Y-direction is given by $W_m=N_m\lambda$ where $N_m$ is a positive integer; the magnetization directions of the various magnetization segments 114A are oriented in directions orthogonal to the X-axis; the Y-axis widths of the various magnetization segments 114A are either: $\lambda/(2N_t)$ (for the outer segments A,I) or $\lambda/N_t$ (for the interior segments B,C,D,E,F,G,H), where $N_t$ represents the number of different magnetization directions in magnet array 112A; and the magnetization of magnetization segments 114A is mirror symmetric about central X-Z plane 118.

Other than for its location on moveable stage 110, the characteristics of X-magnet array 112C and its magnetization segments 114C may be similar to those of X-magnet array 112A and its magnetization segments 114A.

Referring to FIGS. 1B and 1C, the operation of displacement device 100 is now explained. FIG. 1C shows how moveable stage 110 is spaced upwardly apart from stator 120 in the Z-direction. This space between stator 120 and moveable stage 110 can be maintained (at least in part) by Z-direction forces created by the interaction of coils 122 on stator 120 with magnet arrays 112 on moveable stage 110 as discussed below. In some embodiments, this space between stator 120 and moveable stage 110 can be maintained using additional lifting and/or hoisting magnets, aerostatic bearings, roller bearings and/or the like (not shown), as is known in the art.

FIG. 1B shows four sets of active coil traces 132A, 132B, 132C, 132D (collectively, coil traces 132), each of which (when carrying current) is primarily responsible for interacting with a corresponding one of magnet arrays 112A, 112B, 112C, 112D to impart forces which cause moveable stage 110 to move. More particularly: when coil traces 132A are carrying current, they interact with X-magnet array 112A to impart forces on moveable stage 110 in the Y and Z directions; when coil traces 132B are carrying current, they interact with Y-magnet array 112B to impart forces on moveable stage 110 in the X and Z directions; when coil traces 132C are carrying current, they interact with X-magnet array 112C to impart forces on moveable stage 110 in the Y and Z directions; and when coil traces 132D are carrying current, they interact with Y-magnet array 112D to impart forces on moveable stage 110 in the X and Z directions.

It will be appreciated that coil traces 132 shown in FIG. 1B can be selectively activated to impart desired forces on moveable stage 110 and to thereby control the movement of moveable stage 110 with six degrees of freedom relating to the rigid body motion of moveable stage 110. As explained further below, coil traces 132 can also be controllably activated to control some flexible mode vibrating motion of moveable stage 110. When moveable stage 110 is shown in the particular position shown in FIG. 1B, coil traces other than coil traces 132 may be inactive. However, it will be appreciated that as moveable stage 110 moves relative to stator 120, different groups of coil traces will be selected to be active and to impart desired forces on moveable stage 110.

It may be observed that the active coil traces 132 shown in FIG. 1B appear to interact with other magnet arrays. For example, when carrying current, coil traces 132C interact with X-magnet array 112C as discussed above, but coil traces 132C also pass under a portion of Y-magnet array 112B. One might expect that, the current in coil traces 132C might interact with the magnets in Y-magnet array 112B and impart additional forces on moveable stage 110. However, because of the aforementioned characteristics of Y-magnet array 112B, the forces that might have been caused by the interaction of coil traces 132C and the magnetization segments 114B of Y-magnet array 112B cancel one another out, such that these parasitic coupling forces are eliminated or kept to a minimal level. More particularly, the characteristics of Y-magnet array 112B that eliminate or reduce these cross-coupling forces include: Y-magnet array 112B includes magnetization segments which are generally elongated in the Y-direction with varying magnetizations which are oriented orthogonally to the Y-direction; the X-dimension width Wm of Y-magnet array 112B is Wm=Nmλ where Nm is an integer and λ is the magnetic period λ described above; and Y-magnet array 112B is mirror symmetric about a Y-Z plane that runs through the center of the X-dimension of Y-magnet array 112B.

For example, the X-dimension width Wm of Y-magnet array 112B being an integer number of magnetic wavelengths (Wm=Nmλ) minimizes force coupling with non-aligned coil traces 132C, because the net force on magnet array 112B will integrate to zero (i.e. will cancel itself out) over each wavelength λ of magnet array 112B. Also, the mirror-symmetry of Y-magnet array 112B about a Y-Z plane that is orthogonal to the X-axis and runs through the center of the X-dimension of Y-magnet array 112B minimizes the net moment (about the Z-axis and about the Y-axis) due to the interaction of magnet array 112B with X-oriented coil traces 132C. Similar characteristics of Y-magnet array 112D eliminate or minimize cross-coupling from coil traces 132A.

In an analogous manner, the characteristics of X-magnet array 112A eliminate or reduce cross-coupling forces from coil traces 132B. Such characteristics of X-magnet array 112A include: X-magnet array 112A includes magnetization segments which are generally elongated in the X-direction with varying magnetizations which are oriented orthogonally to the X-direction; the Y-dimension width Wm of X-magnet array 112A is Wm=Nmλ where Nm is an integer and λ is the magnetic period λ described above; and X-magnet array 112A is mirror symmetric about a X-Z plane that is orthogonal to the y-axis and runs though the center of the Y-dimension of X-magnet array 112A. Similar characteristics of X-magnet array 112C eliminate or minimize cross coupling from coil traces 132D.

Coil Array

Additional detail of stator 120 and its coil arrays is now provided. As described above, stator 120 comprises a plurality of layers 128 of coil traces 126 which are generally linearly oriented in the working region 124. Each layer 128 comprises coil traces 126 that are generally aligned with one another (e.g. generally linearly elongated in the same direction). In the illustrated embodiment of FIGS. 1A-1E, vertically adjacent layers 128 (i.e. layers 128 next to one another in the Z-direction) comprise coil traces 126 that are orthogonally oriented with respect to one another. For example, coil traces 126Y in layers 128A, 128C (FIG. 1C) are generally linearly oriented parallel to the Y-axis and coil traces 126X in layers 128B, 128D are generally linearly oriented parallel to the X-axis. It will be appreciated that the number of layers 128 of coil traces 126 in stator 120 need not be limited to the four traces shown in the illustrated embodiment. In general, stator 120 may comprise any suitable number of layers 128 of coil traces 126. Further, it is not a requirement that the orientations of coil traces 126 in vertically adjacent layers 128 be different from one another. Some embodiments may comprise a number of vertically adjacent layers 128 of Y-oriented traces 126Y followed by a number of vertically adjacent layers 128 of X-oriented coil traces 126X.

Stator 120 and its arrays of coils 122 may be fabricated using one or more printed-circuit boards (PCBs). PCBs can be manufactured using standard PCB fabrication, flat-panel display lithography, lithography and/or similar technology known in the art to provide coils 122 and coil traces 126. Insulator layers 130 (such as FR4 core, prepreg, ceramic material and/or the like) may be fabricated or otherwise inserted between coil layers 128. One or more coil layers 128 may be stacked together (i.e. in the Z-direction) in a single PCB board. In some embodiments, coil traces 126 generally elongated in the same direction (at different layers 128) may be connected in parallel or serially, depending on via design and/or connecting methods for the ends of coil traces 126. In some embodiments, coil traces 126 generally elongated in the same direction (at different layers 128) are not connected to one another.

Coils 122 fabricated using PCB technology can accommodate sufficient current for controlling the motion of moveable stage 110. By way of non-limiting example, each coil 122 can be made from 6 oz copper (about 200-220 µm thick) or more. As discussed above, in active region 124, each coil 122 is in the shape of a flat strip or coil trace 126, which provides good thermal conductivity due to the high ratio of surface area to volume. The inventors have confirmed (via testing) that laminated copper can carry a sustained current density of 10 A/mm$^2$ with a 50° C. temperature rise above ambient without using an active heat sink. Another advantage of planar layers 128 of coils 122 and coil traces 126 is that the naturally stratified conductors that provide coils 122 make them ideally suitable for carrying AC current, because the self-generated alternating magnetic field can easily penetrate the conductor through top and bottom surfaces but generates only low self-induced eddy currents.

Multiple PCBs may be aligned side by side in both X and Y directions (similar to floor tiles) to provide the desired X-Y dimensions for active region 124. Board-to-board lateral connections (in the X and/or Y directions) may be made at the edges by connecting pads, through-holes of edge-adjacent boards, copper wires and/or using other suitable bridging components of the like for electrically connecting conductors on adjacent PCB boards. In some embodiments, such bridging components may be located underneath the PCB boards (e.g. on the side opposite moveable stage 110); in some embodiments, such bridging components may be additionally or alternatively located above the PCB boards or on the side(s) of the PCB boards. When PCBs are connected adjacent to one another in the X and/or Y directions, the end terminals (not shown) of coils 122 may be located at or near the perimeter of stator 120 for ease of wiring to the drive electronics. Connecting PCBs to one another in this manner allows displacement device 100 to be easily extended in both X and Y dimensions for various applications. When PCBs are connected to one another in the X and/or Y dimensions, the total number of coils 122 increases linearly with the X-Y dimensions of active area 124 of stator 120 (instead of quadratically, as is the case in some prior art techniques involving so-called "racetrack" coil designs). In some embodiments, coil traces 126 on X-Y adjacent PCB boards may be serially connected to one another to reduce the number of amplifiers (not shown) for driving current through coil traces 126. In some embodiments, coil traces 126 on X-Y adjacent PCB boards may be individually controlled by separate amplifiers to increase the flexibility for multi-stage actuation and to reduce heat generation.

A single PCB board may be fabricated to have a thickness (in the Z-direction) of up to 5 mm (or more) using available PCB technology. When thicker boards are required for heavy-duty applications, multiple PCBs can be stacked vertically in the Z direction. Another benefit of using PCB technology to fabricate stator 120 is the possibility of deploying large numbers of low-profile sensors (such as Hall-effect position sensor, capacitive position sensors and/or the like) directly on the board using daisy chain connections.

Figure 2:
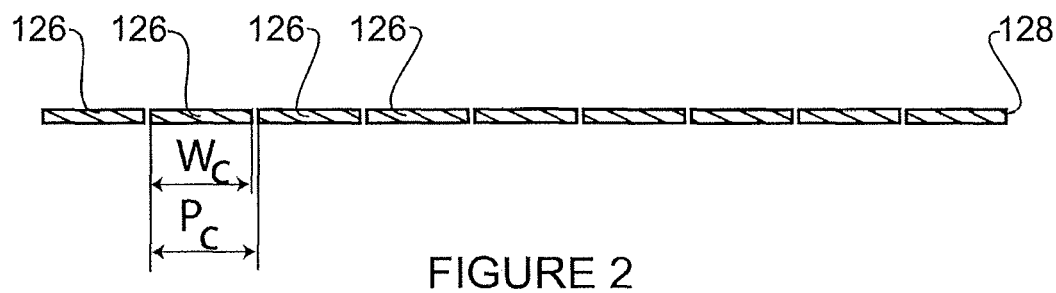
FIG. 2 is a schematic partial cross-sectional view of a single layer of coil traces which may be used in the FIG. 1 displacement devices and which are useful for showing a number of coil parameters.

FIG. 2 is a schematic partial cross-sectional view of a single layer 128 of stator 120 and its coil traces 126 which may be used in the FIG. 1 displacement device 100. FIG. 2 shows a number of parameters which are used in the description that follows. More particularly, $W_C$ is the width of single coil trace 126. $P_C$ is the coil trace pitch—i.e. the distance between two adjacent coil traces 126 of the same layer 128.

Figure 3A:
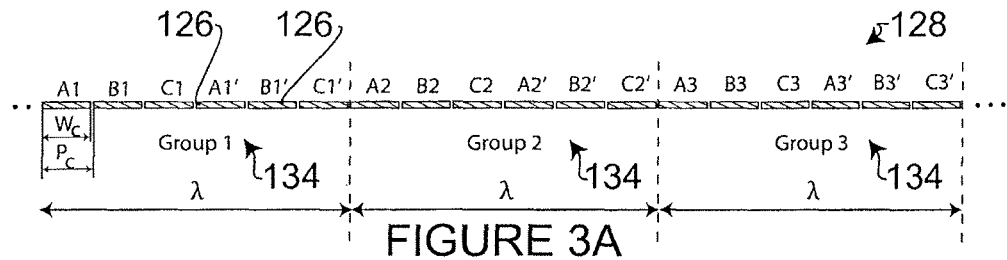
FIGS. 3A-3F are schematic partial cross-sectional views of single layers of coil traces having different layouts which may be used in the FIG. 1 displacement device.
Figure 3B:
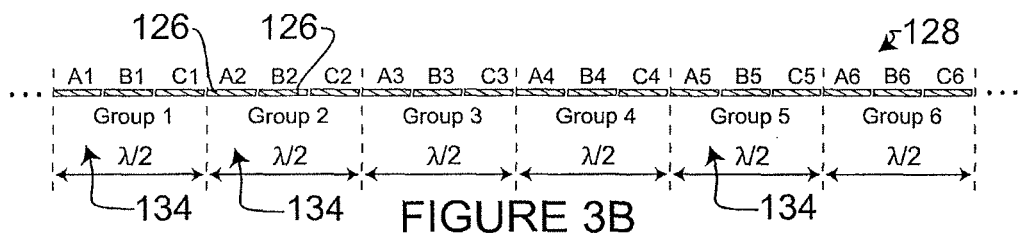
Figure 3C:
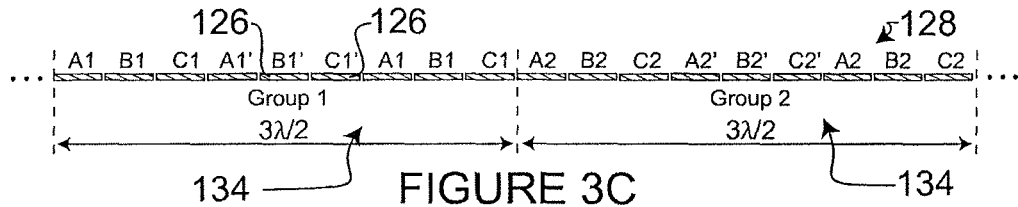

In some embodiments, each layer 128 of coil traces 126 is fabricated such that: the coil trace pitch $P_C=\lambda/N$, where N is a positive integer and $\lambda$ is the above-discussed spatial magnetic wavelength of magnet arrays 112; and $W_C$ is set close to $P_C$ such that there is a minimum acceptable gap $(P_C-W_C)$ between adjacent coil traces 126. For example, the trace gap $P_C-W_C$ can be set at 50~100 µm (e.g. less than 200 µm). It will be appreciated that the minimum possible acceptable trace gap will depend on a number of factors, including, without limitation, the amount of current expected to be carried in each coil trace, the capability of the PCB fabrication process and the heat dissipating characteristics of the system 100. FIGS. 3A-3C schematically depict a number of possible embodiments of coil trace layers 128 which are fabricated to have these characteristics. In each of the FIG. 3A-3C embodiments, $P_C=\lambda/6$ (i.e. N=6) and $W_C$ is set very close to $P_C$ such that there is a minimum acceptable gap (e.g. less than 200 µm) between adjacent coil traces 126.

In some embodiments, each layer 128 of coil traces 126 is fabricated such that every MN/2 (where M is another positive integer number) adjacent coil traces 126 form one coil group 134, where coil traces 126 in the same group 134 can be either driven by separate amplifiers or be connected in a star pattern and driven by a multi-phase amplifier. FIGS. 3A-3C show a number of different grouping arrangements that exhibit these characteristics. In FIG. 3A, M=2 and N=6, so each group 134 includes 6 adjacent coil traces 126. In some embodiments, each FIG. 3A group 134 may be driven by a corresponding three-phase amplifier (not shown). For example, the coil traces 126 labeled A1,B1,C1,A1',B1',C1' belong to one group 134. The symbol ' used in FIG. 3A indicates reversing current. For example, the electrical current in trace A1' is the same as that of trace A1 but in opposite direction. In FIG. 3B, M=1 and N=6, so each group 134 includes 3 adjacent coil traces 126. In some embodiments, each FIG. 3B group 134 may be driven by a corresponding three-phase amplifier (not shown). In FIG. 3C, M=3 and N=6, so each group 134 includes 9 adjacent coil traces 126. In some embodiments, each FIG. 3C group 134 may be driven by a corresponding three-phase amplifier (not shown). Like FIG. 3A, the symbol ' used in FIG. 3C indicates reversing current. It will be appreciated in light of the foregoing that in general, every 3n (n is a positive integer) adjacent coil traces 126 can form one group 134 driven by a corresponding three-phase amplifier.

Figure 3D:
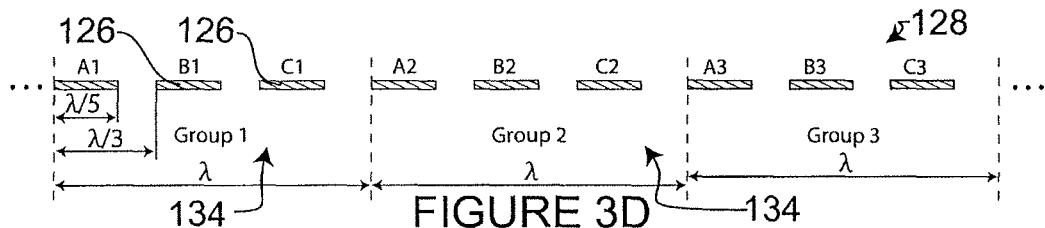
Figure 3E:
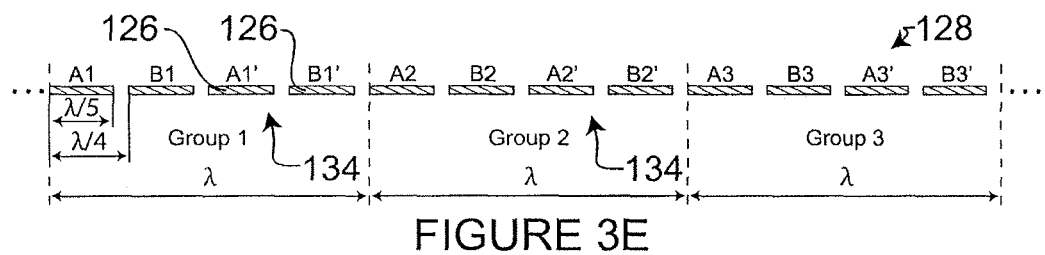

In some embodiments, each layer 128 of coil traces 126 is fabricated such that the coil-trace width $W_C=\lambda/5$ and the coil trace pitch $P_C=\lambda/k$, where k is any number less than 5 and $\lambda$ is the spatial magnetic period of magnet arrays 112. Setting $W_C=\lambda/5$ has the advantage that such a coil trace width minimizes the effect of fifth order magnetic fields generated by magnet arrays 112, because of a spatial filtering/averaging effect. FIGS. 3D-3E schematically depict a number of possible embodiments of coil trace layers 128 which are fabricated to have these characteristics. In each of the FIG. 3D-3E embodiments, $W_C=\lambda/5$ and the coil trace pitch $P_C=\lambda/k$.

In FIG. 3D, $W_C=\lambda/5$ and $$P_C = \frac{\lambda}{k} = \frac{\lambda}{3}.$$

It can be seen from FIG. 3D, that adjacent coil traces 126 are relatively widely spaced apart from one another compared to those of the embodiments shown in FIGS. 3A-3C. In the FIG. 3D embodiment, every 3 adjacent coil traces 126 are grouped together to provide groups 134, wherein each group 134 may be driven by a corresponding three-phase amplifier (not shown). In general, coil traces 126 may be grouped such that every 3n (n is a positive integer) adjacent coil traces 126 can form one group 134 which may be driven by one corresponding three-phase amplifier. FIG. 3E shows a layout where $W_C=\lambda/5$ and $$P_C = \frac{\lambda}{k} = \frac{\lambda}{4}.$$

In the FIG. 3E embodiment, every 4 adjacent coil traces 126 are grouped together to provide groups 134. Groups 134 of the FIG. 3E embodiment may be driven by a corresponding two-phase amplifier. As before, the symbol ' used to label coil traces 126 indicates reversing current. In general, coil traces 126 may be grouped such that every 2n (n is a positive integer) adjacent coil traces 126 can form one group 134.

Figure 3F:
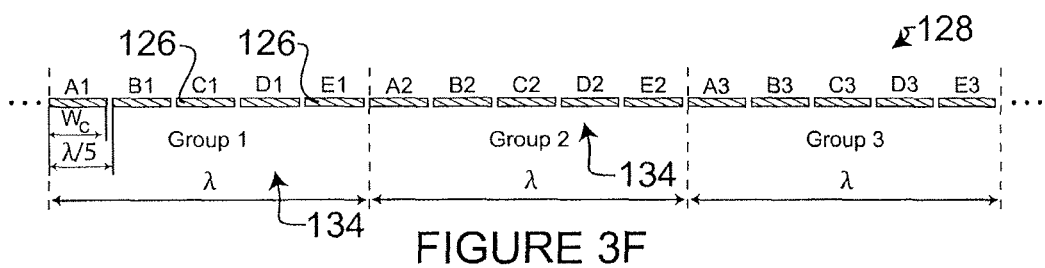

FIG. 3F shows a layout which combines the characteristics of the layouts of FIGS. 3A-3C and of FIGS. 3D-3E. More particularly, in FIG. 3F, the coil trace pitch $P_C=\lambda/5$ and $W_C$ is set close to $P_C$ such that there is a minimum acceptable gap between adjacent coil traces. It will be appreciated that these characteristics are similar to those of the embodiments of FIGS. 3A-3C. However, with $W_C$ is set close to $P_C$, $W_C$ will be almost equal to $W_C=\lambda/5$ which is the characteristic of the embodiment of FIGS. 3D-3E. Accordingly, the layout in FIG. 3F can be used to minimize the effect of fifth order magnetic fields generated by magnet arrays 112 (as discussed above). In the FIG. 3F embodiment, every 5 adjacent coil traces 126 are grouped together to provide groups 134. Groups 134 of the FIG. 3F embodiment may be driven by a corresponding five-phase amplifier. In general, coil traces 126 may be grouped such that every 5n (n is a positive integer) adjacent coil traces 126 can form one group 134 which may be driven by one corresponding five-phase amplifier.

Figure 4A:
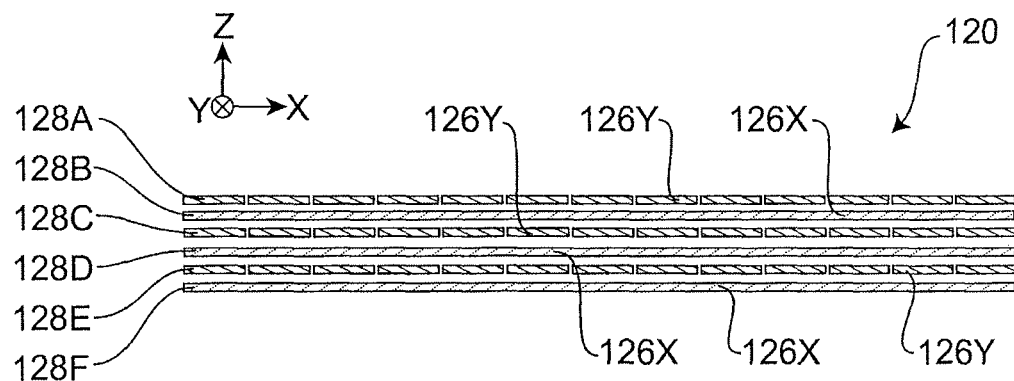
FIGS. 4A and 4B are schematic partial cross-sectional views of multiple layers of coil traces having different layouts which may be used in the FIG. 1 displacement device.

FIG. 4A is a schematic partial cross-sectional view of multiple layers 128 (128A-128F) of coil traces 126 which may be used in stator 120 of the FIG. 1 displacement device 100. It can be seen from FIG. 4A, that layers 128A, 128C, 128E comprise Y-oriented coil traces 126Y and that layers 128B, 128D, 128F comprise X-oriented coil traces 126X. It can also be observed from FIG. 4A that Y-oriented coil traces 126Y in different layers 128A, 128C, 128E are aligned with one another in the X-direction—i.e. coil traces 126Y in layer 128A are aligned (in the X-direction) with coil traces 126Y in layers 128C, 128E. Although it can't be directly observed from the illustrated view of FIG. 4A, it can be appreciated that X-oriented coil traces 126X may exhibit a similar characteristic—i.e. coil traces 126X in layer 128B are aligned (in the Y-direction) with coil traces 126X in layers 128D, 128F. Coil traces 126X, 126Y in the same column (i.e. traces 126X aligned with one another in the Y-direction and/or traces 126Y aligned with other another in the X-direction) can be connected in serially, in parallel or independently of one another. It will be appreciated that the number of layers 128 can be any suitable number and is not limited to the six shown in FIG. 4A.

Figure 4B:
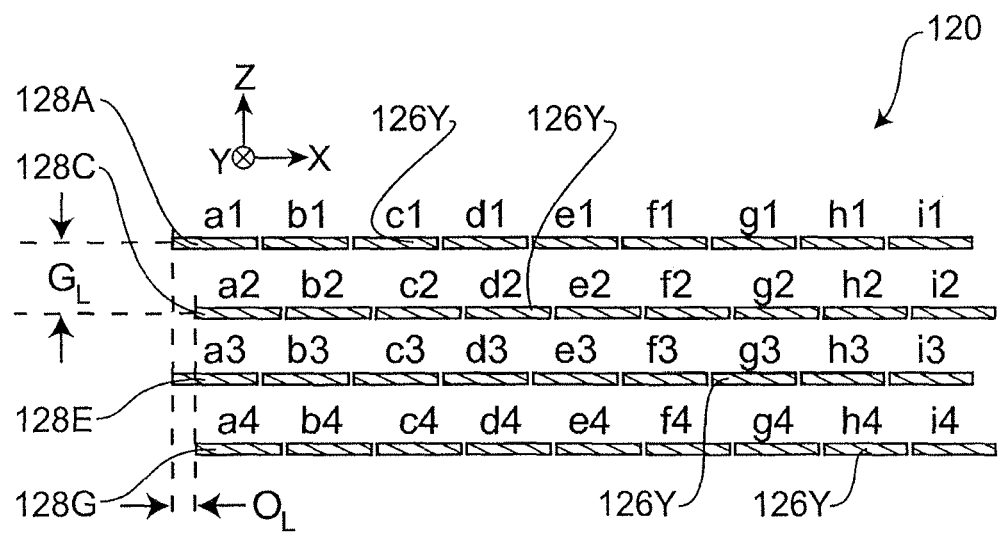

FIG. 4B is a schematic partial cross-sectional view of multiple layers 128 (128A, 128C, 128E, 128G) of coil traces 126 which may be used in stator 120 of the FIG. 1 displacement device 100. For clarity, only layers 128A, 128C, 128E, 128G having Y-oriented traces 126Y are shown in FIG. 4B—i.e. layers 128 having X-oriented coil traces 126X are not shown in FIG. 4B. It can also be observed from FIG. 4B that Y-oriented coil traces 126Y in different layers 128A, 128C, 128E, 128G are offset from one another in the X-direction—i.e. coil traces 126Y in layer 128A are offset from the next adjacent Y-oriented coil traces 126Y in layer 128C, coil traces 126Y in layer 128C are offset from the next adjacent Y-oriented coil traces 126Y in layer 128E and so on. In the illustrated embodiment, coil traces 126Y in layers 128A, 128E are aligned with one another in the X-direction and coil traces 126Y in layers 128C, 128G are aligned with one another in the X-direction—i.e. coil traces 126Y in every $2^{nd}$ layer 128 of Y-oriented coil traces 126Y are aligned with one another in the X-direction.

Although it can't be directly observed from the illustrated view of FIG. 4B, it can be appreciated that X-oriented coil traces 126X may exhibit similar characteristics—i.e. coil traces 126X in adjacent layers 128B, 128D, 128F, 128H of X-oriented coil traces 126X may be offset from one another in the Y-direction. In some embodiments, coil traces 126X in every $2^{nd}$ layer 128 of X-oriented coil traces 126X are may be aligned with one another in the Y-direction. Regardless of their offset, this description may refer to coil traces in the same "column"—for example, coil traces 126Y labeled a1, a2, a3, a4 may be referred to as being in the same column and coil traces 126Y labeled d1, d2, d3, d4 may be referred to as being in the same column. Coil traces 126X, 126Y in the same column can be connected in serially, in parallel or independently of one another.

The amount of offset between adjacent layers 128 of Y-oriented coil traces 126Y is referred to as $O_L$ and can be used to minimize the effect of higher order harmonics in the magnetic fields of magnet arrays 112. In some embodiments, $O_L$ is designed at $$\pm\frac{\lambda}{10}+\frac{K\lambda}{5},$$

where K is a positive integer number. When $O_L$ has this characteristic and adjacent Y-oriented traces in a particular column (for example, coil traces 126Y labeled a1 and a2) are driven with equal current, then the forces between the $5^{th}$ order harmonic magnetic field generated by a magnet array 112 and two offset traces 126Y in the same column (for example, coil traces a1 and a2) will tend to cancel one another out (i.e. attenuate one another). In some embodiments, $O_L$ is designed at $$\pm\frac{\lambda}{18}+\frac{K\lambda}{9},$$

where K is a positive integer number. When $O_L$ has this characteristic and adjacent Y-oriented traces 126Y in a particular column (for example, coil traces 126Y labeled a1 and a2) are driven with equal current, then the forces between the $9^{th}$ harmonic magnetic field generated by a magnet array 112 and two offset traces 126Y in the same column (for example, coil traces a1 and a2) will cancel one another out (i.e. attenuate one another).

In some embodiments, $O_L$ can be designed in such a way that several harmonic fields are optimally attenuated to minimize overall force ripple effects caused by higher order harmonics of the magnetic field generated by magnet array 112. In some embodiments, $O_L$ is designed at $\pm\lambda/2$ and Y-oriented coils trace of adjacent Y-trace layers (e.g. coil traces 126Y labeled a1 and a2) are driven with opposite current. As a result, current flowing into one layer 128 can flow back from an adjacent layer 128 to form winding turns.

Driving Y-oriented traces 126Y in a particular column (for example coil traces a1 and a2) with equal currents is practical, because these coil traces 126Y may be serially connected, but may not be desirable to achieve ideal cancellation of $5^{th}$ order harmonics effects because the coil trace a1 is closer to the magnet array than the coil trace a2. In some embodiments, the effects of higher order magnetic field harmonics of magnet arrays 112 can be further reduced by providing $O_L$ as discussed above and by driving Y-oriented traces 126Y in a particular column but in different layers 128 (for example, coil traces 126Y labeled a1 and a2) with different amounts of current. Assuming that coil trace layer 128A is closer to moveable stage 110 than coil trace 128C and so on, it will be appreciated that the magnetic field experienced by coil traces 126Y labeled a1 and a2 will not be identical. Accordingly, further attenuation of the effect of $5^{th}$ order harmonics of the magnetic field of magnet array 112 may be achieved by setting the current in the traces 126Y of layer 128C to be at least approximately $e^{2\pi \times 5 \times G_L/\lambda}$ times higher than the corresponding current in the traces 126Y of corresponding columns of layer 128A, where $G_L$ is the center-to-center Z-direction spacing between Y-oriented coil traces 126Y in adjacent layers 128. For example, the current in coil trace 126Y labeled a2 can be set to be at least approximately a factor of $e^{2\pi \times 5 \times G_L/\lambda}$ times higher than the corresponding current in trace 126Y labeled a1. The current in the traces 126Y of a single column of every $2^{nd}$ layer 128 of Y-oriented coil traces 126Y (e.g. the current in traces 126Y labeled a1 and a3) may be set to be the same.

Similarly, some attenuation of the effect of $9^{th}$ order harmonics of the magnetic field of magnet array 112 may be achieved by setting the current in the traces 126Y of layer 128C to be at least approximately $e^{2\pi \times 9 \times G_L/\lambda}$ times higher than the corresponding current in the traces 126Y of corresponding columns of layer 128A, where $G_L$ is the center-to-center Z-direction spacing between Y-oriented coil traces 126Y in adjacent layers 128. For example, the current in coil trace 126Y labeled a2 can be set to be at least approximately $e^{2\pi \times 9 \times G_L/\lambda}$ times higher than the corresponding current in trace 126Y labeled a1. The current in the traces 126Y of a single column of every $2^{nd}$ layer 128 of Y-oriented coil traces 126Y (e.g. the current in traces 126Y labeled a1 and a3) may be set to be the same.

It will be appreciated that similar offsets and/or similar current driving characteristics can be used for X-oriented coils 126X to reduce the effects of higher order magnetic fields associated with magnet arrays 112.

Figure 5:
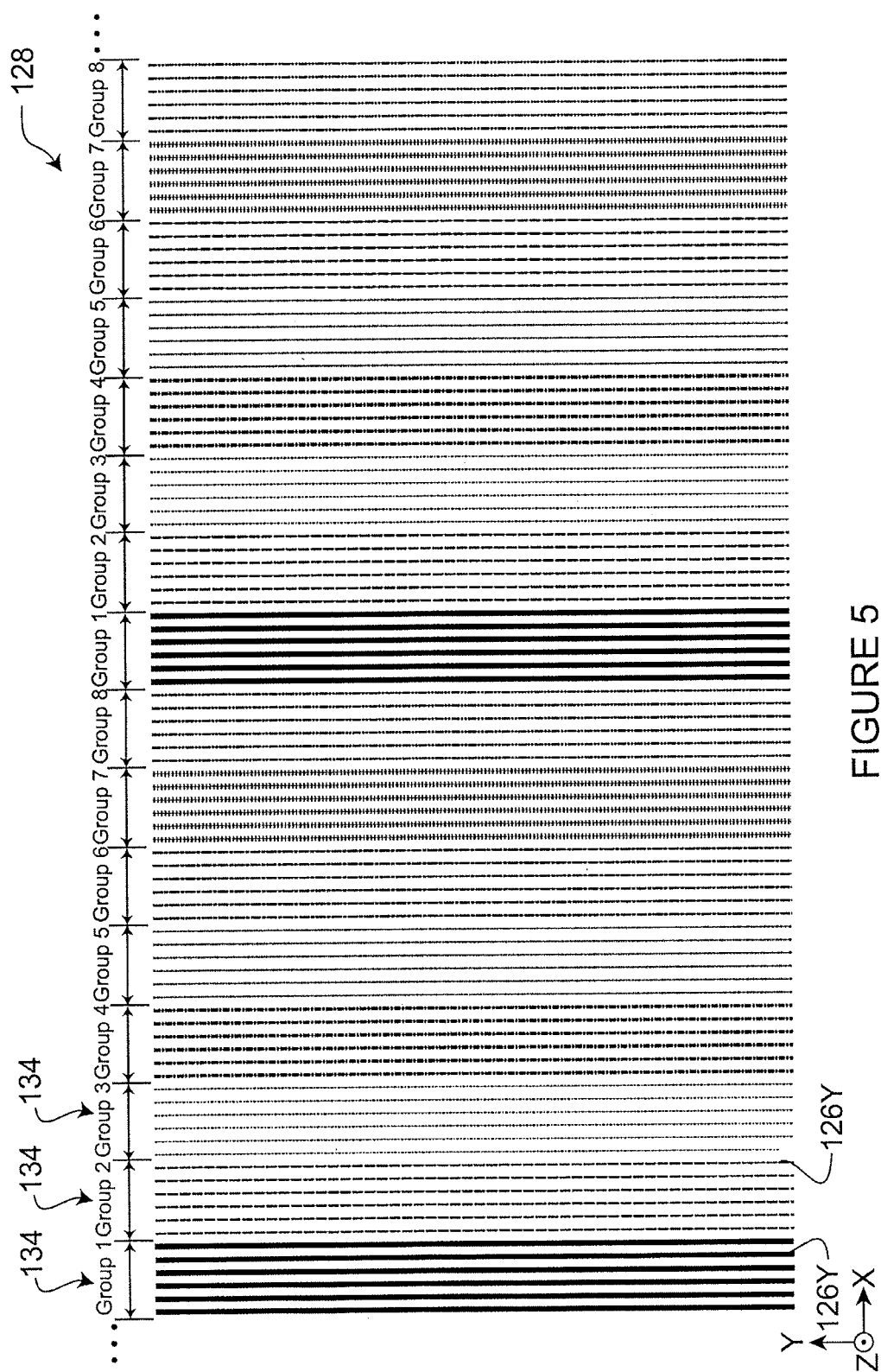
FIG. 5 is a schematic partial view of a single layer of coil traces showing a group connection scheme which may be used in the FIG. 1 displacement device.

FIG. 5 is a schematic partial view of a single layer 128 of coil traces 126 showing a group connection scheme which may be used in displacement device 100 of FIG. 1. Layer 128 shown in FIG. 5 comprises a plurality of Y-oriented coil traces 126Y which are grouped into groups 134. As discussed above, coil traces 126Y in a group 134 may be driven by a common multi-phase amplifier. In the FIG. 5 embodiment, there are $N_G=8$ different groups 134 of coil traces 126Y (labeled Group 1-Group 8 in FIG. 5). Each group 134 of coil traces 126Y extends in the Y-direction and the groups 134 are laid out side-by-side along the X direction in a repeating pattern. In general, the number $N_G$ of groups 134 of coil traces 126Y may be any suitable positive integer. To reduce the number of amplifiers (not shown) used to implement displacement device 100, coil traces 126Y belonging to particular groups 134 may be in serial connection. For example, all of the groups 134 of coil traces 126Y labeled Group 1 in FIG. 5 may be serially connected. When two or more coil traces 126Y in one layer are serially connected, the direction of current flow in such coil traces 126Y may be the same or opposite to one another. Within each group 134, each phase can either be driven by an independent amplifier, such as a H-bridge, or all phases are connected in a star pattern and driven by a multi-phase amplifier. In a special case, each of the FIG. 5 groups 134 includes only a single coil trace 126Y. At the cost of operational complexity and additional hardware, this special case embodiment permits maximum flexibility with respect to control of current location and, in turn, control of the movement of moveable stage 110. In this special case, groups 134 with the same group label (e.g. Group 1) can be serially connected and the direction of current flow in these traces 126Y can be the same or opposite to one another. It will be appreciated that similar group connection schemes may be used for X-oriented coils 126X in other layers 128.

It will be appreciated that even with the group connection implementation of FIG. 5, Y-oriented coil traces 126 in the same column but in different layers 128 (e.g. coil traces 126Y labeled a1, a2, a3, a4 in FIG. 4B) can also be connected serially and share a common amplifier. Similarly, it will be appreciated that even with the group connection implementation of FIG. 5, X-oriented coil traces 126 in the same column but in different layers can also be connected serially and share a common amplifier.

Since each phase of coil traces 126 has capacitance and there is mutual-capacitance among difference phases of coil traces 126, one or more external inductor(s) (not shown) can be serially inserted between an amplifier output terminal and a terminal of coil trace(s) 126. Such serial inductors can be installed on the planar coil PCB boards, and/or on amplifier circuit boards, and/or in the ends of the cables connecting amplifiers to planar coil assemblies. Adding such serial inductors may increase the inductance of the coil load and may thereby reduce the power loss of switching electronics of power amplifiers and reduce the current ripples in coil traces 126.

Magnet Array

FIGS. 6A and 6B (collectively, FIG. 6) are schematic partial cross-sectional views of layouts of magnet arrays 112 which may be used in moveable stage 110 of the FIG. 1 displacement device 100 and which are useful for showing a number of magnet array parameters. It can be observed that the layout of magnet arrays 112A, 112B, 112C, 112D in FIG. 6A is the same as that of magnet arrays 112A, 112B, 112C, 112D in FIG. 1B. The layout of magnet arrays 112A, 112B, 112C, 112D in FIG. 6B is similar to that of magnet arrays 112A, 112B, 112C, 112D shown in FIGS. 6A and 1B. The discussion in this section applies to both of the layouts shown in FIGS. 6A and 6B.

FIG. 6 shows that each magnet array 112 has a width of $W_m$ and a length of $L_m$. The spacing between two magnet arrays with the same elongation direction (i.e. between X-magnet arrays 112A, 112C or between Y-magnet arrays 112B, 112D) is denoted as spacing $S_m$. It can be observed that in the illustrated embodiment, moveable stage 110 comprises a non-magnetic region 113 located in a center of its magnet arrays 112 and that the dimensions of non-magnetic region 113 are $S_m-W_m$ by $S_m-W_m$. As discussed above, for each magnet array 112, the magnetization segments 114 and corresponding magnetization directions are uniform along the dimension $L_m$ and are oriented orthogonally to the dimension $L_m$. For each magnet array 112, the magnetization segments 114 and corresponding magnetization direction vary along the direction of dimension $W_m$. While not expressly shown in the illustrated views, the magnet arrays 112 shown in FIG. 6 may be mounted under a suitable table or the like which may be used to support an article (e.g. a semiconductor wafer) thereatop.

One implementation of magnet arrays 112 is described above in connection with FIG. 1D (for Y-magnet array 112B) and 1E (for X-magnet array 112A). In the description of magnet arrays that follows, a comprehensive explanation is provided in the context of an exemplary Y-magnet array 112B. X-magnet arrays may comprise similar characteristics where the X and Y directions and dimensions are appropriately interchanged. For brevity, in the description of Y-magnet array 112B that follows, the alphabetic notation is dropped and Y-magnet array 112B is referred to as magnet array 112. Similarly, the magnetization segments 114B of Y-magnet array 112B are referred to as magnetization segments 114.

FIG. 7A shows an embodiment of a magnet array 112 substantially similar to magnet array 112B described above in connection with FIG. 1D. Magnet array 112 is divided, along the X-axis, into a number of magnetization segments 114 which are generally linearly elongated in the Y-axis direction. In the illustrated embodiment, the magnetization directions of magnetization segments 114 have a spatial periodicity with a period (or wavelength) λ along the X-axis; the width $W_m$ of magnet array 112 in the X-direction is given by $W_m=N_m\lambda$ where $N_m$ is a positive integer (and $N_m=2$ in the FIG. 7A embodiment); the magnetization directions of the various magnetization segments 114 are oriented in directions orthogonal to the Y-axis; the X-axis widths of the various magnetization segments 114 are either: $\lambda/(2N_t)$ for the two outermost (edge) segments 114 or $\lambda/N_t$ for the interior segments 114, where $N_t$ represents the number of different magnetization directions in magnet array 112 (and $N_t=4$ in the FIG. 7A embodiment); and the magnetization of magnetization segments 114 is mirror symmetric about central Y-Z plane 118. It will be appreciated that with $W_m=N_m\lambda$ and the magnetization of magnetization segments 114 being mirror symmetric about central Y-Z plane 118, the outermost (edge) segments 114 have X-axis widths that are half the X-axis widths of interior segments 114 and that the outermost edge segments 114 have magnetizations that are oriented in along the Z-direction.

FIG. 7B is another embodiment of a magnet array 112 suitable for use with the FIG. 1 displacement device. The FIG. 7B magnet array 112 has characteristics similar to those of the FIG. 7A magnet array 112, except that $N_m=1$ and $N_t=4$. It can be observed from FIG. 7B that the spatial magnetic period λ is defined even where the total X-axis width $W_m$ of the magnet array is less than or equal to λ. In the FIG. 7B case, the magnetization directions of magnetization segments 114 of magnet array 112 may be considered to be spatially periodic in the X-direction with a period λ, even though there is only a single period.

As discussed above, magnet arrays 112 that exhibit the properties of those shown in FIGS. 7A and 7B eliminate or reduce cross-coupling forces from coil traces 126 oriented in X directions. Such characteristics of magnet arrays 112 shown in FIGS. 7A and 7B include: magnet arrays 112 including magnetization segments 114 which are generally elongated in the Y-direction with corresponding magnetizations oriented orthogonally to the Y-direction; the X-dimension width $W_m$ of magnet arrays 112 is $W_m=N_m\lambda$ where $N_m$ is an integer and λ is the magnetic period λ described above; and magnet arrays 112 are mirror symmetric about a Y-Z axis that runs though the center of the X-dimension of magnet arrays 112.

FIGS. 7C and 7D show other embodiments of magnet arrays 112 suitable for use with the FIG. 1 displacement device. In these embodiments, the magnetization directions of magnetization segments 114 have a spatial periodicity with a period (or wavelength) λ along the X-axis; the width $W_m$ of magnet array 112 in the X-direction is given by $W_m=(N_m+0.5)\lambda$ where $N_m$ is a non-negative integer (and $N_m=0$ in the FIG. 7C embodiment and $N_m=1$ in the FIG. 7D embodiment); the magnetization directions of the various magnetization segments 114 are oriented in directions orthogonal to the Y-axis; the magnetization of magnetization segments 114 is mirror anti-symmetric about central Y-Z plane 118; and the outermost (edge) segments 114 have magnetizations that are oriented in the Z-direction and X-axis widths of $\lambda/(2N_t)=\lambda/8$ (where $N_t=4$ in the embodiments of both FIGS. 7C and 7D) which are half of the X-axis widths $\lambda/N_t=\lambda/4$ for the interior segments 114. In the FIG. 7C case, the magnetization directions of magnetization segments 114 of magnet array 112 may be considered to be spatially periodic in the X-direction with a period λ, even though magnet array 112 exhibits less than a single period λ.

When the width $W_m$ of magnet array 112 is a non-integer number of magnetic wavelengths λ (as in the case in the embodiments of FIGS. 7C and 7D, for example), then there will be coupling of force or moment to magnet array 112 from current flow in non-aligned coil traces 126 that interact with the magnetic field of array 112. For example, in the case of the Y-magnet arrays 112 shown in FIGS. 7C and 7D (which are mirror anti-symmetric about Y-Z plane 118), there will be coupling of moment in the rotational direction about Z to Y-magnet arrays 112 from current flow in coil traces oriented along the X-direction. This net moment can be compensated using suitable control techniques or using suitable arrangements of additional magnetic arrays 112 with different (e.g. opposite) magnetization patterns.

FIGS. 7E-7H show other embodiments of magnet arrays 112 suitable for use with the FIG. 1 displacement device. In these embodiments, the magnetization directions of magnetization segments 114 have a spatial periodicity with a period (or wavelength) λ along the X-axis; the width $W_m$ of magnet array 112 in the X-direction is given by $W_m=N_m\lambda/2$, where $N_m$ is a positive integer (and $N_m=1$ in the FIG. 7E embodiment, $N_m=2$ in the FIG. 7F embodiment, $N_m=3$ in the FIG. 7G embodiment and $N_m=4$ in the FIG. 7H embodiment); the magnetization directions of the various magnetization segments 114 are oriented in directions orthogonal to the Y-axis; and the outermost (edge) segments 114 have magnetizations that are oriented along the X-axis and X-axis widths of $\lambda/(2N_t)=\lambda/8$ (where $N_t=4$ in the embodiments of FIGS. 7E and 7H) which are half of the X-axis widths $\lambda/N_t=\lambda/4$ for the interior segments 114. Note that the central Y-Z plane 118 is not explicitly shown in FIGS. 7E-7H. However, it will be appreciated that this Y-Z plane 118 divides the X-dimension of magnet array 112 in half.

Figure 7E:
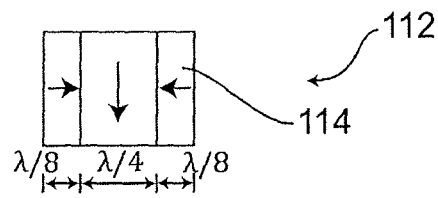
Figure 7F:
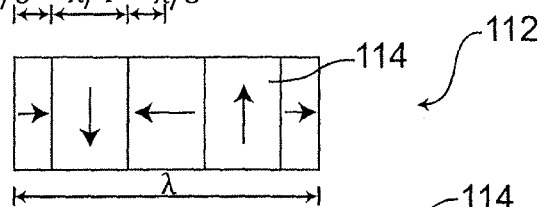
Figure 7G:
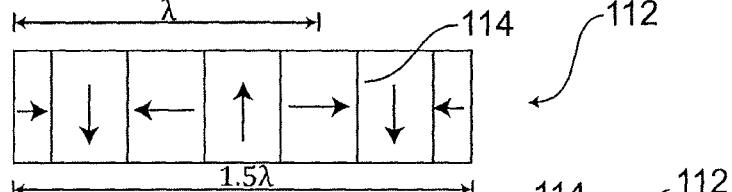

In FIGS. 7E and 7G, the magnetization of magnetization segments 114 is mirror symmetric about central Y-Z plane 118, and the width $W_m$ of magnet array 112 in the X-direction is not an integer number of spatial periods λ. In the case of Y-magnet arrays 112 shown in FIGS. 7E and 7G, there will be coupling of forces in the Y direction to Y-magnet arrays 112 from current flow in coil traces 126 oriented along the X-direction. This net force can be compensated for using suitable control techniques or using suitable arrangements of additional magnetic arrays 112 with different (e.g. opposite) magnetization patterns.

Figure 7H:
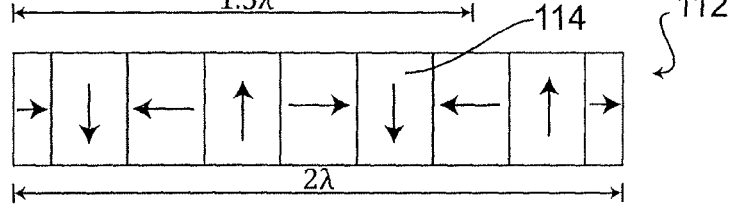
Figure 7I:
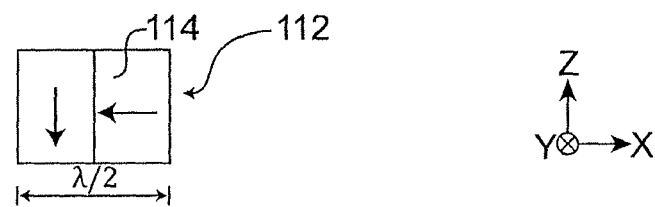
Figure 7J:
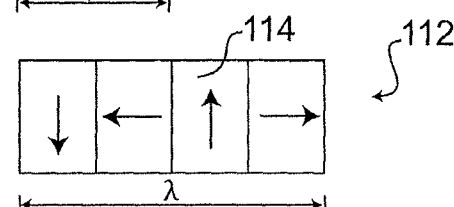
Figure 7K:
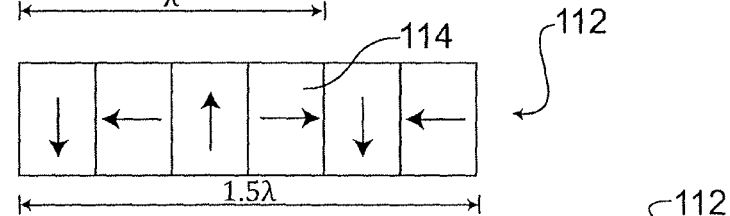
Figure 7L:
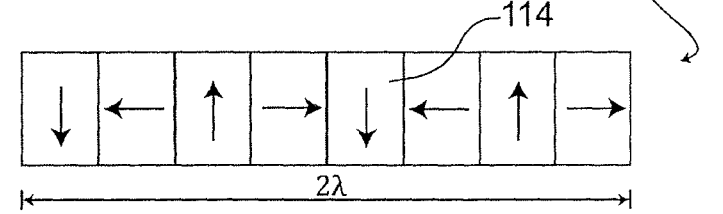

In FIGS. 7F and 7H, the magnetization of magnetization segments 114 is mirror anti-symmetric about central Y-Z plane 118, and the width $W_m$ of magnet array 112 in the X-direction is an integer number of spatial periods λ. In the case of Y-magnet arrays 112 shown in FIGS. 7F and 7H, there will be coupling of moment in the rotational direction around Z to Y-magnet arrays 112 from current flow in coil traces 126 oriented along the X-direction. This net moment can be compensated using suitable control techniques or using suitable arrangements of additional magnetic arrays 112 with different (e.g. opposite) magnetization patterns.

FIGS. 7I-7L show other embodiments of magnet arrays 112 suitable for use with the FIG. 1 displacement device. In these embodiments, the magnetization directions of magnetization segments 114 have a spatial periodicity with a period (or wavelength) λ along the X-axis; the width $W_m$ of magnet array 112 in the X-direction is given by $W_m=N_m\lambda/2$, where $N_m$ is a positive integer (and $N_m=1$ in the FIG. 7I embodiment, $N_m=2$ in the FIG. 7J embodiment, $N_m=3$ in the FIG. 7K embodiment and $N_m=4$ in the FIG. 7L embodiment); the magnetization directions of the various magnetization segments 114 are oriented in directions orthogonal to the Y-axis; and the X-axis widths of all of the magnetization segments 114 are $\lambda/N_t$ (where $N_t=4$ in the illustrated embodiments of FIGS. 7I-7L. As the magnetization of magnetization segments in FIG. 7I-7L is not mirror symmetric about central Y-Z plane 118, there will be coupling of moment in the rotational direction around Z to Y-magnet arrays 112 from current flow in coil traces oriented along the X-direction. In addition, for the cases in FIGS. 7I and 7K, as the width $W_m$ of magnet array 112 in the X-direction is not an integer number of spatial periods λ, there will be coupling of forces in the Y direction to Y-magnet arrays 112 from current flow in coil traces 126 oriented along the X-direction. This net force and moment can be compensated using suitable control techniques or using suitable arrangements of additional magnetic arrays 112 with different (e.g. opposite) magnetization patterns.

In some embodiments, magnet arrays 112 of FIGS. 7A-7L may be fabricated from unit magnetization segments 114 having Y-dimension lengths $L_m$ and X-dimension widths $\lambda/(2N_t)$ or $\lambda/(N_t)$ where Nt is the number of magnetization directions in a period λ as discussed above. In some embodiments, magnetization segments 114 having X-dimension widths $\lambda/(N_t)$ may be fabricated from a pair of side-by-side magnetization segments 114 having X-dimensions widths $\lambda/(2N_t)$ and having their magnetization directions oriented in the same direction. In some embodiments, the Z-dimension heights of the unit magnetization segments 114 may be same as their X-dimension widths—e.g. $\lambda/(2N_t)$ or $\lambda/(N_t)$.

As discussed above, a central non-magnetic spacer may be provided in magnet arrays 112. In embodiments which are symmetric or mirror symmetric about central Y-Z plane 118, such a non-magnetic spacer may divide the central magnetization segment 114 into a pair of "half-width" magnetization segments 114 (i.e. having X-dimensions widths similar to the X-dimension widths of the edge segments 114). The resultant magnet arrays 118 remain symmetric or mirror symmetric about a central Y-Z plane 118. In embodiments which are not symmetric about a central Y-Z plane 118, different patterns may be used.

FIGS. 8A-8L show magnet arrays 112 suitable for use with the FIG. 1 displacement device 100 in accordance with particular embodiments. The magnet arrays 112 of FIGS. 8A-8L have features similar to those of magnet arrays 112 of FIGS. 7A-7L, except that the magnet arrays 112 of FIGS. 8A-8L include non-magnetic spacers 136 centrally located (in their X-dimensions). Spacers 136 (of the Y-magnet arrays 112 shown in FIGS. 8A-8L) may be provided with a X-axis width g which is at least approximately equal to $$g = \left(\frac{N_g}{5} + \frac{1}{10}\right)\lambda,$$

where $N_g$ is a non-negative integer number. When the width g of spacers 136 exhibits this property, spacers 136 will have an attenuating (cancelling) effect on disturbance torques and/or forces created by the $5^{th}$ order harmonic field of magnet array 112. In general, the width g of the non-magnetic spacer 136 may be set to be at least approximately equal to $$= \left(\frac{N_g}{k} + \frac{1}{2k}\right)\lambda,$$

where $N_g$ has the above described properties and k is the order of the harmonic of the magnetic field to be attenuated. In some embodiments, spacers 136 (of the Y-magnet arrays 112 shown in FIGS. 8A-8L) may be provided with a X-axis width g which is at least approximately equal to $$g = \frac{K_g}{5}\lambda - W_c,$$

where $K_g$ is a non-negative integer number and $W_c$ is the X-axis width of coil traces 126 generally elongated in Y direction. When the width g of spacers 136 exhibits this property, spacers 136 will have an attenuating (cancelling) effect on disturbance torques and/or forces created by the $5^{th}$ order harmonic field of magnet array 112. In general, the width g of the non-magnetic spacer 136 may be set to be at least approximately equal to $$\frac{K_g}{k}\lambda - W_c,$$

where $K_g$ and $W_c$ have the above described properties and k is the order of the harmonic of the magnetic field to be attenuated.

Figure 8A:
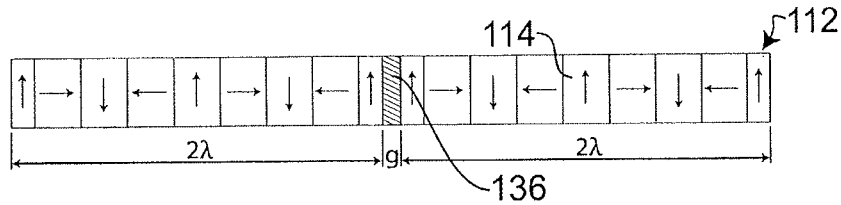
FIGS. 8A-8L show additional details of magnet arrays suitable for use with the FIG. 1 displacement device in accordance with particular embodiments.
Figure 8B:
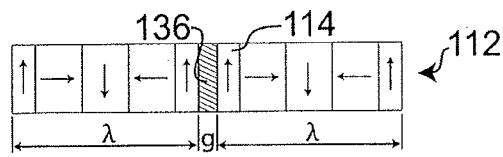

The magnet array 112 embodiments shown in FIGS. 8A and 8B have two sides arranged on either X-direction side of non-magnetic spacer 136. Both the left and right sides (in the illustrated view) of the FIG. 8A magnet array 112 have magnetization patterns similar to those of magnet array 112 of FIG. 7A; and both the left and right sides of the FIG. 8B magnet array 112 have magnetization patterns similar to those of magnet array 112 of FIG. 7B. The X-direction width $W_{side}$ of each side of the magnet arrays 112 of FIGS. 8A and 8B (i.e. the X-direction distance between an edge of array 112 and the edge of non-magnetic spacer 136) is $W_{side}=N_m\lambda$ where $N_m$ is a positive integer and the total X-direction width of the magnet arrays 112 of FIGS. 8A and 8B is $W_m=2N_m\lambda+g$, where $N_m=2$ in FIG. 8A and $N_m=1$ in FIG. 8B.

Figure 8C:
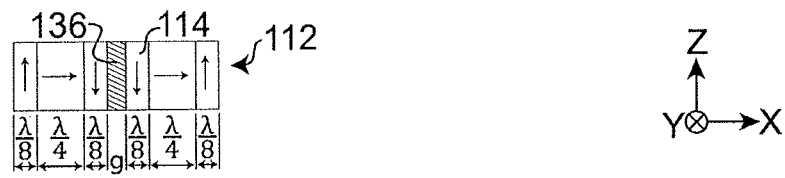
Figure 8D:
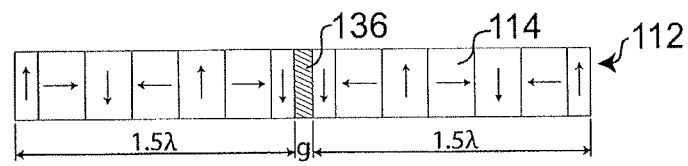
Figure 8E:
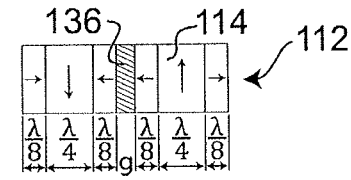
Figure 8F:
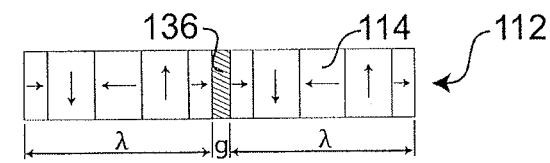
Figure 8G:
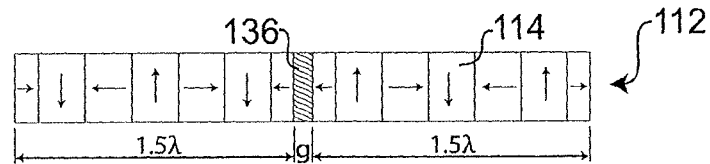
Figure 8H:
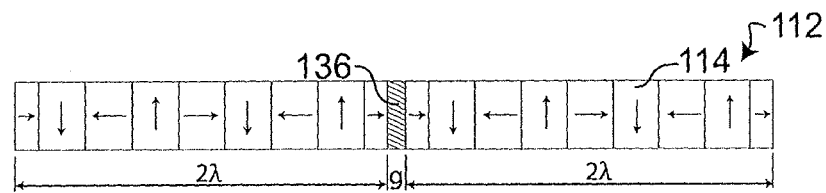
Figure 8I:
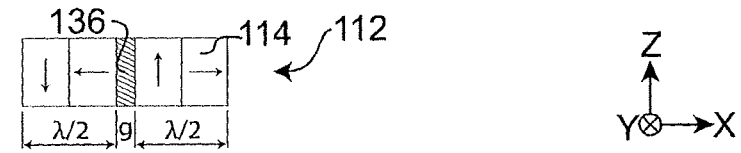
Figure 8J:
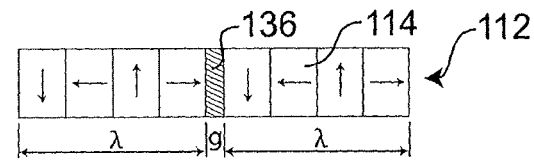
Figure 8K:
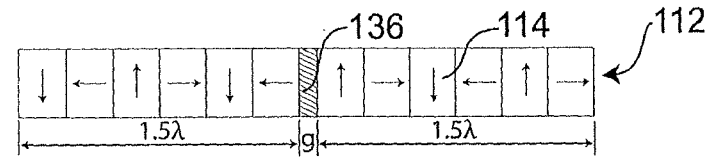
Figure 8L:
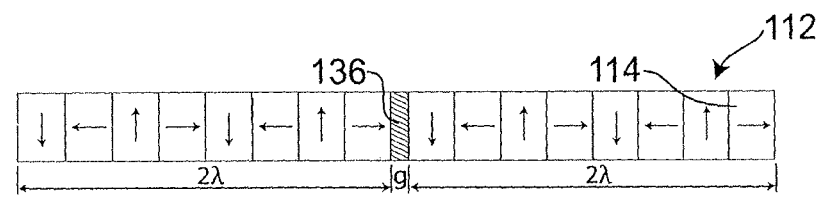

The magnet array 112 embodiments shown in FIGS. 8C and 8D have two sides arranged on either X-direction side of non-magnetic spacer 136. The left (in the illustrated view) sides of magnet arrays 112 shown in FIGS. 8C and 8D have magnetization patterns similar to those of magnet arrays 112 shown in FIGS. 7C and 7D respectively. The right (in the illustrated view) sides of magnet arrays 112 shown in FIGS. 8C and 8DF have magnetization patterns that are opposite those of the left sides—i.e. as if the left side of the magnet array 112 was duplicated in the location of the right side of the magnet array 112 and then each individual magnetization segment 114 in the right side of the magnet array 112 was rotated 180° about its own central axis along which it is linearly elongated. The X-direction width $W_{side}$ of each side of the magnet arrays 112 of FIGS. 8C and 8D is $W_{side}=(N_m-0.5)\lambda$ where $N_m$ is a positive integer and the total X-direction width of the magnet arrays 112 of FIGS. 8C and 8D is $W_m=(2N_m-1)\lambda+g$, where $N_m=1$ in FIG. 8C and $N_m=2$ in FIG. 8D.

Similarly, the magnet array 112 shown in FIGS. 8E, 8G, 8I, 8K have two sides arranged on either X-direction side of non-magnetic spacer 136, with their respective left (in the illustrated view) sides having magnetization patterns similar to FIGS. 7E, 7G, 7I, 7K magnet array 112 and their respective right (in the illustrated view) sides having magnetization patterns that are the opposite to those of the left (in the illustrated view sides, where "opposite" has the same meaning as discussed above for the case of FIGS. 8C and 8D. The X-direction widths $W_{side}$ of each side of the magnet arrays 112 of FIGS. 8E, 8G, 8I, 8K is $W_{side}=(N_m-0.5)\lambda$ where $N_m$ is a positive integer and the total X-direction width of the magnet arrays 112 of FIGS. 8E, 8G, 8I, 8K is $W_m=(2N_m-1)\lambda+g$, where $N_m=1$ in FIG. 8E, $N_m=2$ in FIG. 8G, $N_m=1$ in FIG. 8I, $N_m=2$ in FIG. 8K.

The magnet arrays 112 shown in FIGS. 8F, 8H, 8J, 8L have two sides arranged on either X-direction side of non-magnetic spacer 136, with both their left and right sides having magnetization patterns similar to those of magnet arrays 112 of FIGS. 7F, 7H, 7J, 7L, respectively. The X-direction width $W_{side}$ of each side of the magnet arrays 112 of FIGS. 8F, 8H, 8J, 8L is $W_{side}=N_m\lambda$ where $N_m$ is a positive integer and the total X-direction width of the magnet arrays 112 of FIGS. 8F, 8H, 8J, 8L is $W_m=2N_m\lambda+g$, where $N_m=1$ in FIG. 8F, $N_m=2$ in FIG. 8H, $N_m=1$ in FIG. 8J, $N_m=2$ in FIG. 8L. The magnet arrays 112 shown in FIGS. 8A-8L may be fabricated in a manner similar to that described above for FIGS. 7A-7L.

Layout of Magnet Arrays

As discussed above, FIGS. 6A and 6B show layouts of the magnet arrays 112 which may be used in moveable stage 110 of displacement device 100 in accordance with particular embodiments. In accordance with particular embodiments, when arranging magnet arrays 112 on moveable stage 110, the spacing $S_m$ between two adjacent parallel arrays (e.g. between a pair of X-magnet arrays 112, such as X-magnet array 112A and X-magnet array 112C in the case of the FIG. 6 embodiment and/or between a pair of Y-magnet arrays 112, such as Y-magnet arrays 112B and Y-magnet arrays 112D, in the case of the FIG. 6 embodiment) may be selected to be at least approximately $$S_m = \left(N_S + \frac{1}{2}\right)P_C,$$

where $N_S$ is a non-negative integer number and $P_C$ is the coil trace pitch discussed above (see FIG. 2). When a plurality of parallel magnet arrays 112 are designed with this spacing characteristic, this spacing characteristic will help to minimize or reduce force and/or torque ripples which may be generated by the discrete nature (i.e. finite dimensions) of coil traces 126.

In some embodiments, when arranging magnet arrays 112 on moveable stage 110, the spacing $S_m$ between two adjacent parallel arrays (e.g. between a pair of X-magnet arrays 112, such as X-magnet array 112A and X-magnet array 112C in the case of the FIG. 6 embodiment and/or between a pair of Y-magnet arrays 112, such as Y-magnet arrays 112B and Y-magnet arrays 112D, in the case of the FIG. 6 embodiment) may be selected to be at least approximately $S_m=(2N_S+1)\lambda/12$, where $N_S$ is a non-negative integer number. When a plurality of parallel magnet arrays 112 are designed with this spacing characteristic, this spacing characteristic will help to minimize or reduce 6 cycle-per-$\lambda$ force and/or torque ripples which may be generated by the interaction between $5^{th}$ harmonics magnetic field of magnet arrays 112 and current flowing in coil traces 126.

Figure 9A:
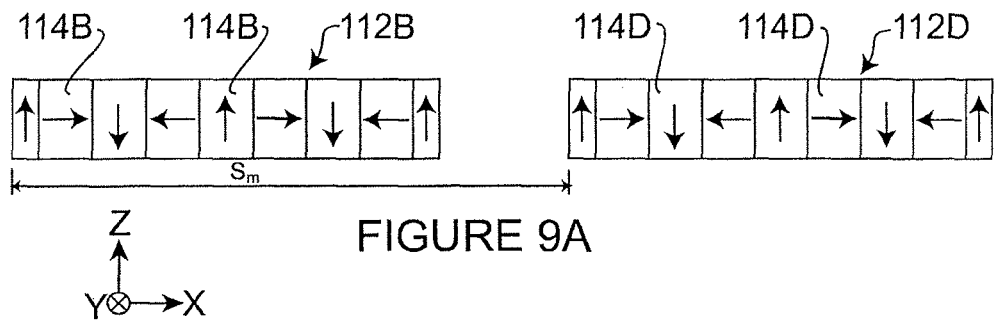
FIGS. 9A and 9B are schematic cross-sectional views of pairs of parallel adjacent magnet arrays according to particular embodiments suitable for use with the FIG. 1 displacement device and showing the magnetization directions of their corresponding magnetization segments.
Figure 9B:
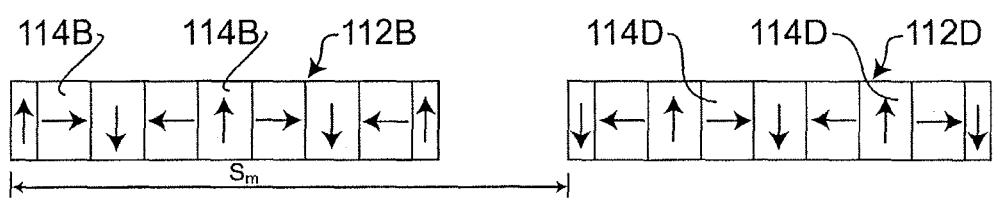

In some embodiments, two adjacent parallel magnet arrays 112 (e.g. a pair of X-magnet arrays 112, such as X-magnet array 112A and X-magnet array 112C in the case of the FIG. 6 embodiment and/or a pair of Y-magnet arrays 112, such as Y-magnet arrays 112B and Y-magnet arrays 112D, in the case of the FIG. 6 embodiment) may comprise magnetization segments 114 with magnetization orientations that are the same as one another. This characteristic is shown, for example, in FIG. 9A where Y-magnet array 112B and Y-magnet array 112D comprise magnetization segments 114B, 114D with magnetization orientations that are the same as one another. In some embodiments, two adjacent parallel magnet arrays 112 may comprise magnetization segments 114 with magnetization orientations that are the opposites of one another—i.e. as if each magnetization segment 114 is individually rotated 180° about a corresponding central axis along which it is linearly elongated. This characteristic is shown, for example, in FIG. 9B, where magnet array 112B and magnet array 112D comprise magnetization segments 114B, 114D with magnetization orientations that are opposite to one another.

In some embodiments, the spacing $S_m$ is designed to be at least approximately $$S_m = N_S \frac{\lambda}{2},$$

where $N_S$ is a positive integer. Where the spacing of adjacent parallel magnet arrays 112 (e.g. a pair of X-magnet arrays 112, such as X-magnet array 112A and X-magnet array 112C in the case of the FIG. 6 embodiment and/or a pair of Y-magnet arrays 112, such as Y-magnet arrays 112B and Y-magnet arrays 112D, in the case of the FIG. 6 embodiment) are designed to have this feature, then the current distribution in the active coil traces 126 for each parallel magnet array 112 can be substantially similar in spatial distribution (i.e. in phase), provided that the parallel magnet arrays 112 have the same magnetization pattern and $N_S$ is even or the parallel magnet arrays 112 have opposite magnetization patterns and $N_S$ is odd.

As discussed above, the layout of magnet arrays 112 shown in FIGS. 6A and 6B provides for a non-magnetic region 113 located between magnet arrays 112. In some embodiments, the dimensions ($S_m$–$W_m$) of this non-magnetic region 113 may be designed to have the characteristics that ($S_m$–$W_m$)≥$\lambda$, such that active coil traces 126 for two parallel magnet arrays 112 don't interfere with one another.

In some embodiments, the dimension $L_m$ of magnet arrays 112 shown in FIGS. 6A and 6B is set at least approximately equal to $L_m$=$N_L\lambda$, where $N_L$ is a positive integer number. Where magnet arrays 112 exhibit this characteristic, there will be a further reduction in the coupling force generated between a magnet array 112 and current flowing in coil traces 126 in directions orthogonal to the elongated dimension of magnet array 112.

The layout of magnet arrays 112 shown in FIGS. 6A and 6B is not the only possible layout for magnet arrays 112 that could be used for moveable stage 110 of the FIG. 1 displacement device 100. More particularly, a number of other possible layouts of magnet arrays 112 suitable for use in moveable stage 110 of the FIG. 1 displacement device 100 are shown in FIGS. 10A-10D.

Figure 10A:
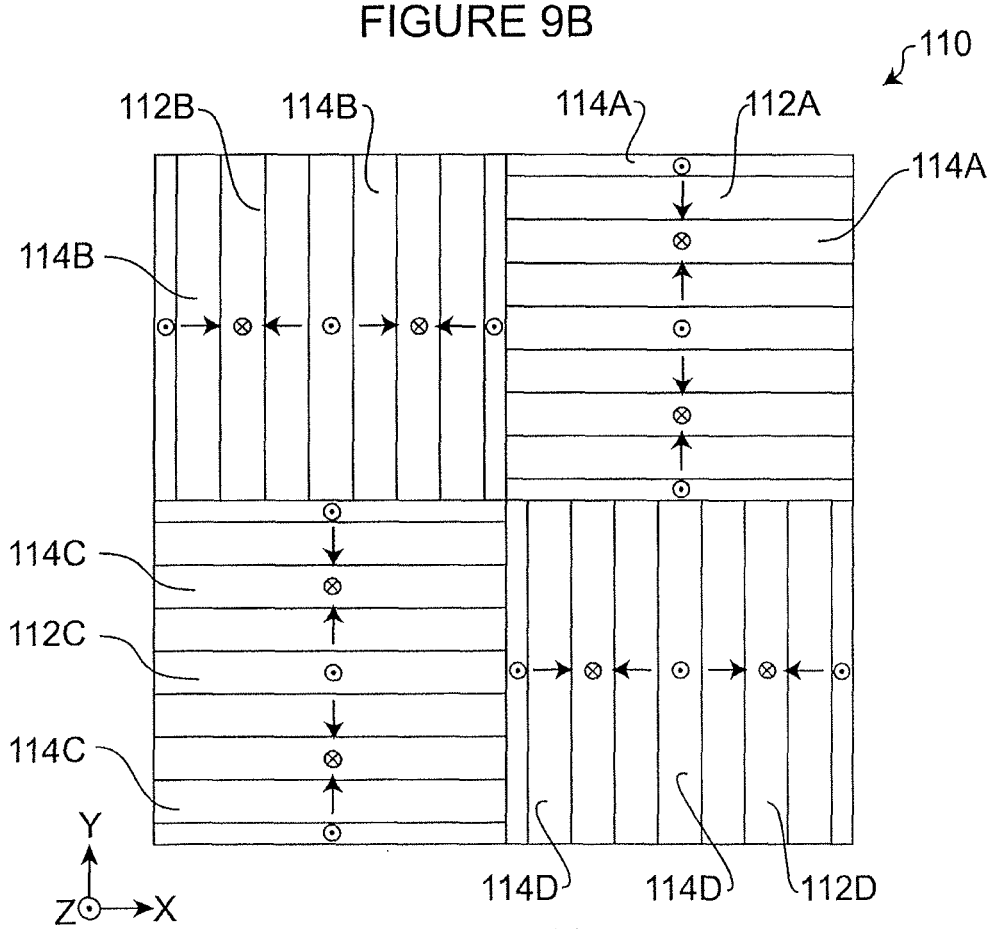
FIGS. 10A-10D are schematic cross-sectional views of layouts of magnet arrays which may be used in the FIG. 1 displacement device in accordance with other embodiments.

FIG. 10A shows a schematic cross-sectional view of layout of magnet arrays 112A, 112B, 112C, 112D which may be used for moveable stage 110 of the FIG. 1 displacement device 100 in accordance with a particular embodiment. The FIG. 10A layout of magnet arrays 112 differs from the FIG. 6 layout of magnet arrays 112 because magnet arrays 112 are shaped (e.g. as squares) such that non-magnetic region 113 is eliminated and all of the undersurface area of moveable stage 110 is occupied by magnet arrays 112. In the illustrated embodiment of FIG. 10A, each magnet array 112 comprises a pattern of magnetization segments 114 having the characteristics as those shown in FIG. 7A, although it will be appreciated that magnet arrays 112 of the FIG. 10A layout could be provided with magnetization segments 114 exhibiting characteristics of any of the magnet arrays 112 described herein—e.g. exhibiting any of the magnetization patterns shown in FIGS. 7A-7L and 8A-8L.

Figure 10B:
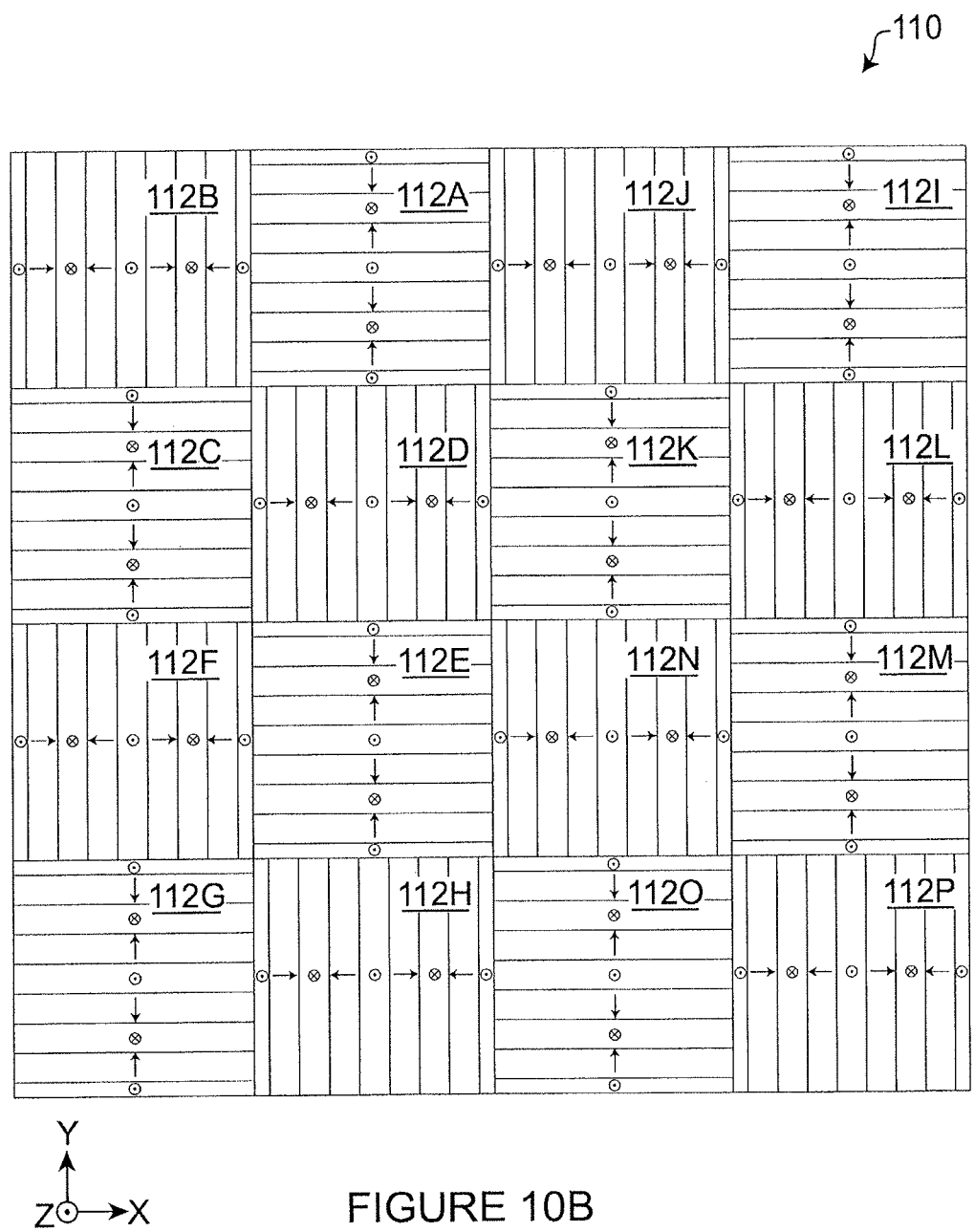

FIG. 10B shows a schematic cross-sectional view of a layout of magnet arrays 112A-112P which may be used for moveable stage 110 of the FIG. 1 displacement device 100 in accordance with another embodiment. The layout of FIG. 10B differs from the layout of FIG. 10A in that the layout of FIG. 10B includes more than four magnet arrays 112. In the illustrated embodiment, magnet arrays 112A, 112C, 112E, 112G, 112I, 112K, 112M, 112O are X-magnet arrays and magnet arrays 112B, 112D, 112F, 112H, 112J, 112L, 112N, 112P are Y-magnet arrays. The FIG. 10B layout comprising more than four magnet arrays 112 may be used, for example, where moveable stage 110 is relatively large.

Figure 10C:
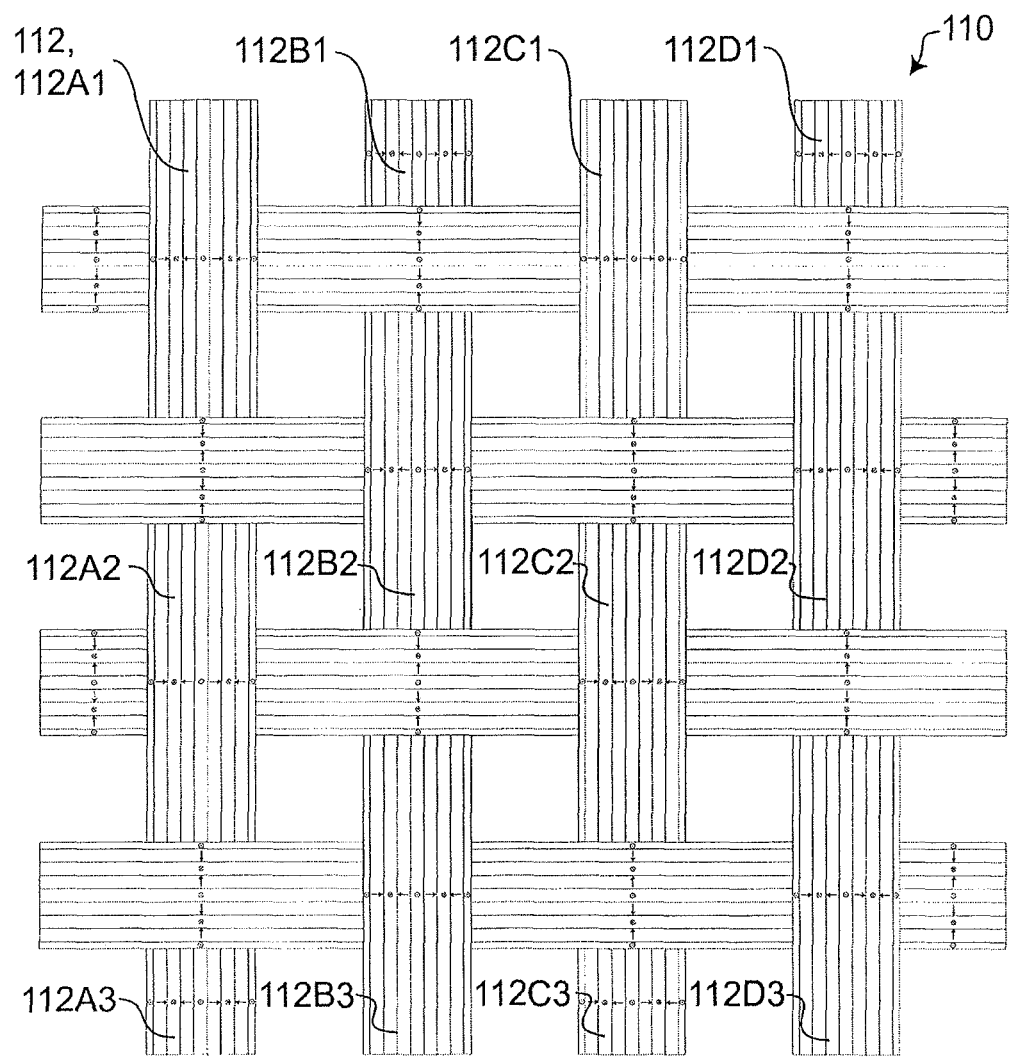

FIG. 10C shows a schematic cross-sectional view of a layout of magnet arrays 112 which may be used for moveable stage 110 of the FIG. 1 displacement device 100 according to another embodiment. For brevity, only Y-magnet arrays 112A1, 112A2, 112A3, 112B1, 112B2, 112B3, 112C1, 112C2, 112C3, 112D1, 112D2, 112D3 are expressly labeled in FIG. 10C, although it will be appreciated that X-magnet arrays are also shown in FIG. 10C. Magnet arrays 112 with the same orientation (e.g. X-magnet arrays or Y-magnet arrays) and aligned with one another in the direction orthogonal to the direction of elongation of their magnetization segments may be referred to herein as a set of aligned magnet arrays. For example, Y-magnet arrays 112A1, 112A2, 112A3 are a set of aligned Y-magnet arrays, because they have the same orientation (they are Y-magnet arrays elongated along the Y-axis) and are aligned with one another in a direction (the X-direction) orthogonal to the direction of elongation of their respective magnetization segments. A set of aligned magnet arrays may be driven by current flow in the same coil traces 126 of stator 120 (not shown in FIG. 10C). For example, the set of aligned Y-magnet arrays 112A1, 112A2, 112A3 may be driven by current flow in the same coil traces 126 of stator 120. Similarly, the set of aligned Y-magnet arrays 112B1, 112B2, 112B3 may be driven by the same coil traces 126 of stator 120, the set of aligned Y-magnet arrays 112C1, 112C2, 112C3 may be driven by the same coil traces 126 of stator 120 and the set of aligned Y-magnet arrays 112D1, 112D2, 112D3 may be driven by the same coil traces 126 of stator 120.

Because of the spacing between each set of aligned Y-magnet arrays (e.g. the set of aligned Y-magnet arrays 112A1, 112A2, 112A3) and the adjacent set(s) of aligned Y-magnet arrays (e.g. the adjacent set of aligned Y-magnet arrays 112B1, 112B2, 112B3), each set of aligned Y-magnet arrays can be driven independently by its corresponding active coil traces 126 without significant coupling from adjacent sets of aligned Y-magnet arrays. In the FIG. 10C embodiment, there is also an offset between the actuating force center of the set of aligned Y-magnet arrays 112A1, 112A2, 112BA3 and the set of aligned Y-magnet arrays 112B1, 112B2, 112B3, these two sets of aligned Y-magnet arrays can be used to generate two levitating forces (i.e. the Z-direction) and two lateral (i.e. in the X-direction) forces.

In the illustrated embodiment of FIG. 10C, there are four sets of aligned Y-magnet arrays: a first set of aligned Y-magnet arrays 112A1, 112A2, 112A3; a second set of aligned Y-magnet arrays 112B1, 112B2, 112B3; a third set of aligned Y-magnet arrays 112C1, 112C2, 112C3; and a fourth set of aligned Y-magnet arrays 112D1, 112D2, 112D3, and each set of aligned Y-magnet arrays can independently generate two forces (one levitation force (in the Z-direction) and one lateral force (in the X-direction)). Three or more sets of aligned Y-magnet arrays having a Y-direction offset (e.g. the offset of the actuating force center between the first set of aligned Y-magnet arrays 112A1, 112A2, 112A3 and the second set of aligned Y-magnet arrays 112B1, 112B2, 112B3) may alone be used to provide actuating forces and torques in 5 degrees of freedom—i.e. forces in the X and Z directions and moment around the X, Y and Z axes. The only actuating force that cannot be provided by three or more sets of aligned Y-magnet arrays having a Y-direction offset is force in the Y-direction in FIG. 10C.

In the illustrated embodiment of FIG. 10C, there are four sets of aligned Y-magnet arrays: a first set of aligned Y-magnet arrays 112A1, 112A2, 112A3; a second set of aligned Y-magnet arrays 112B1, 112B2, 112B3; a third set of aligned Y-magnet arrays 112C1, 112C2, 112C3; and a fourth set of aligned Y-magnet arrays 112D1, 112D2, 112D3. While not explicitly enumerated with reference numerals, those skilled in the art will appreciate that the illustrated embodiment of FIG. 10C also include four sets of aligned X-magnet arrays, each of which can independently generate two forces (one levitation force (in the Z-direction) and one lateral force (in the Y-direction)). With all of the sets of aligned arrays capable of being independently driven by their corresponding active coil traces 126, the FIG. 10C magnet array layout provides a significant amount of over actuation. These over-actuating capabilities can be used to control the flexible mode vibration of moveable stage 110, for moveable stage shape correction and/or for vibration suppression. It will be appreciated by those skilled in the art that the layout of FIG. 10C provides four sets of aligned X-magnet arrays and four sets of aligned Y-magnet arrays, but some embodiments may comprise larger numbers or smaller numbers of sets of aligned X and Y-magnet arrays. Also, it will be appreciated by those skilled in the art that the layout of FIG. 10C provides that each set of aligned X-magnet arrays and each set of aligned Y-magnet arrays comprises three individual magnet arrays, but some embodiments may comprise different numbers of individual magnet arrays in each set of aligned magnet arrays.

Figure 10D:
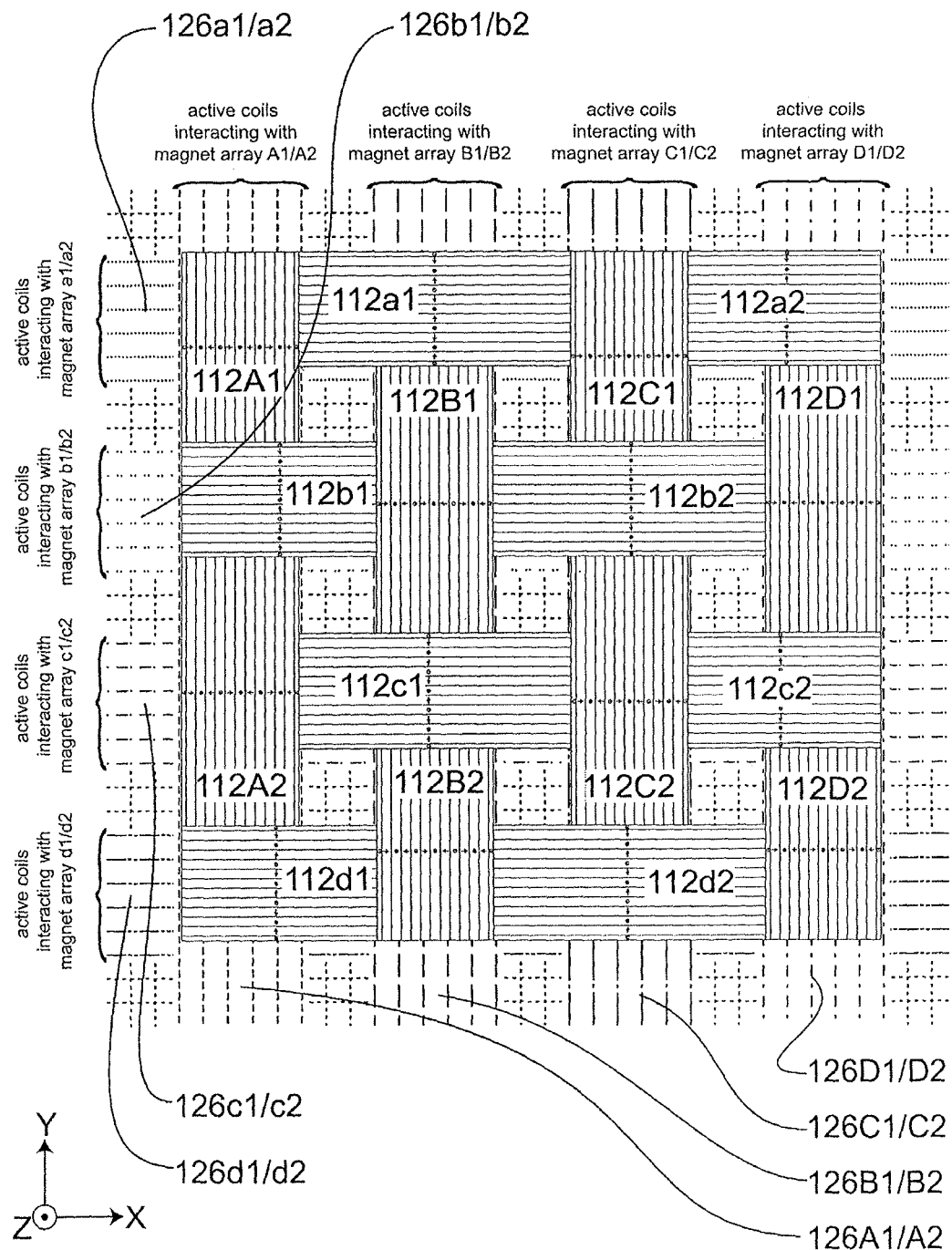

FIG. 10D shows a schematic cross-sectional view of a layout of magnet arrays 112 which may be used for moveable stage 110 of the FIG. 1 displacement device 100 according to another embodiment. FIG. 10D also schematically depicts the coil traces 126 that may be used to actuate the various sets of aligned X and Y-magnet arrays 112. It should be noted that the coil traces 126 shown in FIG. 10D are schematic in nature and do not represent the dimensions or numbers of coil traces 126. The layout of magnet arrays 112 in FIG. 10D is similar to that of FIG. 10C, except that in FIG. 10D each set of aligned X and Y-magnet arrays 112 comprises a pair of individual magnet arrays 112 (instead of three individual magnet arrays, as is the case in FIG. 10C). More particularly, the layout of FIG. 10D comprise four sets of aligned X-magnet arrays with two individual magnet arrays in each set and four sets of aligned Y-magnet arrays with two individual magnet arrays in each set. The sets of X-magnet arrays in the FIG. 10D layout include: a first set of aligned arrays 112a1, 112a2; a second set of aligned arrays 112b1, 112b2; a third set of aligned arrays 112c1, 112c2; and a fourth set of aligned arrays 112d1, 112d2. The sets of Y-magnet arrays in the FIG. 10D layout include: a first set of aligned arrays 112A1, 112A2; a second set of aligned arrays 112B1, 112B2; a third set of aligned arrays 112C1, 112C2; and a fourth set of aligned arrays 112D1, 112D2.

As is the case for the layout of FIG. 10C, sets of aligned magnet arrays in the FIG. 10D layout may be driven by the same set of coil traces 126 on stator 120. More particularly: the first set of aligned X-magnet arrays 112a1, 112a2 may be driven by coil traces 126a1/a2; the second set of aligned X-magnet arrays 112b1, 112b2 may be driven by coil traces 126b1/b2; the third set of aligned X-magnet arrays 112c1, 112c2 may be driven by coil traces 126c1/c2; and the fourth set of aligned X-magnet arrays 112d1, 112d2 may be driven by coil traces 126d1/d2. Similarly: the first set of aligned Y-magnet arrays 112A1, 112A2 may be driven by coil traces 126A1/A2; the second set of aligned Y-magnet arrays 112B1, 112B2 may be driven by coil traces 126B1/B2; the third set of aligned Y-magnet arrays 112C1, 112C2 may be driven by coil traces 126C1/C2; and the fourth set of aligned Y-magnet arrays 112D1, 112D2 may be driven by coil traces 126D1/D2. It will be appreciated that the active coil traces for each set of aligned magnet arrays are not static but are determined dynamically based on the current position of moveable stage 110 and the desired movement of moveable stage 110.

As is the case with FIG. 10C discussed above, the layout of FIG. 10D includes a significant amount of over actuation. These over-actuating capabilities can be used to control the flexible modes of moveable stage 110, for moveable stage shape correction and/or for moveable stage vibration suppression. It will be appreciated by those skilled in the art that the layout of FIG. 10D provides four sets of aligned X-magnet arrays and four sets of aligned Y-magnet arrays, but some embodiments may comprise larger numbers or smaller numbers of sets of aligned X and Y-magnet arrays. Also, it will be appreciated by those skilled in the art that the layout of FIG. 10D provides that each set of aligned X-magnet arrays and each set of aligned Y-magnet arrays comprises a pair of individual magnet arrays, but some embodiments may comprise different numbers of individual magnet arrays in each set of aligned magnet arrays.

The characteristics of each individual magnet array 112 in the layouts of FIGS. 10A-10D (e.g. the orientations of magnetization segments 114, the lengths $L_m$, the widths $W_m$ and the like) can be similar to any of those described herein—e.g. exhibiting any of the magnetization patterns shown in FIGS. 7A-7L and 8A-8L. The spacing $S_m$ of adjacent arrays in FIGS. 10C, 10D can be similar to that described above for FIGS. 6A, 6B.

Field Folding and Current Commutation

In some embodiments, magnet arrays 112 comprise characteristics similar to so-called "Halbach arrays". Usually, the magnetic field of a Halbach array is assumed to be primarily sinusoidal with a small amount of $5^{th}$ order harmonic distortion. This assumption is relatively accurate at locations well inside (i.e. away from the edges) of a long, multi-period Halbach array. However, at the edges of the Halbach array, the magnetic field is far from sinusoidal, particularly when the magnet array is only 1-2 magnetic periods ($\lambda$) wide as is the case, for example, in some of the magnet arrays 112 shown in FIGS. 7 and 8. The distortion of the magnetic field at the edges of magnet arrays 112 may be referred to as fringing field effects. Designing a commutation law to achieve at least approximately linear force characteristics for such a non-sinusoidal field can be difficult.

One technique to minimize the fringing field effects when using current carrying coil traces to impart forces on a Halbach array involves increasing the number of magnetic periods ($\lambda$) in the Halbach array. Although disturbance forces attributable to the fringing field are unchanged with the increased number of magnetic periods, the effect of such disturbance forces on the total amount of force imparted on the larger Halbach array is reduced. Another technique to minimize the fringing field effects when using current carrying coil traces to impart forces on a Halbach array involves only exciting coil traces that are located away from the edges of the Halbach array and the fringing fields. This second technique sacrifices force generation capacity.

Figure 11A:
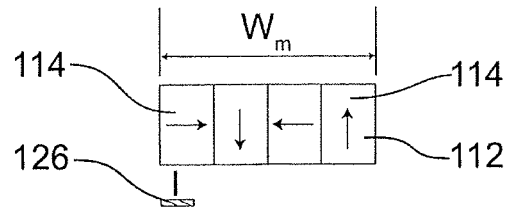
FIGS. 11A-11C are schematic cross-sectional views of magnet arrays and coil traces used to demonstrate a theoretical field folding principle.
Figure 11B:
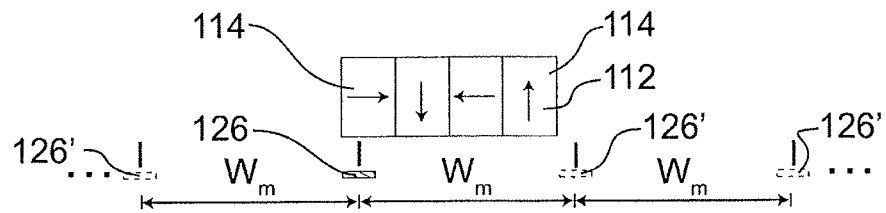
Figure 11C:
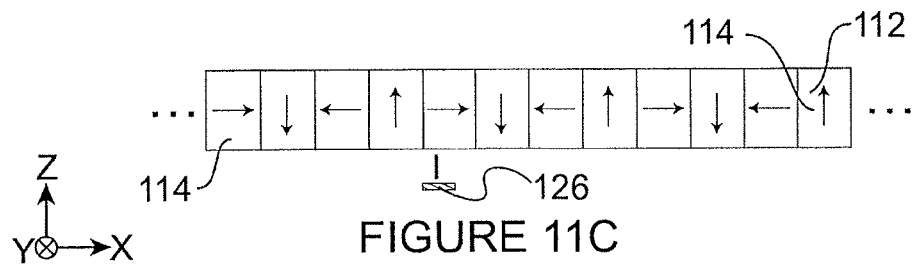

The inventors have determined that it can be theoretically proven (using spatial convolution theory) that the forces (both lateral and vertical) between a magnet array of width $W_m$ and an infinitely wide current array of period $W_m$ are of identical magnitudes to the forces between an infinitely wide magnet array with period $W_m$ and a single coil trace. This principle is illustrated in FIGS. 11A-11C. FIG. 11A shows a short Y-magnet array 112 of width $W_m$ moving laterally (i.e. in the X-direction in the illustrated view) relative to a single coil trace 126 excited with constant current. This FIG. 11A arrangement produces non-sinusoidal forces due to the interaction of coil trace 126 with the fringing fields at or near the edge of magnet array 112. In FIG. 11B, extra coil traces 126' excited with the same amount of current as original coil trace 126 are added to form an infinitely wide current array of period $W_m$. The resulting total force between magnet array 112 and the array of coil traces 126, 126' becomes sinusoidal with a small component caused by the $5^{th}$ order harmonic. In FIG. 11C, forces are generated between the current in a single coil trace 126 and an infinitely wide periodic magnet array 112 of period $W_m$.

The total forces between magnet array 112 and the arrays of coil traces 126, 126' in the arrangement of FIG. 11B are the same as the forces between magnet array 112 and single coil trace 126 in the arrangement of FIG. 11C, if all coil traces 126, 126' are excited with the same amount of current. This same principal applies to any of the magnet arrays 112 shown in FIGS. 7 and 8. In practical terms, the FIG. 11B infinite coil array is not required and it is sufficient to excite extra coil traces up to about $\lambda/2$ or greater beyond the edges of magnet array 112. This equivalence significantly simplifies the force analysis. Using this principle and standard three phase sinusoidal commutation, the actuating force on magnet array 112 (and a moveable stage 110 comprising a plurality of magnet arrays 112) has excellent linear characteristics, which is desirable for high speed precision applications.

Figure 11D:
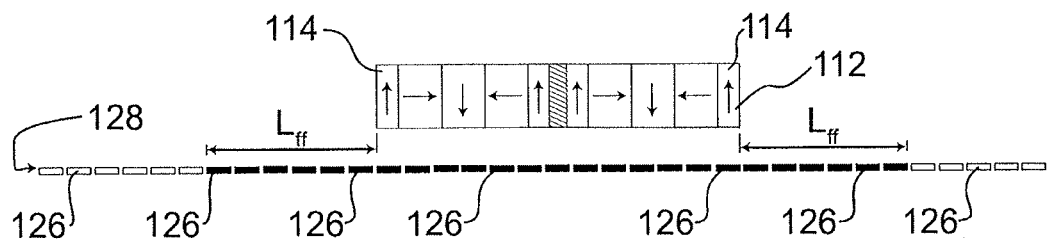
FIG. 11D is a schematic cross-sectional view showing one layer of coil traces and a single magnet array that may be used in the FIG. 1 displacement device and how the field folding principle of FIGS. 11A-11C may be used in practice.

FIG. 11D is a schematic cross-sectional view showing one layer 128 of coil traces 126 and a single magnet array 112 that may be used in the FIG. 1 displacement device 100 and how the field folding principle of FIGS. 11A-11C may be used in practice. Active (current carrying) coil traces 126 are shown as solid black; traces 126 shown in white represent either inactive coil traces 126 or active coil traces 126 for other magnet arrays (not shown). In the illustrate view of FIG. 11D, magnet array 112 is a Y-magnet array having magnetization segments 114 which are generally linearly elongated in the Y-direction. As can be seen from FIG. 11D, coil traces 126 are excited below magnet array 112 and out to a field folding length $L_{FF}$ beyond each X-axis edges of magnet array 112. Coil traces 126 beyond this zone (i.e. greater than $L_{FF}$ away from the X-axis edges of magnet array 112) can be either inactive, or be activated for other magnet arrays or may also be activated for the illustrated magnet array 112. Depending on the gaps between adjacent magnet arrays (e.g. the gap $S_m$-$W_m$ shown in FIG. 6), $L_{FF}$ can be set a suitable distance which balances the desirability of extending beyond the X-axis edges of magnet array 112 and avoiding force coupling with an adjacent magnet array. In some embodiments, $L_{FF}$ can be set at $L_{FF}=N_{ff}\lambda/2$, where $N_{ff}$ is a positive integer. In some embodiments, $L_{FF}$ can be set at anything greater than or equal to $\lambda/2$. With a field folding length of $L_{FF}$ on either side of the edges of magnet array 112, the current direction and magnitude of commutating laws can be designed in the same way as done in the situation where magnet array 112 is infinitely extended on both sides. This means that all active coil traces 126 on the same layer 128 for the same magnet array 112 follow the same commutation law (most commonly sinusoidal commutation) except that coil traces 126 have electrical phase shifts relative to one another.

Figure 12:
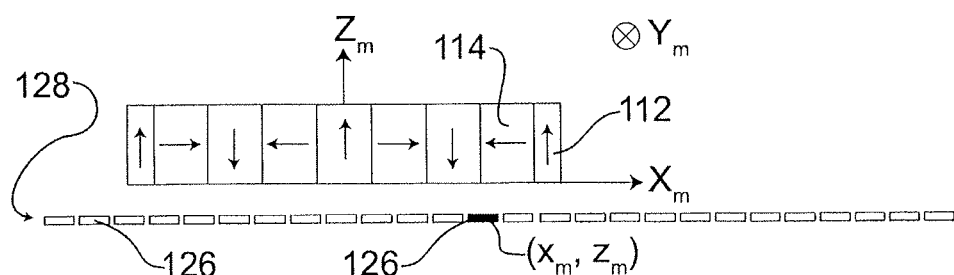
FIG. 12 is a schematic cross-sectional view showing one layer of coil traces and a single magnet array which are useful for describing the determination of current commutation.

FIG. 12 is a schematic cross-sectional view showing one layer 128 of coil traces 126 and a single Y-magnet array 112 which are useful for describing the determination of current commutation. The FIG. 12 magnet array 112 is a Y-magnet array 112 meaning that its magnetization segments 114 are generally linearly elongated in the Y-direction. FIG. 12 shows one active coil trace 126 (shown in black), with all other coil traces 126 (whether active or inactive) shown in white. FIG. 12 includes a coordinate frame $X_m$-$Y_m$-$Z_m$ fixed with magnet array 112, where the $Z_m$ axis origin is at the bottom surface of magnet array 112, the $X_m$ axis origin is in the center of magnet array 112. With these definitions, the magnet field in the space below the bottom surface of magnet array 112 can be modeled according to:

$$\begin{cases} B_z(x_m, z_m) = B_0 \cos\left(\frac{x_m}{\lambda_c}\right) e^{z_m/\lambda_c} \\ B_x(x_m, z_m) = -B_0 \sin\left(\frac{x_m}{\lambda_c}\right) e^{z_m/\lambda_c} \end{cases}$$

where $\lambda_c=\lambda/2\pi$ and $(x_m,z_m)$ is an arbitrary point in the space below the bottom surface of magnet array 112. Although magnet array 112 is finite in its X-axis width, its magnetic field can be modelled as if magnet array 112 is infinitely extended in the X-direction with the periodic magnetization pattern of magnetization segments 114 continuously repeated. Due to the field folding method used, this modelling assumption does not significantly impact the accuracy of the force calculations. As shown in FIG. 12, a coil trace 126 is located (i.e. centered) at $(x_m, z_m)$. Regardless of whether the position $(x_m, z_m)$ of this coil trace 126 is right under magnet array 112 or beyond the X-dimension edges of magnet array 112, we can excite this coil trace 126 for this magnet array 112 according to:

$$I = -kF_{ax} \cos\left(\frac{x_m}{\lambda_c}\right) e^{-\frac{z_m}{\lambda_c}} - kF_{az} \sin\left(\frac{x_m}{\lambda_c}\right) e^{-\frac{z_m}{\lambda_c}},$$

Where: I is a current in the trace 126 at the position $(x_m,z_m)$; $F_{ax}$ and $F_{az}$ represent the desired forces imparted on magnet array 112 in X and Z directions, respectively; k is an actuator constant coefficient; and the current reference direction (positive current direction) is consistent with $Y_m$ axis (i.e. if current flows into the page in FIG. 12 then I is positive). When all active current traces 126 for magnet array 112 are excited according to the above commutation law (of course, each trace 126 can have different current amplitude/direction, since each coil trace 126 has distinct spatial location), actuating forces imparted on magnet array 112 will be $F_{ax}$ and $F_{az}$. Coil traces 126 in the same lateral location (e.g. in the same X-axis location in FIG. 12), but different layers 128 can be either serially connected (i.e. having the same current) or individually controlled. When they are serially connected, the desired current amplitude for coil traces 126 in the same lateral location but in different layers 128 can be calculated based on the location of the coil trace 126 on the uppermost layer 128.

As discussed above, some magnet arrays 112 (e.g. the magnet arrays shown in FIGS. 8A-8L) comprise non-magnetic spacers 136. For such magnet arrays 112, determination of coil trace current can be done by assuming that non-magnetic spacer 136 is not present and by assuming that each side of the magnet array 112 is moved toward its center (i.e. toward Y-Z plane 118) by half the width g of spacer 136. This process is shown schematically in FIGS. 13A and 13B, where current commutation is calculated for the actual FIG. 13A magnet array 112 on the basis of the assumption that the FIG. 13A magnet array 112 has the properties of the FIG. 13B magnet array 112. With these assumptions, the inventors have determined that the actual resulting forces will not be equal to the calculated values $(F_{ax},F_{az})$, but will be scaled by a scaling factor (e.g. 95%) which may be fixed using suitable control algorithm(s) and/or the like. Such differences can be accommodated using suitable control techniques, such as setting the desired forces to be slightly larger than would be desired if spacer 136 was not present. As discussed above, spacer 136 has the benefit that it can reduce the effect of the $5^{th}$ order harmonic of the magnetic field of magnet array 112.

Sensor Systems

To accurately control the position of moveable stage 110 relative to stator 120 in displacement device 100 (e.g. to the precision desired for a typical lithography process and/or the like), it is desirable to know the relative positions of moveable stage 110 and stator 120. As discussed above, the forces imparted on moveable stage 110 depend on the relative spacing between coil traces 126 (on stator 120) and magnetic arrays 112 (on moveable stage 110). An issue which can give rise to difficulty for determining these relative positions is motion of stator 120 which can be generated by ground vibration, by reaction forces on stator 120 and/or the like. FIG. 14A schematically illustrates one embodiment of a sensing system 200 for separately measuring the positions of moveable stage 110 and stator 120 relative to a metrology frame 202. In the illustrated embodiment, stator 120 is supported by a stator frame 204 (which may be supported by the ground or by another vibration isolation system (not shown)) and moveable stage 110 is floating above stator 120 under the influence of actuating forces caused by the interaction of magnet arrays and current carrying coil traces as discussed above. Stator frame 204 can provide mechanical support and thermal cooling for the coil assembly of stator 120.

Metrology frame 202 is supported by one or more vibration isolation mechanisms 206, which may be passive or active vibration isolation mechanisms 206, such as springs, air cylinders, air bearings and/or the like. Vibration isolation mechanisms 206 isolate metrology frame 202 from ground isolation. Metrology frame 202 may also be fabricated from suitable materials (e.g. thermally and mechanically stable materials). In the illustrated embodiment, metrology frame 202 provides a stable position reference for independently measuring the positions of both moveable stage 110 and stator 120 relative to the stable metrology frame 202. In the FIG. 14A view, Xm1, Zm1, Zm2 represent a number of the coordinates of the position of moveable stage 110 with respect to metrology frame 202. Although three dimensions of the relative position are shown in the FIG. 14A view, it should be understood that there may actually be 6 or more axis measurements associated with the position of moveable stage 110 relative to metrology frame 202. Any suitable position sensing devices may be used to determine these measurements. Non-limiting examples of suitable position sensors include: laser displacement interferometers, two-dimensional optical encoders, laser triangulation sensors, capacitive displacement sensors and/or the like.

Xs1, Zs2, and Zs2 shown in FIG. 14A represent coordinates of the position of stator frame 204 with respect to metrology frame 202. Although three dimensions of the relative position are shown in the FIG. 14A view, it should be understood that there may actually be 6 or more axis measurements associated with the position of stator frame 204 relative to metrology frame 202. Because the position of stator frame 204 relative to metrology frame 202 has only a small amount of variation, many low-cost and short-stroke position sensing devices are sufficient for measuring the position of stator frame 204. Non-limiting examples of suitable positions sensors include: capacitive displacement sensors, eddy current displacement sensors, optical encoders, laser triangulation sensors and/or the like. It will be appreciated that while the position of stator frame 204 may not be exactly known due to manufacturing errors, thermal loading and/or the like, these factors cause DC or low-frequency uncertainties in measurement of the position of stator frame 204 relative to metrology frame 202 and may be overcome by controlling the position of moveable stage 110 using a control scheme having sufficiently high gain at low frequencies (e.g. an integrating control element by way of non-limiting example to effectively attenuate these uncertainties. That is, a control scheme can be designed such that the position of moveable stage 110 is adjusted at a rate much faster than the low frequency uncertainties associated with the measurement of the position of stator frame 204. AC or relatively high frequency components of the position of stator frame 204 are more important. It is therefore desirable to measure these high frequency components using position sensors of suitably high bandwidth.

FIG. 14B shows another embodiment of a sensor system 220 for measuring a position of moveable stage 110. In the illustrated embodiment, moveable stage 110 comprises: a plurality of magnet arrays 112, a moving stage structure 226 and one or more sensor targets 224. Conveniently, one or more sensor targets 224 may be located in the space 230 (see FIG. 1B) between magnet arrays 112. Stator frame 204 comprises one or more sensor read heads 222. These heads 222 may be installed inside holes in the coil assembly of stator 120. Sensor heads 222 may interact optically, electrically, electromagnetically and/or the like with sensor targets 224 to measure the relative position of moving stage 110 relative to stator frame 204. By way of non-limiting example: sensor targets 224 may comprise optical two-dimensional grating plates and sensor heads 222 may comprise optical encoder read heads; sensor targets 224 may comprise conductive plates with two dimensional grid features and sensor heads 222 can comprise capacitive displacement measurement probes; sensor targets 224 can comprise reflective surfaces suitable for interferometry and sensor heads 222 may comprise laser interferometry heads; and/or the like.

Different position sensing techniques can be combined to provide an overall system. It will be appreciated that sensor heads 222 could be located on moveable stage 110 and sensor targets 224 could be located on stator frame 204. Also, in the FIG. 14B embodiment, the position of moveable stage 110 is measured relative to stator frame 204. In some embodiments, the same types of sensor targets 224 and sensor heads 222 could be located on moveable stage 110 and on a metrology frame 202 to measure the position of moveable stage 110 relative to metrology frame 202 in a system similar to that of FIG. 14A. Still further, it will be appreciated that FIG. 14B only shows the measurement of one or several dimensions, but other dimensions may be measured using similar techniques.

Figure 14C:
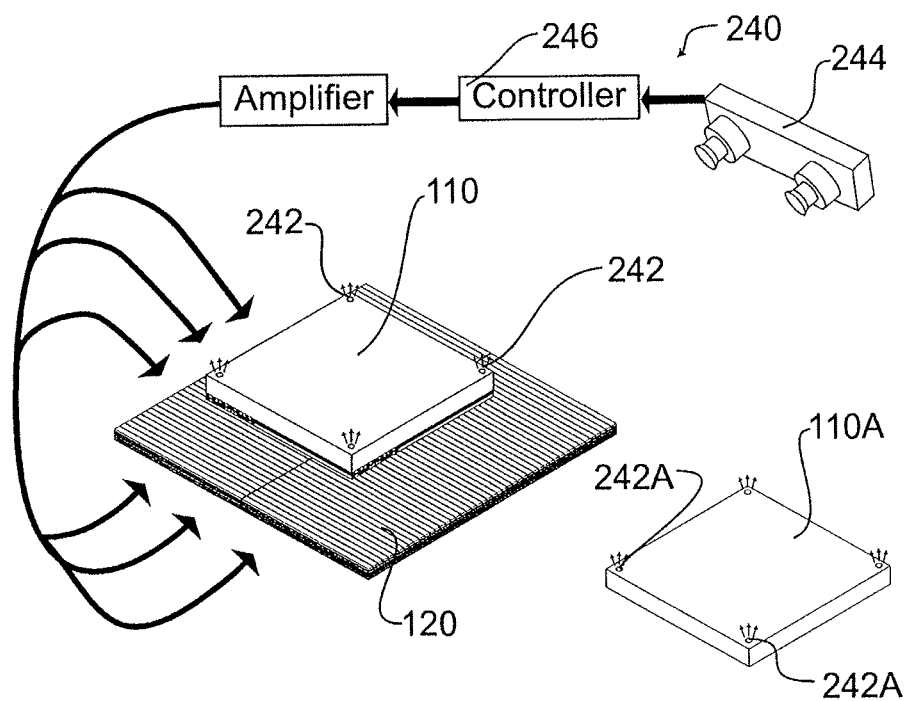

FIG. 14C shows another embodiment of a sensor system 240 suitable for use with the FIG. 1 displacement device 100. Moveable stage 110 is provided with a plurality of identifiable markers 242 (such as light emitting diodes (LEDs), reflective marker surfaces and/or the like, for example). A stereo camera 244 can acquire images of these markers 242 and, from the image locations of these markers 242, a suitably programmed controller 246 can determine the spatial positions of these markers 242 relative to stereo camera 244. The FIG. 14C embodiment shows that multiple moveable stages (e.g. moveable stage 110 and second moveable stage 110A having markers 242A) can be sensed using the same camera 244 and controller 246. Accordingly, system 240 can measure the relative position between two moveable stages 120. It will be appreciated by those skilled in the art that suitable markers can also be located on stator frame 204 to obtain the positions of the moveable stages referenced to stator frame 204.

It will be appreciated that the above described sensor systems have their own advantages and disadvantages, such as cost, measurement range/volume, resolution, accuracy, incremental or absolute position, sensitivity to line-of-sight block. Two or more of the above described sensor systems can be combined to achieve desired performance characteristics.

Motion Control

Figure 15:
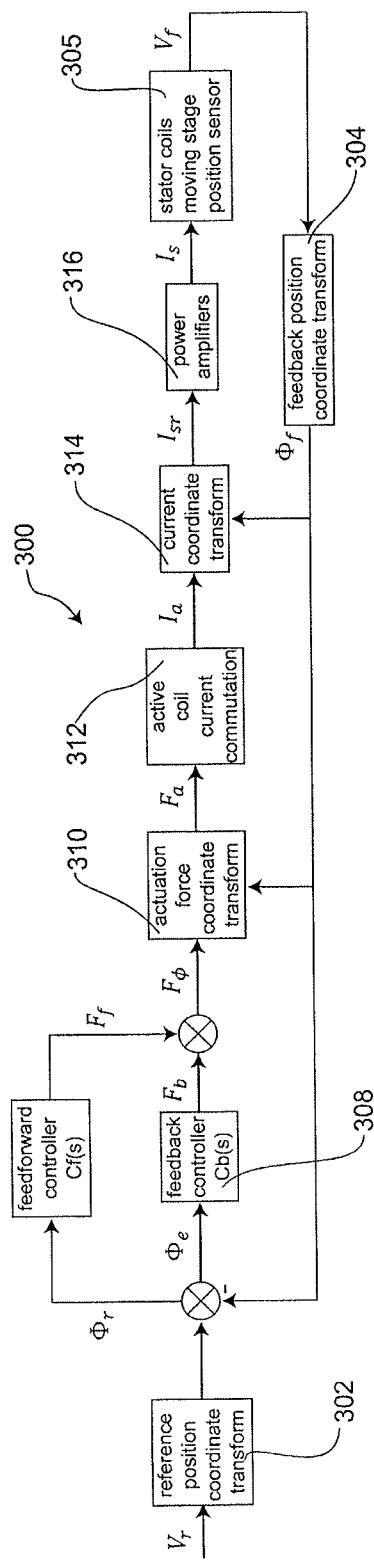
FIG. 15 shows a schematic block diagram of a control system suitable for use in controlling the FIG. 1 displacement device.

FIG. 15 shows a schematic block diagram of a control system 300 suitable for use in controlling the FIG. 1 displacement device 100. Control system 300 may be implemented by a suitable programmed controller (not expressly shown). Such a controller (and components thereof) may comprise hardware, software, firmware or any combination thereof. For example, such a controller may be implemented on a programmed computer system comprising one or more processors, user input apparatus, displays and/or the like. Such a controller may be implemented as an embedded system with a suitable user interface comprising one or more processors, user input apparatus, displays and/or the like. Processors may comprise microprocessors, digital signal processors, graphics processors, field programmable gate arrays, and/or the like. Components of the controller may be combined or subdivided, and components of the controller may comprise sub-components shared with other components of the controller. Components of the controller, may be physically remote from one another. The controller is configured to control one or more amplifiers (not expressly shown) to drive current in coil traces 126 and to thereby controllably move moveable stage 110 relative to stator 120.

In the schematic diagram of FIG. 15, $V_r$ represents the reference motion command signals which define the trajectory of moveable stage 110 desired by the application process. $V_r$ is typically a vector, prescribing the desired trajectory for moveable stage 110 in a manner which comprises multiple degrees of freedom. Such multiple degrees of freedom may include states corresponding to rigid body motion and/or vibration mode motion. As $V_r$ is defined by a specific application process and from the application process point of view, $V_r$ is not necessarily in the form desired for defining the motion of the center of gravity of moveable stage 110 and/or the vibration mode coordinate format. For example, $V_r$ may specify the motion of a point on a wafer surface in a photolithography application where the wafer is installed on top of moveable stage 110, instead of specifying the motion of the center of gravity of moveable stage 110. In such cases, $V_r$ may be converted to a corresponding vector $\Phi_r$, defined in a modal coordinate frame of reference, via reference position coordinate transform block 302.

The vector $\Phi_r$ may comprise, for example:

$$\Phi_r = \begin{bmatrix} q_{r1} \\ q_{r2} \\ q_{r3} \\ q_{r4} \\ q_{r5} \\ q_{r6} \\ q_{r7} \\ q_{r8} \end{bmatrix}$$

where $q_{r1}, \ldots q_{r6}$ represent desired (reference) motion values for 6 states which define rigid body motion (e.g. 3 translational states and 3 rotational states) and $q_{r7}$, $q_{r8}$ represent reference values for two flexible vibration mode states. It will be appreciated that some embodiments may use different numbers of rigid body states and/or flexible mode states.

In the schematic diagram of FIG. 15, $V_f$ represents the outputs of position feedback sensors 305 which includes information relating to the measured position of moveable stage 110. Typically, $V_f$ will also be converted into a motion vector $\Phi_f$ in the modal coordinate frame via a feedback position coordinate transform block 304. The vector $\Phi_f$ may comprise, for example:

$$\Phi_f = \begin{bmatrix} q_{f1} \\ q_{f2} \\ q_{f3} \\ q_{f4} \\ q_{f5} \\ q_{f6} \\ q_{f7} \\ q_{f8} \end{bmatrix}$$

where $q_{f1}, \ldots, q_{f6}$ represents feedback values (e.g. feedback position values) for the 6 states which define rigid body motion (e.g. 3 translational states and 3 rotational states) and $q_{f7}$, $q_{f8}$ represent feedback values for two flexible vibration mode states.

With $\Phi_r$ as inputs, a feedforward control force/torque vector $F_f$ (modal domain force/torque) may be calculated by a feedforward motion controller 306. With $\Phi_e = \Phi_r - \Phi_f$ as inputs, a feedback control force/torque vector $F_b$ (modal domain force/torque) may be calculated by a feedback motion controller 308. The total modal domain force/torque vector is calculated as $F_\phi = F_f + F_b$. An actuator force coordinate transform block 310 may be used to convert the modal domain force/torque vector $F_\phi$ into force commands $F_a$ for each magnet array 112. For each magnet array, its corresponding active coil current vector $I_a$ (including current values for each trace) can be calculated from $F_a$ according to an active coil current commutation algorithm performed by block 312, as discussed above. According to the position $\Phi_f$ of moving stage 110, a current coordinate transform may be performed by block 314 to determine the coil trace reference current $I_{sr}$ for each group of stator coil traces 126. For each group of coil traces 126, this reference current $I_{sr}$ will be: zero (inactive); or the active coil current $I_a$ for a particular magnet array 112; or the combination of the currents for active coils currents for a plurality of magnet arrays 112. The stator coil reference current commands $I_{sr}$ may be provided to power amplifiers 316 to drive moveable stage 110, and the actual stator coil currents provided by amplifiers 316 is represented by $I_s$.

All 6 (or even more) degrees-of-freedom of moveable stage 110 may be measured for optimum motion control of moveable stage 110. However, in certain situations, some of the sensors or part of a sensor may fail or become dysfunctional, or for cost-related reasons, there may be fewer sensors installed at certain space within the working volume of moveable stage 110. These are examples of circumstances in which not all 6 degrees of positional freedom of moveable stage 110 are measured and which may be referred to as under-sensing. Some embodiments provide a motion control method for control of moveable stage 110 in under-sensed circumstances. When the sensor system does not provide measurement in the Z-direction (i.e. the levitating direction), the Z-component of the desired force for each magnet array 112 may be set at a constant level, for example, the Z-component of the force on each magnet array 112 may be set to a fraction of the gravitational force on moveable stage 110. Further, the above-described commutation equation may be changed to:

$$I = -kF_{ax}\cos\left(\frac{x_m}{\lambda_c}\right)e^{-\frac{z_0}{\lambda_c}} - kF_{az}\sin\left(\frac{x_m}{\lambda_c}\right)e^{-\frac{z_0}{\lambda_c}},$$

where a nominal constant vertical position $z_0$ is used for each magnet array 112 instead of the actual relative height of the magnet array 112 above the coil traces 126, where the nominal constant vertical position $z_o$ is the nominal position of the coil traces 126 in the coordinate frame of the moveable stage. For example, in some embodiments, $z_o$=−1 mm. Due to the fact that the Z-direction (levitation) force increases when the height of the magnet array 112 above the coil traces 126 decreases, a constant value of $z_0$ will result in a passive levitating effect. This passive levitating effect may be relatively more susceptible to external forces than active control of the Z-direction of moveable stage 110, but this passive levitating effect can still ensure that moveable stage 110 is floating above stator 120 without mechanical contact. By way of non-limiting example, this passive Z-direction control strategy is useful when it is desired to move moveable stage 110 within a non-critical working zone, for lower cost applications, for application which are otherwise more tolerant to positional uncertainty and/or the like.

A special case under-sensed scenario may occur where sensed position measurement of moveable stage 110 is only available for the X and Y translational position and for the rotational degree of freedom around Z. In this case, the above-described passive control mechanism can ensure stability in the Z translation direction, rotation around the X axis and rotation around the Y axis.

Multiple Moveable Stages

In certain applications, such as photo-lithography, automated assembly systems and/or the like, there can be a desire to simultaneously and independently control more than one moveable stage. This may be achieved, for example, by providing a corresponding plurality of independently controllable stators and controlling the movement of one moveable stage on each stator. In some circumstances, it is desirable to interchange the moveable stages (e.g. to move a moveable stage from one stator to another stator).

Figure 16A:
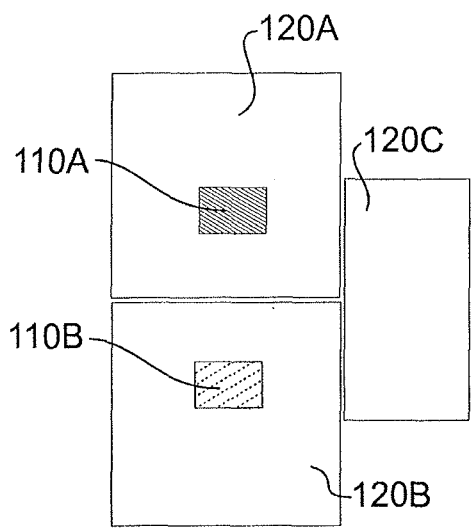
FIGS. 16A-16D schematically depict a technique for interchanging moveable stages between multiple stators according to one embodiment of the invention.
Figure 16B:
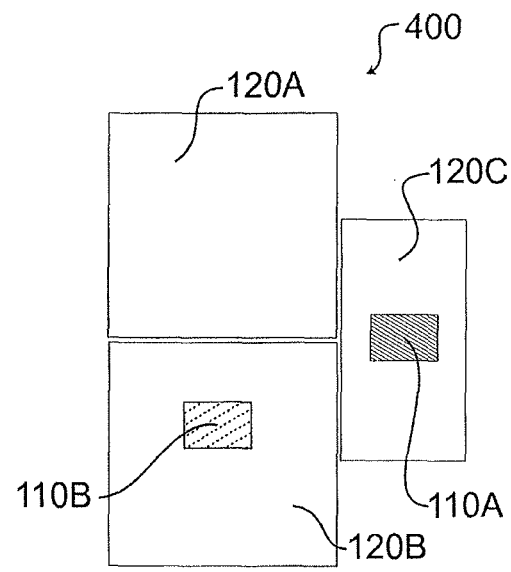
Figure 16C:
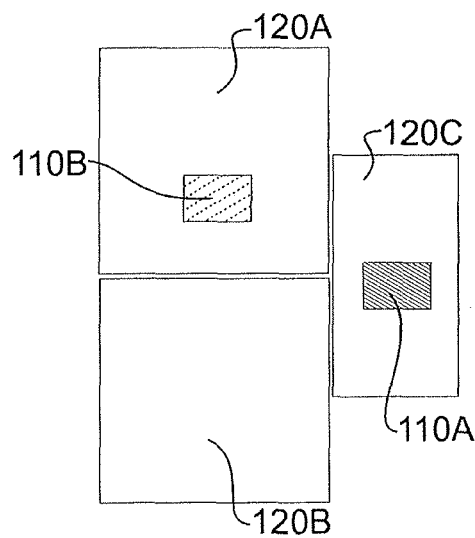
Figure 16D:
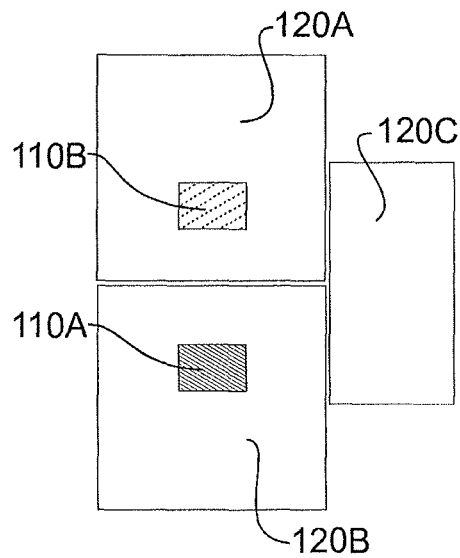

FIGS. 16A-16D schematically depict a method 400 for interchanging moveable stages 110 between multiple stators 120 according to one embodiment of the invention. More particularly, method 400 involves the movement of moveable stage 110A from stator 120A to stator 120B and moveable stage 110B from stator 120B to stator 120A. Method 400 involves the use of at least one intermediate stator 120C. In FIG. 16A, moveable stages 110A and 110B are shown operating on their respective stators 120A, 120B. In FIG. 16B, moveable stage 110A is moved from stator 120A to intermediate stator 120C. In FIG. 16C, moveable stage 110B is moved from stator 120B to stator 120A. In FIG. 16D, moveable stage 110A is moved from intermediate stator 120C to stator 120B.

Figure 17A:
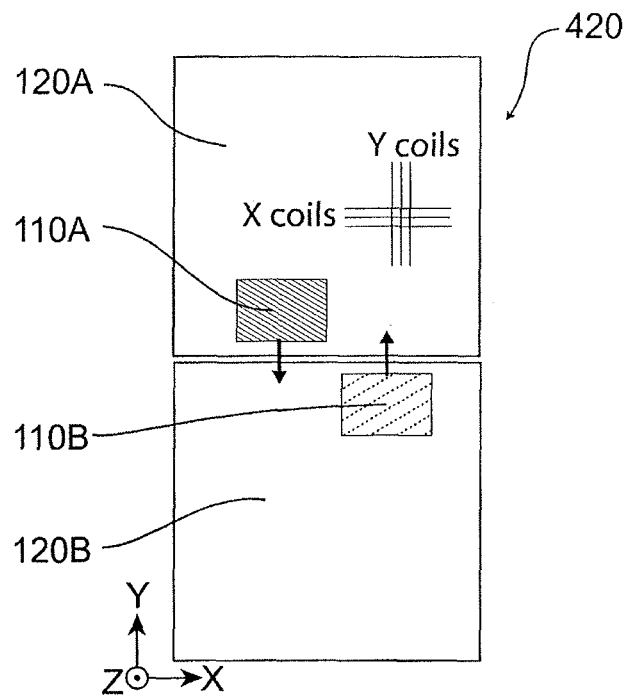
FIG. 17A schematically depicts a technique for interchanging moveable stages between multiple stators according to another embodiment of the invention.

FIG. 17A schematically depicts a method 420 for interchanging moveable stages 110 between multiple stators 120 according to another embodiment of the invention. Stators 102A, 120B are independently controlled. In an initial stage of method 420, moveable stage 110A works on stator 120A and moveable stage 110B works on stator 120B, concurrently and independently. To swap stators, moveable stage 110A and moveable stage 110B can be caused to move in the arrows shown in FIG. 17A. This movement imparts momentum on moveable stages 110A, 110B. When the two moveable stages 110A, 110B (or more precisely their corresponding X-magnet arrays 112) overlap along the X-direction (i.e. when some X-oriented coil traces extend under X-magnet arrays 112 of both moveable stages 110A, 110B), then the "shared" X-oriented coil traces (or all of the X-oriented coil traces) can be turned off, while desired Y-oriented coil traces remain active. Due to the over-actuation discussed above, the system may still actively control the motion of moveable stages 110A, 110B with 5 degrees of freedom (with Y-direction translation being the only uncontrolled motion). Because of their Y-direction momentum, the two moveable stages 110A, 110B can smoothly pass one another without touching or bumping into each other. It should be noted that the meeting location of two stages 110A, 110B is not necessarily at the borders of two stators 120A, 120B. In general this meeting location can be anywhere on any stator 120A, 120B or between the two stators 120A, 120B.

Figure 17B:
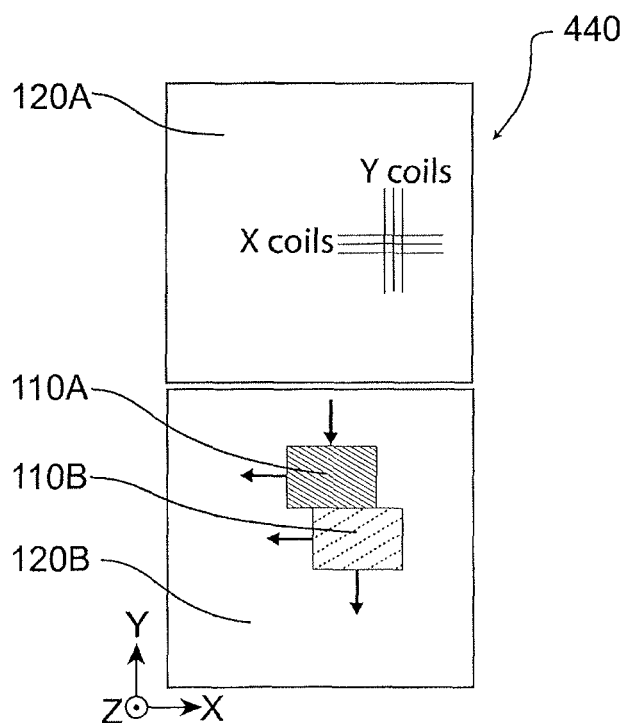
FIG. 17B schematically depicts how two moveable stages can be controlled with six degrees of freedom on one stator.

FIG. 17B schematically depicts how two moveable stages 110A, 110B can be controlled with six degrees of freedom of motion for each moveable stage on one stator 120. In the FIG. 17B embodiment, the two moveable stages 110A, 110B (or, more precisely, their corresponding magnet arrays 112) have non-overlapping locations in the X-direction and partially overlapping locations in the Y-direction. Accordingly, with the illustrated configuration, the X-oriented coil traces for moveable stages 110A, 110B can be independently activated, but moveable stages 110A, 110B (or more precisely the magnet arrays 112 of moveable stages 110A, 110B) share a number of Y-oriented coil traces. However, with the configuration shown in FIG. 17B, there are also a number of Y-oriented coil traces that only extend under one or more magnet arrays 112 of moveable stage 110A and a number of Y-oriented coil traces that only extend under one or more magnet arrays 112 of moveable stage 110B. The "shared" Y-oriented coil traces can be de-activated, but with the active X-oriented coil traces and at least some independently controllable Y-oriented coil traces, moveable stages 110A, 110B can still be independently controlled with 6 degree-of-freedom. In the illustrated configuration of FIG. 17B, moveable stages 110A, 110B are shown immediately adjacent one another in the Y-direction. While this configuration is possible, it is not necessary and moveable stages 110A, 110B can be spaced apart in the Y-direction. Further, in FIG. 17B, moveable stages 110A, 110B (or more precisely their magnet arrays 112) are shown at partially overlapping locations in the Y-direction, but moveable stages 110A, 110B (or more precisely their magnet arrays 112) could also be independently controlled if they were spaced apart from one another in the X-direction (i.e. completely non-overlapping in the Y-direction). The moveable stages in FIG. 17B could be made to pass one another in the X-direction and/or the Y-direction using the technique described above in FIG. 17A—e.g. moveable stage 110A could be moved to the right (in the illustrated view) of moveable stage 110B or moveable stage 110A could be moved below (in the illustrated view) moveable stage 110B. It will be appreciated that an analogous situation could occur with the two moveable stages 110A, 110B (or more precisely their magnet arrays 112) have non-overlapping locations in the Y-direction and partially overlapping (or non-overlapping) locations in the X-direction.

Figure 18:
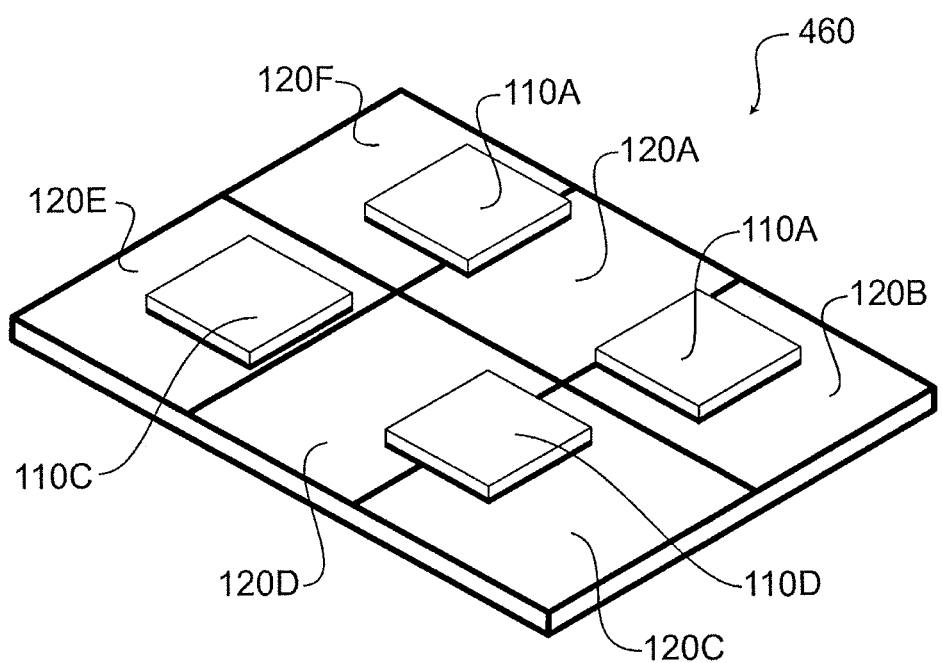
FIG. 18 schematically illustrates an apparatus for moving a plurality of moveable stages through a plurality of different stages.

In some applications, it may be desirable to move moveable stages 110 through a number of different stages. FIG. 18 schematically illustrates an apparatus 460 suitable for this purpose. In the illustrated embodiment, moveable stages 110A-110D move between several stators 120A-120F and, in some applications, may stop at each stator 120 for some operation. In general, there may be any suitable number of moveable stages 110 and any suitable number (greater than the number of moveable stages 110) of stators 120. On each stator 120A-120F, a motion control system of the type described herein may be used to control positions of the corresponding moveable stage 110A-110D. In some embodiments, precision position control may only be required inside stators 120A-120F. Consequently, stator-to-stator motion may be guided by relatively inexpensive positions measurement systems, such as indoor GPS, stereo camera and/or the like.

Rotary Displacement Device

Figure 19A:
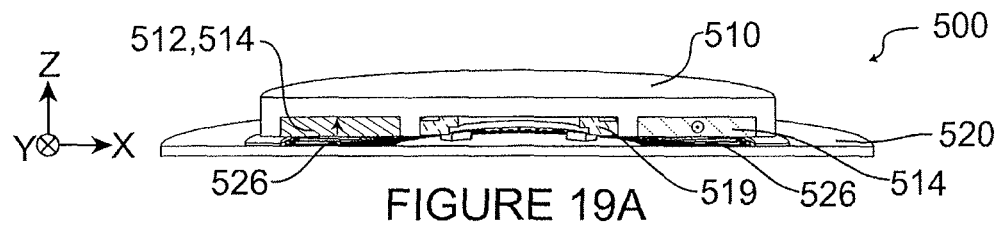
FIG. 19A is a horizontal cross-sectional view of a rotary displacement device according to an embodiment of the invention.
Figure 19B:
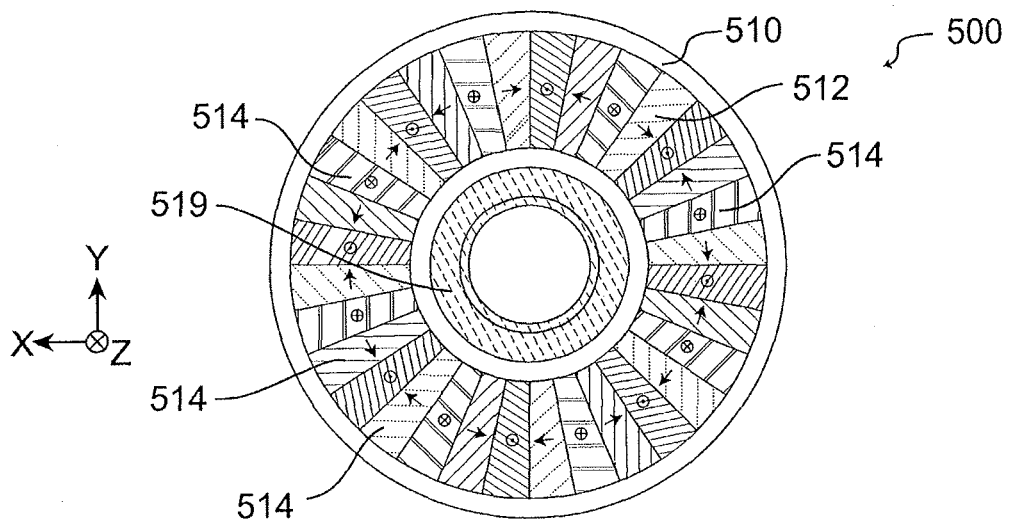
FIGS. 19B and 19C respectively depict a bottom cross-sectional view of the moveable stage (rotor) of the FIG. 19A displacement device and a top view of the stator of the FIG. 19A displacement device.
Figure 19C:
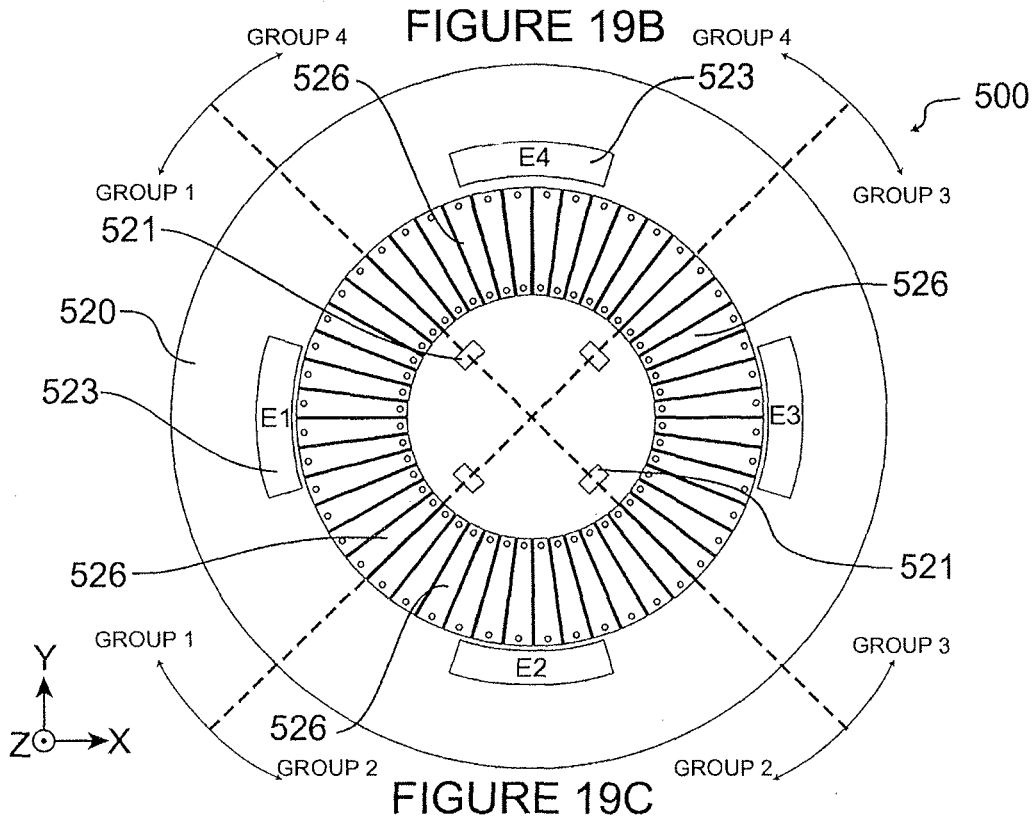

There is industrial demand for rotary displacement devices which have some Z-direction motion (e.g. on the scale of millimeters) together with rotary motion about the Z-axis. FIG. 19A is a horizontal cross-sectional view of a rotary displacement device 500 according to an embodiment of the invention. FIGS. 19B and 19C respectively depict a bottom cross-sectional view of the moveable stage (rotor) 510 of displacement device 500 and a top view of the stator 520 of displacement device 500. As can be seen best from FIG. 19B, moveable stage 510 comprises a magnet array 512 having magnetization segments 514 which are elongated in radial directions and which have circumferentially oriented magnetization directions. As is the case with the XY moveable stages discussed above, the orientation of the magnetization directions of magnetization segments 514 are generally orthogonal to the directions in which they are longitudinally extended—i.e. in the case of rotary displacement device 500, the circumferential orientation of magnetization directions of magnetization segments 514 is generally orthogonal to the directions (radial) in which magnetization segments 514 are physically elongated.

In the illustrated embodiment, magnet array 512 has an angular spatial magnetization period $\lambda$. In some embodiments, the number of spatial magnetic periods $\lambda$ in magnet array 512 is a positive integer number $N_m$. In the particular case of the illustrated embodiment, $N_m=8$, so the angle subtended by each spatial magnetic period is $\lambda=360°/8=45°$. In other embodiments, $N_m$ can have a different value. In some embodiments, magnet array 512 may comprise a non-integer number of spatial magnetic periods $\lambda$. By way of non-limiting example, in some embodiments magnet array 512 could comprise $(N_m+0.5)\lambda$ spatial magnetic periods. As is the case with the XY embodiments described herein, the width of each magnetization segment 514 is a function of the number $N_t$ of magnetization directions in a full spatial magnetic period $\lambda$. In the case of the illustrated embodiment, $N_t=4$ and so the angular width of each magnetization segment 514 is $\lambda/N_t=\lambda/4=11.25°$. In some embodiments, $N_t$ can have a different value.

FIG. 19C shows how stator 520 comprises plurality of radially oriented coil traces 526. It will be appreciated that current travelling radially in coil traces 526 is capable of imparting force on magnet array 112 in both circumferential directions (e.g. directions having X and/or Y components) and in the Z-direction. In the particular case of the illustrated embodiment, coil traces 526 are divided into a plurality (e.g. four) of groups (labeled Groups 1-4) and shown delineated by dashed lines. Because of the geometrical location of the groups of coil traces 526, coil traces 526 in Groups 1 and 3 impart Z-direction and primarily Y-direction forces on magnet array 512, while coil traces in Groups 2 and 4 impart Z-direction and primarily X-direction forces on magnet array 512. The Z-direction forces can be controlled to generate Z-direction translation as well as rotation about the X and Y axes. The X and Y-direction forces can be controlled to generate torques (and corresponding rotation) about the Z-axis and can also be controlled to generate X and Y translation (if desired). Accordingly, with suitable control of current in coil traces 526, moveable stage 510 of displacement device 500 can be precisely controlled as a rotary displacement device, but can also be controlled with all six degrees of freedom. It will be appreciated that the particular grouping of coil traces 526 shown in FIGS. 19A-C represents only one possible embodiment. As is the case with any of the XY embodiments described herein, each coil trace 526 may be individually controlled for maximum flexibility. Also, different grouping arrangements of coil traces 526 may also be provided. Coil traces 526 may be connected serially or in parallel to achieve various design objectives.

In the illustrated embodiment, stator 520 comprises a plurality (e.g. four) sensor heads 521 which interact with one or more corresponding sensor targets 519 on moveable stage 510 to measure or otherwise sense rotary orientation of moveable stage 510 about the Z-axis and X and Y translational positions of moveable stage 510. In one particular embodiment, sensor heads 521 comprise encoder read heads and sensor target 519 comprises an encoder disk. In the illustrated embodiment, stator 520 also comprises a plurality (e.g. four) capacitive sensors 523 which can be used to measure or otherwise detect the Z-direction height of moveable stage 510 relative to stator 520 and the rotational orientation of moveable stage 510 about the X and Y axes. It will be appreciated that the sensors shown in the particular embodiment of FIG. 19 represent only one particular embodiment of a suitable sensor system which may be used with a rotary displacement device, such as rotary displacement device 500 and that other sensing systems could be used.

Figure 19D:
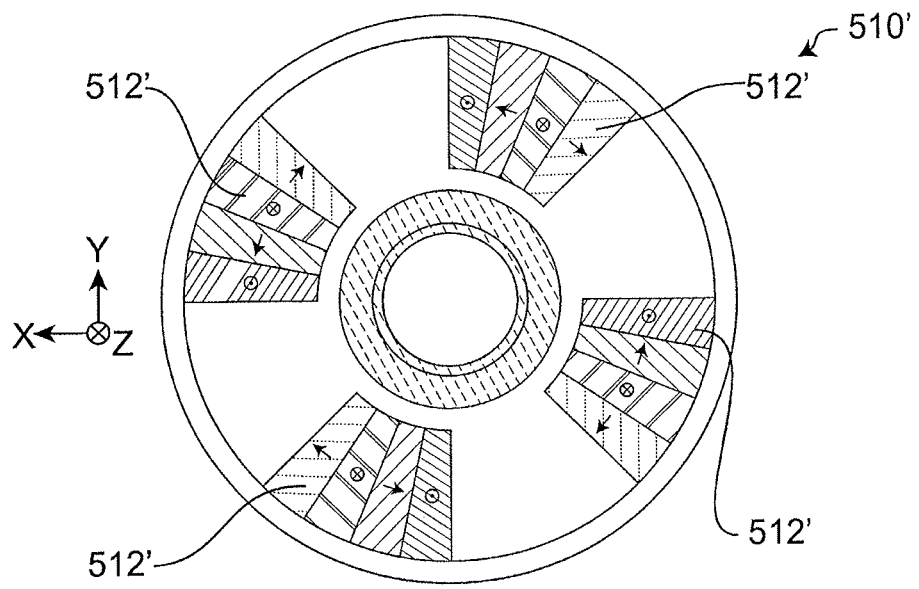
FIG. 19D is a bottom cross-sectional view of a moveable stage (rotor) according to another embodiment which may be used with the FIG. 19A displacement device.

FIG. 19D is a bottom cross-sectional view of a moveable stage (rotor) 510' according to another embodiment which may be used with displacement device 500 (i.e. in the place of moveable stage 510. Moveable stage 510' differs from moveable stage 510 in that moveable stage 510' comprises a plurality of angularly spaced apart magnet arrays 512'. In the case of the illustrated embodiment, moveable stage 510' comprises four magnet arrays 512'. Each magnet array 512' has an angular spatial magnetization period $\lambda$. In some embodiments, the number of spatial magnetic periods $\lambda$ in each magnet array 512' is a positive integer number $N_m$, such that the angle subtended by each array is $W_m=N_m\lambda$. In the particular case of the FIG. 19D embodiment, $N_m=1$. In some embodiments, $N_m$ can have a different value. In some embodiments, the angle subtended by each array 512 is $W_m=(N_m+0.5)\lambda$ where $N_m$ is a non-negative integer. As is the case with the XY embodiments described herein, the width of each magnetization segment 514 is a function of the number $N_t$ of magnetization directions in a full spatial magnetic period $\lambda$. In the case of the illustrated embodiment, $N_t=4$ and so the angular width of each magnetization segment 514 is $\lambda/N_t=\lambda/4$. In some embodiments, $N_t$ can have a different value. In some embodiments, magnet arrays 512 can comprise magnetization segments 514 having angular widths of $\lambda/2N_t$. As in the case of the XY embodiments described above, such "half-width" magnetization segments 514 having angular widths $\lambda/2N_t$ may be provided at the edges of magnet array 512, although this is not necessary and such half-width magnetization segments can be used at other locations.

Figure 19E:
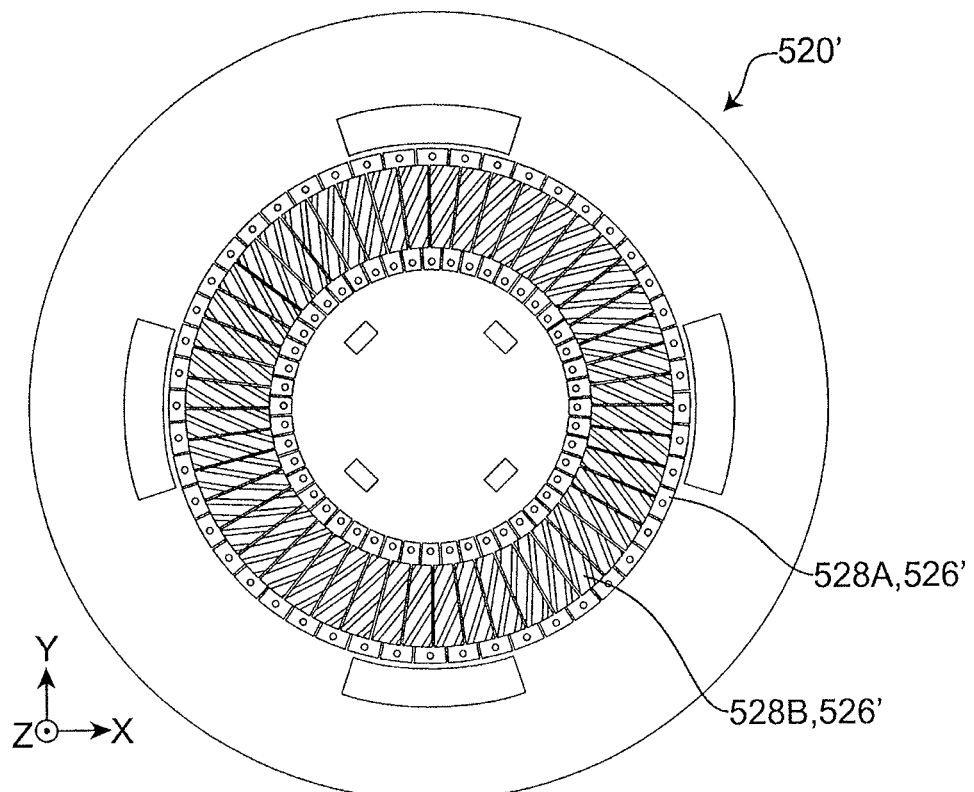
FIG. 19E is a top view of a stator according to another embodiment which may be used with the FIG. 19A displacement device.

FIG. 19E is a top view of a stator 520' according to another embodiment which may be used with displacement device 500 (i.e. in the place of stator 520). Stator 520' differs from stator 520 in that stator 520' comprises a plurality of layers 528A, 528B (e.g. two in the case of the illustrated embodiment) of coil traces 526' wherein the coil traces 526' in adjacent layers 528A, 528B are spatially (angularly) offset from one another by an offset angle $O_L$. In some embodiments, the offset angle $O_L$ can be set at least approximately to $$\pm \frac{\lambda}{10} + \frac{K\lambda}{5},$$

where K is an integer number. When the offset angle $O_L$ exhibits this property, this offset can tend to cancel force/torque ripples which may be caused by the fifth order harmonic magnetic fields of magnet arrays 512. It should be noted that both the moveable stage 510' of FIG. 19D and the stator 520' of FIG. 19E can be used at the same time.

Other Layouts and Configurations

Figure 20A:
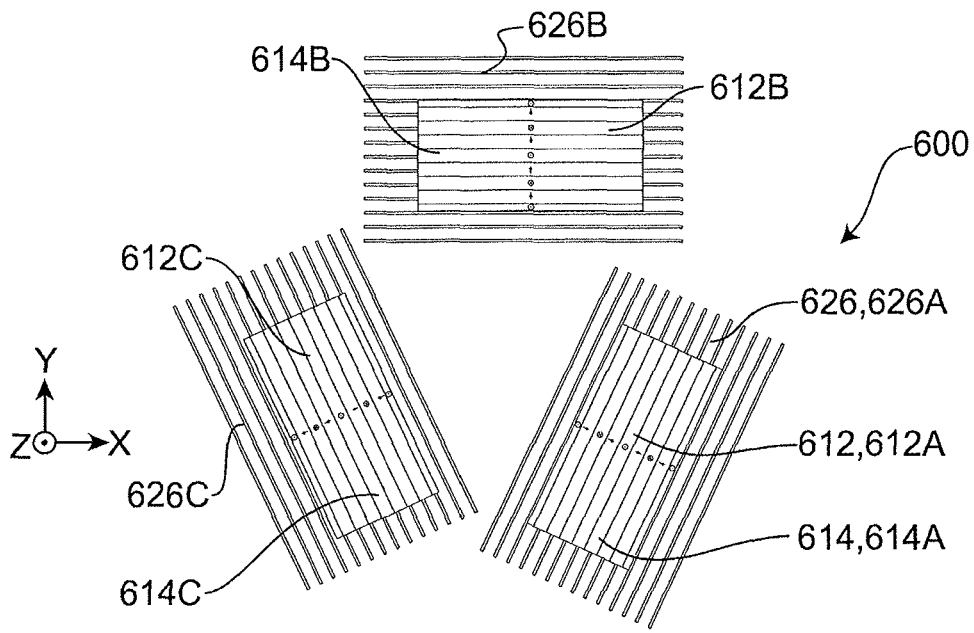
FIGS. 20A-20C schematically depict displacement devices according to other embodiments having different relative orientations of coil traces and magnet arrays.

FIG. 20A schematically depicts a displacement device 600 according to another embodiment. Displacement device 600 comprises a moveable stage (not explicitly shown) which comprises a plurality of magnet arrays 612. In the illustrated embodiment, displacement device 600 comprise three magnet arrays 612 (labeled 612A, 612B, 612C). Each magnet array 612A, 612B, 612C comprises a corresponding plurality of magnetization segments 614A, 614B, 614C which are generally linearly elongated at a particular orientation in the X-Y plane—for example, magnetization segments 614A of magnet array 612A have one orientation of linear elongation, magnetization segments 614B of magnet array 612B have a second orientation of linear elongation and magnetization segments 614C of magnet array 612C have a third orientation of linear elongation. As is the case with the other displacement devices described herein, the magnetization directions of magnetization segments 614A, 614B, 614C may be generally orthogonal to the direction that they are physically elongated. Other than for their relative orientations, the characteristics of magnet arrays 612 and magnetization segments 614 may be similar to those discussed above for magnet arrays 112 and magnetization segments 114.

Displacement device 600 also comprises a stator (not explicitly shown) that comprises a plurality of generally linearly elongated coil traces 626. In the illustrated embodiment, displacement device 600 comprise three sets of coil traces 626 (labeled 626A, 626B, 626C) which may be located on corresponding layers (not explicitly shown) of the stator. Each layer of coil traces 626A, 626B, 626C may comprise coil traces 626A, 626B, 626C that are generally linearly elongated at a particular orientation in a corresponding X-Y plane. Such layers and their corresponding coil traces 626A, 626B, 626C may overlap one another (in the Z-direction) in the working region of displacement device 600. Other than for their relative orientations, the characteristics of coil traces 626 may be similar to those of coil traces 126 discussed above.

Figure 20B:
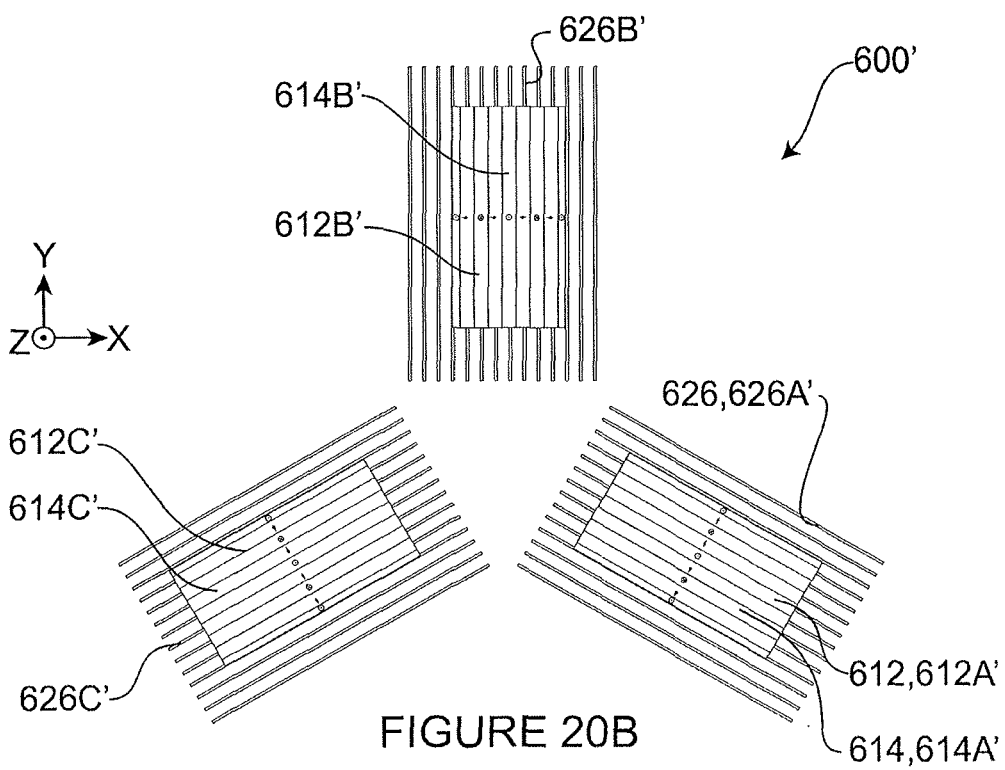

Displacement device 600' shown in FIG. 20B is similar to displacement device 600, except that the orientations of the linearly elongated coil traces 626A', 626B', 626C' are different than the orientations of the linearly elongated traces 626A, 626B, 626C and the orientations at which magnetization segments 614A', 614B' and 614C' extend are different than the orientations at which magnetization segments 614A, 614B, 614C extend.

Figure 20C:
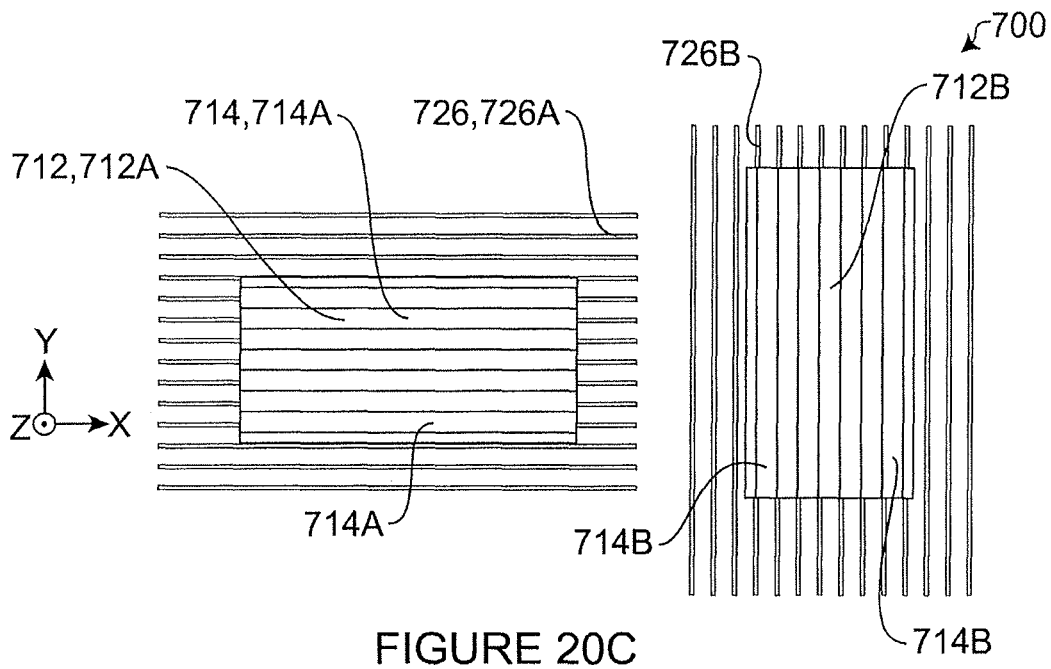

FIG. 20C schematically depicts a displacement device 700 according to another embodiment. Displacement device 700 comprises a moveable stage (not explicitly shown) which comprises a plurality of magnet arrays 712. In the illustrated embodiment, displacement device 700 comprises two magnet arrays 712 (labeled 712A, 712B). Each magnet array 712A, 712B comprises a corresponding plurality of magnetization segments 714A, 714B which are generally linearly elongated at a particular orientation in the X-Y plane—for example, magnetization segments 714A of magnet array 712A have one orientation of linear elongation and magnetization segments 714B of magnet array 712B have a second orientation of linear elongation. As is the case with the other displacement devices described herein, the magnetization directions of magnetization segments 714A, 714B may be generally orthogonal to the direction that they are physically elongated. Other than for their relative orientations, the characteristics of magnet arrays 712 and magnetization segments 714 may be similar to those discussed above for magnet arrays 112 and magnetization segments 114.

Displacement device 700 also comprises a stator (not explicitly shown) that comprises a plurality of generally linearly elongated coil traces 726. In the illustrated embodiment, displacement device 700 comprise two sets of coil traces 726 (labeled 726A, 726B) which may be located on corresponding layers (not explicitly shown) of the stator. Each layer of coil traces 726A, 726B may comprise coil traces 726A, 726B that are generally linearly elongated at a particular orientation in a corresponding X-Y plane. Such layers and their corresponding coil traces 726A, 726B may overlap one another (in the Z-direction) in the working region of displacement device 700. Other than for their relative orientations, the characteristics of coil traces 726 may be similar to those of coil traces 126 discussed above.

It will be appreciated that displacement device 700 of the FIG. 20C embodiment will not be able to provide all six degrees of freedom. With suitable control techniques, the embodiment of FIG. 200 C may be capable of providing motion with 4 degrees of freedom.

FIGS. 20A-20C are useful to demonstrate a feature of one aspect and particular embodiments of the invention. Some of the herein-described embodiments include relatively large numbers of magnet arrays. While this can achieve over-actuation which may enhance the ability to control the movement of the moveable stage relative to the stator, this is not necessary. Particular embodiments may comprise moveable stages having any suitable plurality (as few as two) magnet arrays, wherein each such magnet array comprises a plurality of magnetization sections that are generally linearly elongated along a corresponding direction, provided that the directions of linear elongation of all of the magnet arrays span the X-Y plane of the moveable stage. While the preferred directions of linear elongation may comprise at least two orthogonal directions (which may make control calculations relatively more simple), this is not necessary. In the case where the magnet arrays are aligned in a single moveable stage XY plane, any two or more non-parallel directions of linear elongation will span the XY plane. In currently preferred embodiments where six degrees of freedom are desired, three of more magnet arrays are provided with at least two of the magnet arrays being linearly elongated in non-parallel directions and with the force-centers of the three magnet arrays being non-co-linear. In addition, the directions of magnetization of the magnetization segments in each magnet array are generally orthogonal to the direction in which the magnetization segments are linearly elongated. Within a magnet array, the magnetization of the magnetization segments may have characteristics similar to any of those described herein—see FIGS. 7 and 8 for example.

Similarly, particular embodiments may comprise stators having coil traces elongated in any suitable plurality of directions, provided that the directions of linear elongation of the coil traces span a notional X-Y plane of the stator. While the preferred directions of linear elongation may comprise at least two orthogonal directions (which may make control calculations relatively more simple), this is not necessary. Any two or more non-parallel directions of linear elongation will span the notional XY plane of the stator. The XY plane of the stator may be referred to as a notional XY plane, since coil traces having different directions of linear elongation may be provided on different layers as discussed above. Such layers may have different locations in the Z-direction. Accordingly, the notional XY plane of the stator may be thought of as though the coil traces in each such layer were notionally brought to a single XY plane having a corresponding single location along the Z-axis.

Figure 21B:
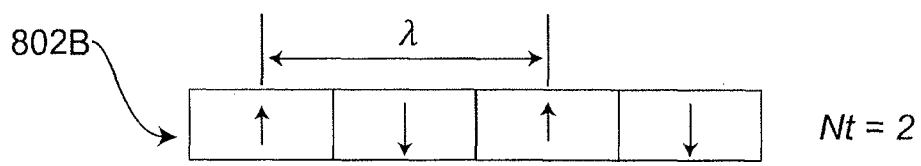
FIGS. 21A-21C schematically depict cross-sectional views of magnet arrays having different numbers of magnetization directions within a particular magnetic spatial period.
Figure 21A:
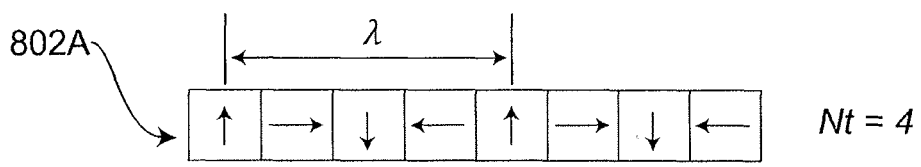
Figure 21C:
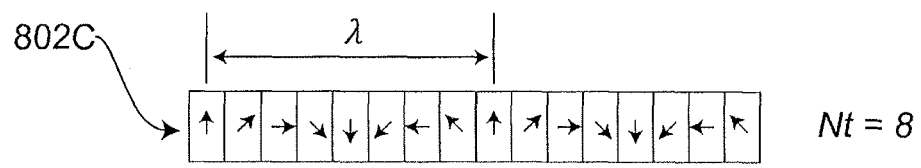

The description set out above describes that there may be different numbers $N_t$ of magnetization directions within a magnetic spatial period $\lambda$. However, $N_t=4$ for all of the illustrated embodiments described above. FIGS. 21A-21C schematically depict magnet arrays 802A, 802B, 802C having different values of $N_t$—i.e. different numbers of magnetization directions within a particular magnetic period $\lambda$. Magnet array 802A of FIG. 21A has $N_t=4$, magnet array 802B of FIG. 21B has $N_t=2$ and magnet array 802C of FIG. 21C has magnet array $N_t=8$. The number $N_t$ may be selected to be any suitable number, with the advantage of having relatively large $N_t$ is that relatively large $N_t$ provides the corresponding magnet array with a relatively large fundamental harmonic and relatively small higher order harmonics at the expense of possibly greater cost and complexity in fabricating the magnet array.

As discussed above, the coil layouts shown in FIGS. 3D-3F (where $W_c=\lambda/5$) have an advantage that they may result in cancellation or attenuation of some of the effects of the $5^{th}$ order harmonic of the magnetic field created by a magnet array 112. FIG. 22A schematically shows a coil trace layout according to another embodiment which may be used in displacement device 100. Coil traces 126 in the FIG. 22A embodiment are skewed in the XY plane of moveable stage 110 by an amount $O_c$ over the trace length $L_m$. In some embodiments, the amount of skew $O_c$ (which may be understood to be the X-direction distance traversed by Y-oriented trace 126 over its Y-dimension length $L_m$) may be selected to be $\lambda/5$ or $\lambda/9$ or $\lambda/13$ so as to result in attenuation of the $5^{th}$, or $9^{th}$ or $13^{th}$ order harmonic of the magnetic field created by a magnet array 112. This skew amount $O_c$ may be adjusted to attenuate other harmonics by setting $O_c=\lambda/n$, where n is the number of the harmonic for which attenuation is desired. In the FIG. 22A embodiment, the x-dimension width $W_m$ of coil trace 126 is shown as being $\lambda/6$, but this is not necessary in general and the Y-dimension width $W_m$ may have other values. By way of non-limiting example, other than for the skew mentioned above, the layout of the FIG. 22A coil trace similar to any of the layouts shown in FIGS. 3A-3F).

It will be appreciated that Y-oriented coil traces 126 that are skewed in the manner shown in FIG. 22A will result in some possibly undesirable coupling between the Y-oriented coils and the X-magnet arrays 112. That is, current flowing in Y-oriented coil traces having the skew shown in FIG. 22A may impart forces or torques on X-magnet arrays 112. In the case of Y-oriented coil traces 126, such cross-coupling may be reduced or minimized by skewing the Y-oriented coil traces 126 in alternating layers 128 of Y-oriented traces 126 in opposing directions to have a canceling or attenuating effect on this cross coupling. FIG. 22B schematically illustrates a pair of adjacent layers 128 of Y-oriented coil traces 126. For clarity, the X-oriented coils between the layers 128 of Y-oriented coils 126 are not expressly shown. The Y-oriented coil traces 126 in adjacent layers 128 of the FIG. 22B embodiment are skewed in opposite directions in the X-Y plane. This opposing skew of the coil traces 126 in adjacent layers 128 may be used to reduce or minimize undesirable coupling between Y-oriented coils 126 and X-magnet arrays 112, while simultaneously reducing the effect of the 5th order harmonic of the magnetic field of the magnet arrays 112. As in the various embodiments of coil traces 126 described above, coil traces 126 in different layers 128 may be electrically connected in series, in parallel and/or individually.

FIGS. 23A-23D show various embodiments of Y-oriented coil traces 126 which (while generally linearly elongated in the Y-direction) exhibit a spatial triangle-wave which extends in the X-direction over a total X-direction peak-to-peak amplitude $O_c$ and Y-direction spatial period $\tau_C$. In the illustrated embodiment, Y-direction spatial period $\tau_c$ is set to an integer factor of the Y-direction length $L_m$ (e.g. $L_m$ in FIG. 23A, $L_m/2$ in FIG. 23B, $L_m/3$ in FIG. 23C and $L_m/4$ in FIG. 23D) and the amplitude $O_c$ is set to $\lambda/5$. These two characteristics of Y-oriented coil trace 126 can reduce the effect of the cross-coupling of Y-oriented trace with X-magnet arrays 112 and can also help to attenuate the effects of the 5th order harmonic of the magnetic field of arrays 112 on a single layer 128 of coil traces. It will be appreciated that setting the value of $O_c$ to have different values can be used to cancel other harmonics (e.g. the $9^{th}$ order harmonic or the $13^{th}$ order harmonic) by setting $O_c=\lambda/n$, where n is the number of the harmonic for which attenuation is desired. Y-oriented coil traces 126 on adjacent Y-oriented layers 128 may be fabricated to have opposing triangular wave phase (e.g. opposing in the X-direction). FIGS. 23E and 23F show similar spatially periodic square wave and sinusoidal waveforms for Y-oriented coil traces 126, wherein the Y-direction spatial period $\tau_c$ is set to an integer factor of the Y-direction length $L_m$ and the peak to peak amplitude $O_c$ is set to $\lambda/5$ to attenuate the effect of the 5th order harmonic of magnet arrays 112.

FIG. 24C schematically depicts a Y-oriented coil trace 126 which results from the superposition of the square wave coil trace 126 of FIG. 24A and the triangular wave coil trace 126 of FIG. 24B. The FIG. 24A square wave has a spatial period $T_{c1}$ and an amplitude $O_{c1}$ and the FIG. 24B triangular wave has a spatial period $\tau_{c2}$ and an amplitude $O_{c2}$. Preferably, the spatial periods $\tau_{c1}$ and $\tau_{c2}$ are both set to an integer factor of the Y-direction length $L_m$ of the coil 126. The amplitudes $O_{c1}$ and $O_{c2}$ may be set to different levels to attenuate the effects of more than one harmonic order of the magnetic field of magnet arrays 112. In general, the value of $O_{c1}$ and $O_{c2}$ may be set to different levels of $O_{c1}=\lambda/n$ and $O_{c2}=\lambda/m$, where n and m are the numbers of the harmonics for which attenuation is desired.

Figure 25A:
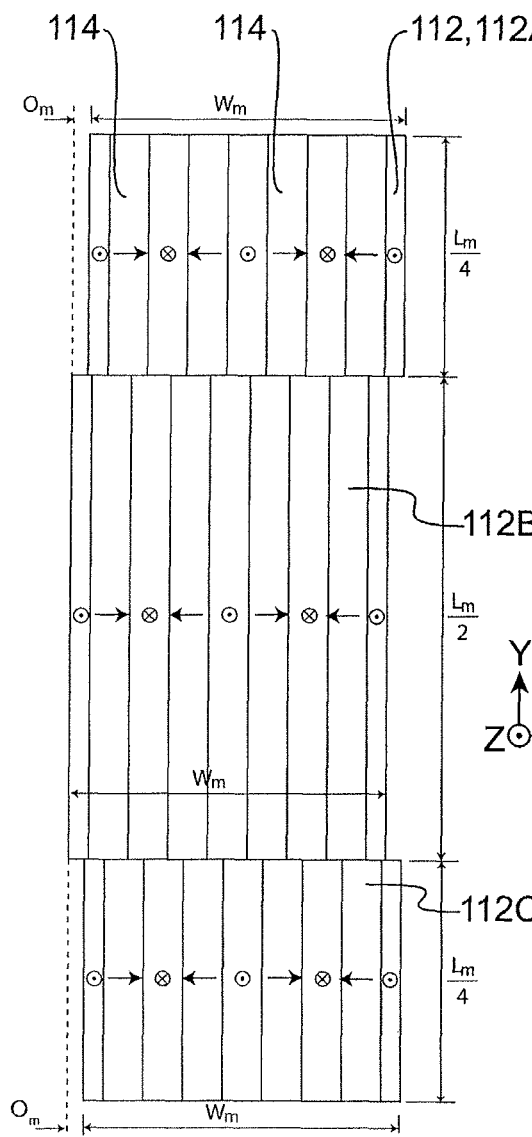
FIGS. 25A-25D show various embodiments of magnet arrays having offset or shifted sub-arrays which may be used in the FIG. 1 displacement device.

In addition to or in the alternative to varying the linear elongation of coils 126 in effort to attenuate the effects of higher order harmonics of the magnetic fields of magnet arrays 112, some embodiments, may involve varying the linear elongation of magnet arrays 112 and their magnetization segments 114. FIG. 25A shows a magnet array 112 according to another embodiment which may be used in displacement device 100. Magnet array 112 shown in the illustrated embodiment of FIG. 25A is a Y-magnet array and its Y-dimension $L_m$ is divided into a plurality of sub-arrays 112A, 112B, 112C, each of which is offset in the X-direction by a distance $O_m$ from its adjacent sub-array. In the illustrated embodiment, sub-arrays 112A, 112C at the extremities of magnet array 112 have Y-dimensions of $L_m/4$ and sub-array 112B in the middle of magnet array 112 has a Y-dimension of $L_m/2$. In the illustrated embodiment, sub-arrays 112A, 112C are aligned with one another in the X-direction and are both offset in the X-direction from sub-array 112B by a distance $O_m$. In some embodiments, it may be possible that sub-array 112C is offset from sub-array 112B in the same X-direction as sub-array 112B is offset from sub-array 112A.

In some embodiments, the offset $O_m$ may be set at least approximately equal to $$O_m = \left(\frac{N_m}{5} - \frac{1}{10}\right)\lambda,$$

where $N_m$, is any integer number. Setting $O_m$ to have this characteristic will tend to attenuate or cancel the effects of the interaction of the $5^{th}$ order harmonic of the magnet field of magnet array 112 with coil traces 126 that carry current in the Y-direction, thereby reducing or minimizing associated force ripples. In some embodiments, the offset $O_m$ may be set at least approximately equal to $O_m$ is set at $$\left(\frac{N_m}{9} - \frac{1}{18}\right)\lambda,$$

to attenuate me effects of the interaction of the $9^{th}$ order harmonic of the magnetic field of magnet array 112 with coil traces 126 that carry current in the Y-direction. In some embodiments, the offset $O_m$ may be set at least approximately equal to $$O_m = \frac{N_m}{5}\lambda - W_c,$$

where $N_m$ is any integer number and $W_C$ is the X-axis width of coil traces 126 generally elongated in Y direction. Setting $O_m$ to have this characteristic will tend to attenuate or cancel the effects of the interaction of the $5^{th}$ order harmonic of the magnet field of magnet array 112 with coil traces 126 that carry current in the Y-direction, thereby reducing or minimizing associated force ripples. In some embodiments, the offset $O_m$ may be set at least approximately equal to $O_m$ is set at $$\frac{N_m}{9}\lambda - W_c,$$

to attenuate the effects of the interaction of the $9^{th}$ order harmonic of the magnetic field of magnet array 112 with coil traces 126 that carry current in the Y-direction.

Figure 25B:
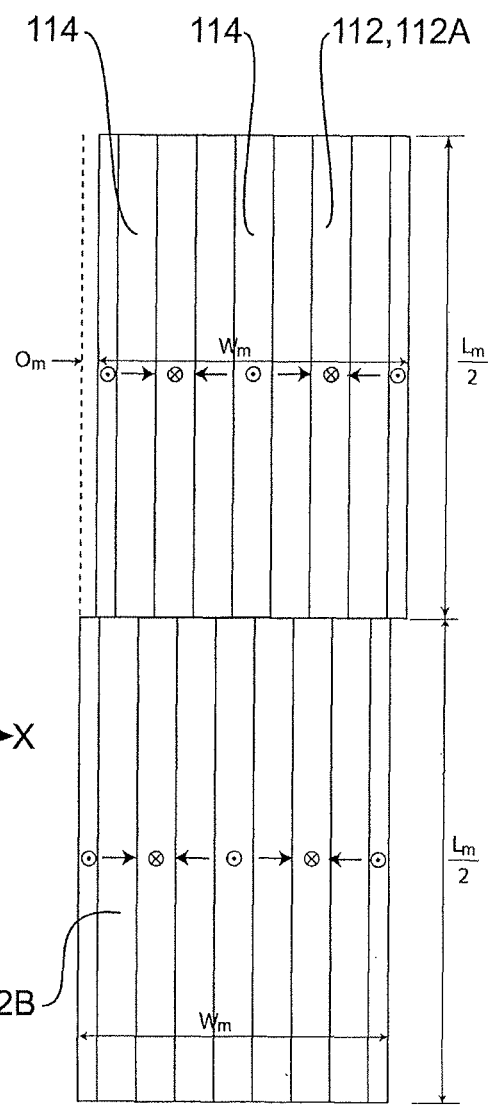

In some embodiments, magnet arrays 112 may be provided with different numbers of sub-arrays. FIG. 25B shows a particular embodiment where the Y-dimension $L_m$ of Y-magnet array 112 comprises a pair of sub-arrays 112A, 112B, each having a Y-dimension of $L_m/2$ and offset from one another by a distance $O_m$ in the X-direction. The offset distance $O_m$ of the FIG. 25B sub-arrays 112A, 112B can have the same characteristics as the offset distance $O_m$ of the FIG. 25A sub-arrays. While magnet array 112 shown in the illustrated embodiment of FIG. 25A comprises three sub-arrays and magnet array 112 shown in the illustrated embodiment of FIG. 25B comprises two sub-arrays, magnet arrays 112 may generally be provided with any suitable number of sub-arrays having characteristics similar to those shown in FIGS. 25A and 25B.

Figure 25D:
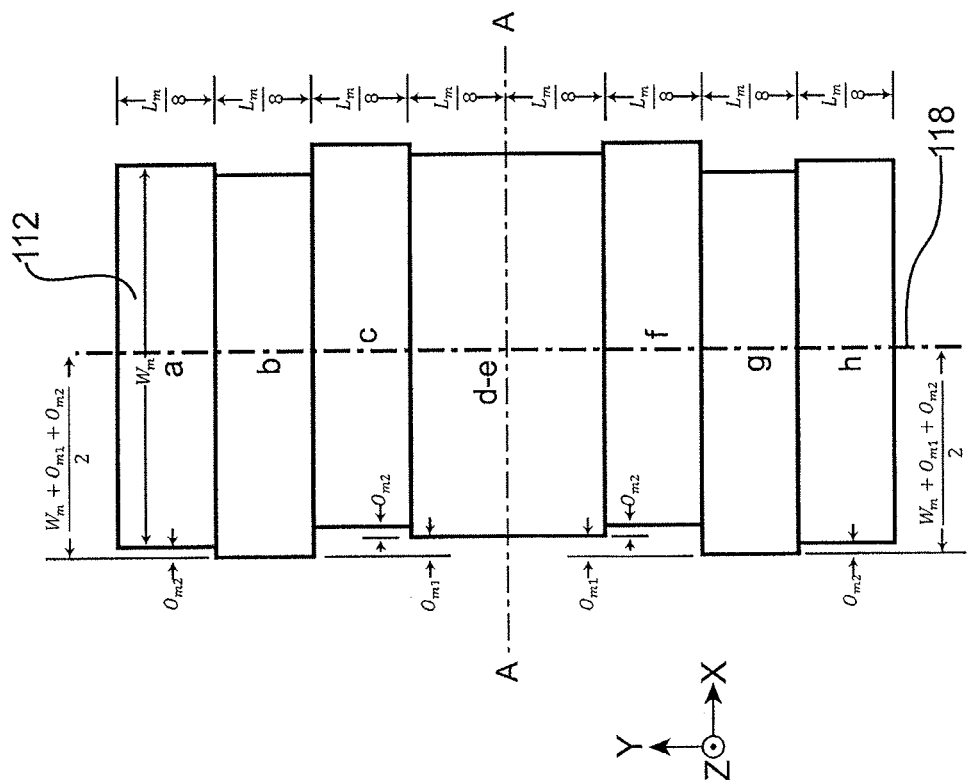
Figure 25C:
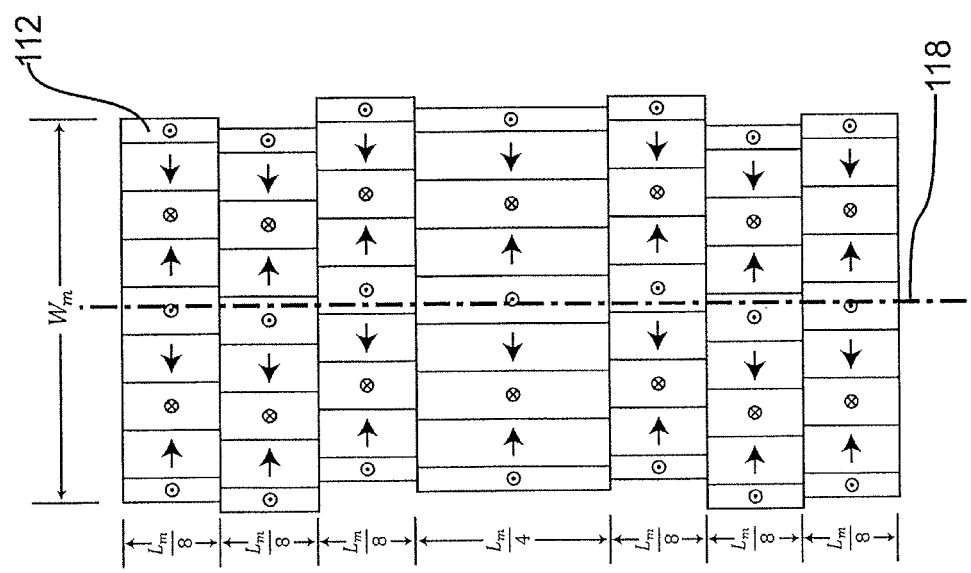

FIGS. 25C and 25D show a number of embodiments of magnet arrays 112 which may be used to attenuate the effects of multiple spatial harmonics of their corresponding magnetic fields. FIGS. 25C and 25D show one embodiment of a Y-magnet array 112, which comprises six sub-arrays having Y-direction lengths $$\frac{L_m}{8}$$

(labeled a,b,c,t,g,h in FIG. 25D) and one sub-array having Y-direction length $$\frac{L_m}{4}$$

(labeled a-e in FIG. 25D), where $L_m$ is the total Y-direction length of magnet array 112. FIG. 25D shows how some of sub-arrays (a, b, c, d-e, f, g, h) are shifted or offset (in the X-direction) relative to one another. In the embodiment of FIGS. 25C and 25D, sub-arrays b and g are aligned in the X-direction, sub-arrays a and h are shifted (rightwardly in the illustrated view) relatively to sub-arrays b and g by an amount $O_{m2}$, sub-arrays d and e (together sub-array d-e) are shifted (rightwardly in the illustrated view) relatively to sub-arrays b and g by an amount $O_{m1}$ and sub-arrays c and f are shifted (rightwardly in the illustrated view) relatively to sub-arrays b and g by an amount $2O_{m2}+O_{m1}$. Each sub-array a,b,c,d-e,f,g,h of the illustrated embodiment has a X-dimension width $W_m$. Mirror symmetry on line A-A (at the center of the Y-dimension $L_m$ of magnet array 112) reduces or minimizes moment and/or force disturbance on the FIG. 25C, 25D magnet array 112. The harmonics attenuated by the FIG. 25C, 25D arrangement have spatial wavelengths equal to $2O_{m1}$ and $2O_{m2}$. For example, by setting $O_{m1}=\lambda/10$ and $O_{m2}=\lambda/26$, the $5^{th}$ and $13^{th}$ harmonics of the magnetic field are attenuated. In general, by setting $O_{m1}=\lambda(M-0.5)/p$, $O_{m1}=\lambda(N-0.5)/q$ will greatly minimize disturbance moment/force resulting from harmonic magnetic fields of wavelength (spatial period) both $\lambda/p$ and $\lambda/q$, where M and N are arbitrary integer numbers.

The techniques illustrated in FIGS. 25C-25D can be extrapolated so that field-induced disturbance moment and/or force effects associated with any suitable number of harmonics may be simultaneously attenuated using a suitable variation of these techniques. It is also possible to attenuate the field-induced effects of one harmonic order, but retain some level of net moment disturbance (such as shown in FIG. 25B).

Like the skewed coil traces 126 of FIGS. 22A, 22B and the spatially periodic coil traces 126 of FIGS. 23A-23F and 24C, magnet arrays 112 of particular embodiments can be skewed or provided with spatial periodicity along the direction that their respective magnetization segments 114 are generally linearly elongated. Such skewing and/or spatial periodicity of magnet arrays 112 may be used to reduce or minimize the effects of higher order harmonics of the magnetic fields of these magnet arrays 112. FIG. 26A shows a Y-magnet array 112 which is generally linearly elongated in the Y-direction, but which is skewed by an amount $O_p$ in the X-direction over its Y-dimension length $L_m$. Assuming that the FIG. 26A magnet array 112 is configured to interact with coil traces 126 having a rectangular geometry with a coil width $W_c$ as defined above, then the skew amount may be set to be at least approximately equal to a non-negative value $O_p = k\Lambda_f - W_c$, where $\Lambda_f$ is the wavelength of the spatial harmonic of the magnetic field that is to be attenuated and k is a positive integer number. For example, if it desired to attenuate the effects of the $5^{th}$ order harmonic filed of the FIG. 26A magnet array 112, then $O_p$ can be set to be $k\lambda/5 - W_c$ where k is a positive integer number.

FIGS. 26B and 26C show spatially periodic Y-magnet arrays 112, wherein an edge of each array 112 varies in the X-direction by an amount $O_p$ over it Y-dimension length $L_m$. The magnet arrays 112 of FIGS. 26B and 26C are periodic with a spatial period $\tau_m$ where $\tau_m = L_m$ in the FIG. 26B array and $\tau_m = L_m/2$ in the FIG. 26C array. Like the case of the spatially periodic coil traces discussed above, the spatial period $\tau_m$ may generally be set to be an integer factor of the Y-dimension length $L_m$. Also, similar to the case of the spatially periodic coil traces discussed above, spatially periodic magnet arrays may be provided with spatially periodic waveforms other than triangular waveforms, such as square waves, sinusoidal waveforms or superposed waveforms. The peak-to-peak amplitude parameter $O_p$ can have the characteristics of the term $O_p$ discussed above in connection with FIG. 26A.

In some embodiments, a combination of skewed coil traces and slanted magnet arrays may also be usefully implemented to eliminate internal stresses in the magnetic arrays while reducing or minimizing the effects of the interaction of current carrying coil traces with higher order harmonics of the magnetic fields of the magnet arrays.

While a number of exemplary aspects and embodiments are discussed herein, those of skill in the art will recognize certain modifications, permutations, additions and sub-combinations thereof. For example:

The coil traces shown in the embodiment of FIGS. 22, 23 and 24 are Y-oriented coil traces. It will be appreciated that X-oriented coil traces could be provided with similar characteristics. Similarly, the magnet arrays shown in the embodiments of FIGS. 25 and 26 are Y-magnet arrays, but it will be appreciated that X-magnet arrays could be provided with similar characteristics. Also, the magnet arrays shown in the embodiments of FIGS. 25 and 26 have a particular pattern of magnetization. In general, these magnet arrays may be provided with any suitable magnetization pattern, such as any of those shown in FIGS. 7 and 8, for example.

Figure 27A:
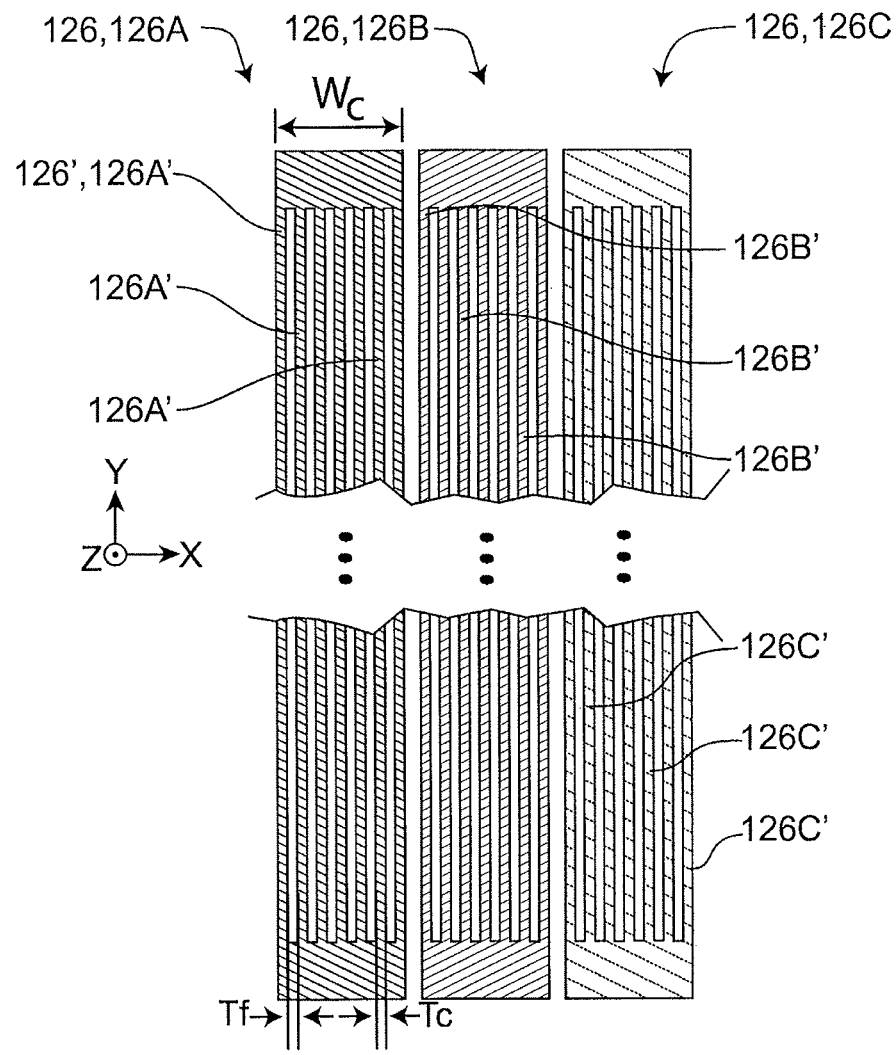
FIGS. 27A and 27B respectively depict a top view of a number of coil traces and a cross-sectional view of a coil trace which comprise multiple sub-traces in accordance with a particular embodiment which may be used in the FIG. 1 displacement device.

For the purpose of minimizing or reducing eddy currents induced by the motion of magnet arrays 112 on moveable stage 110, coil traces 126 may be made relatively narrow. In some embodiments, each coil trace 126 may comprise a plurality of sub-traces 126'. Such an embodiment is shown schematically in FIG. 27A (in top view) and in 27B (in cross-section). In coil traces 126A, 126B, 126C of FIG. 27A, each coil trace 126A, 126B, 126C comprises a plurality of corresponding sub-traces 126A', 126B', 126C' (collectively, sub-traces 126') where each sub-trace 126' has a width $T_c$ that is a fraction of the width $W_c$ of its corresponding coil 126.

Figure 27B:
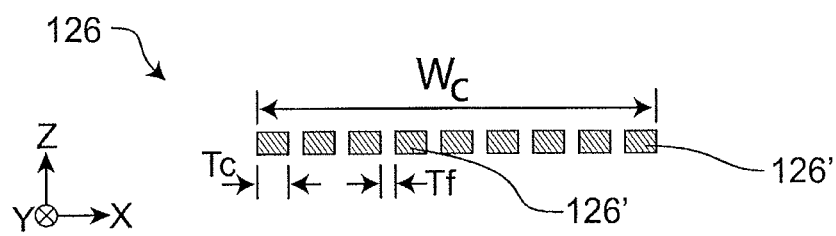

Each sub-trace 126' only carries a portion of the current flowing through its corresponding trace 126. Each sub-trace 126' in the FIG. 27A embodiment is insulated from its adjacent sub-trace 126' by an insulator of width $T_f$, although it is not generally necessary for the insulator width $T_f$ to be uniform within a coil trace 126 and there is a desire to minimize Tf, to achieve high surface fill factor. In general, any suitable number of sub-traces 126' may be provided in each trace 126 depending on the trace width $W_c$, the sub-trace width $T_c$ and the insulation with $T_f$. The sub-traces 126' of each corresponding coil trace 126 may be electrically connected in parallel at their ends (e.g. at their Y-dimension ends in the case of the illustrated embodiment). The regions where sub-traces 126' are connected to one another may be outside of the working region of device 100—i.e. outside of the range of motion of moveable stage 110, although this is not necessary. In other embodiments, sub-traces 126' may be serially connected with one another. Coil sub-traces 126' may be fabricated using known PCB fabrication technology. FIG. 27B shows a cross-sectional view of one particular trace 126 and its corresponding sub-traces 126'.

Coil traces 126 may be fabricated using techniques other than PCB technology. Any conductor that is or may be shaped to be generally linearly elongated may be used to provide coil traces 126. FIGS. 28A and 28B show one example with coils 122 in an active region 124 of stator 120 comprising coil traces 126 having round cross-sections. FIG. 28B shows detail of how traces 126 are generally linearly elongated in the X and Y directions to provide alternating layers 128 of traces X-oriented traces 126X and Y-oriented traces 126Y. Each trace 126 shown in FIGS. 28A and 28B may be made up of further sub-traces of various cross-sections. FIG. 28C shows one example, wherein a trace 126 having circular cross-section comprises a plurality of sub-traces 126' having circular cross-section. One common method for implementing this trace would be to use standard multi-filament wire with an external insulator. FIG. 28D shows one example of a coil trace 126 having rectangular cross-section with sub-traces 126' of circular cross-section.

In the illustrated embodiments, coil traces 126 on different layers 128 are shown as being the same as one another. In some embodiments, coil traces 126 on different layers 128 and/or coil traces 126 with different orientations (e.g. X-orientations and Y-orientations) may have properties that are different from one another. By way of non-limiting example, X-oriented coil traces 126 may have a first coil width $W_{c1}$ and/or coil pitch $P_{c1}$ and Y-oriented coil traces 126 may have a second coil width $W_{c2}$ and/or coil pitch $P_{c2}$ which may be the same or different from those of the X-oriented coil traces 126. Other properties of coil traces 126 could additionally or alternatively be different from one another. Similarly, magnet arrays 112 (e.g. magnet arrays 112 of different orientations (e.g. X-magnet arrays and Y-magnet arrays 112) or even magnet arrays 112 with the same orientations) are shown as being the same as one another. In some embodiments, different magnet arrays 112 may have properties that are different from one another. By way of non-limiting example, X-magnet arrays could have first widths $W_{m1}$ and/or spatial periods $\lambda_1$ and Y-magnet arrays may have second widths $W_{m2}$ and/or spatial periods $\lambda_2$. Other properties of magnet arrays 112 could additionally or alternatively be different from one another.

In this description and the accompanying claims, elements (such as layers 128, coil traces 126, moving stages 110 or magnet arrays 112) are said to overlap one another in or along a direction. For example, coil traces 126 from different layers 128 may overlap one another in or along the Z-direction. When it is described that two or more objects overlap in or along the Z-direction, this usage should be understood to mean that a Z-direction-oriented line could be drawn to intersect the two or more objects.

In the description and drawings provided herein, moveable stages are shown as being static with their X, Y and Z axes being the same as the X, Y and Z axes of the corresponding stator. This custom is adopted in this disclosure for the sake of brevity. It will of course be appreciated from this disclosure that a moveable stage can (and is designed to) move with respect to its stator, in which case the X, Y and Z axes of the moveable stage may no longer be the same as (or aligned with) the X, Y and Z axes of its stator. Accordingly, in the claims that follow, the X, Y and Z axes of the stator are referred to as the stator X-axis, the stator Y-axis and the stator Z-axis and the X, Y and Z axes of the moveable stage are referred to as the stage X-axis, the stage Y-axis and the stage Z-axis. Corresponding directions may be referred to as the stator X-direction (parallel to the stator X-axis), the stator Y-direction (parallel to the stator Y-axis), the stator Z-direction (parallel to the stator Z-axis), the stage X-direction (parallel to the stage X-axis), the stage Y-direction (parallel to the stage Y-axis) and the stage Z-direction (parallel to the stage Z-axis). Directions, locations and planes defined in relation to the stator axes may generally be referred to as stator directions, stator locations and stator planes and directions, locations and planes defined in relation to the stage axes may be referred to as stage directions, stage locations and stage planes.

In the description above, stators comprise current carrying coil traces and moveable stages comprise magnet arrays. It is of course possible that this could be reversed—i.e. stators could comprise magnet arrays and moveable stages could comprise current carrying coil traces. Also, whether a component (e.g. a stator or a moveable stage) is actually moving or whether the component is actually stationary will depend on the reference frame from which the component is observed. For example, a stator can move relative to a reference frame of a moveable stage, or both the stator and the moveable stage can move relative to an external reference frame. Accordingly, in the claims that follow, the terms stator and moveable stage and references thereto (including references to stator and/or stage X, Y, Z-directions, stator and/or stage X,Y,Z-axes and/or the like) should not be interpreted literally unless the context specifically requires literal interpretation Moreover, unless the context specifically requires, it should be understood that the moveable stage (and its directions, axes and/or the like) can move relative to the stator (and its directions, axes and/or the like) or that the stator (and its directions, axes and/or the like) can move relative to a moveable stage (and its directions, axes and/or the like).

While a number of exemplary aspects and embodiments have been discussed above, those of skill in the art will recognize certain modifications, permutations, additions and sub-combinations thereof. It is therefore intended that the following appended claims and claims hereafter introduced are interpreted to include all such modifications, permutations, additions and sub-combinations as are within their true spirit and scope.

What is claimed is:

1. A method for effecting displacement between first and second moveable stages on a stator, the method comprising:
   providing a stator comprising a plurality of elongated coils shaped to provide a working region wherein traces of the coils are generally linearly oriented, the plurality of elongated coils comprising:
      a first plurality of coil traces distributed over a first layer at a corresponding first stator Z-location, the first plurality of coil traces generally linearly elongated in a stator X-direction in the first layer; and
      a second plurality of coil traces distributed over a second layer at a corresponding second stator Z-location, the second plurality of coil traces generally linearly elongated in a stator Y-direction in the second layer, the stator Y-direction generally orthogonal to the stator X-direction;
      the first and second layers overlapping one another in a stator Z-direction in the working region, the stator Z-direction generally orthogonal to both the stator X-direction and the stator Y-direction; and
   providing a first moveable stage comprising:
      a first first magnet array comprising a plurality of first first magnetization segments generally linearly elongated in a stage X-direction, each first first magnetization segment having a magnetization direction generally orthogonal to the stage X-direction and at least two of the first first magnetization segments having magnetization directions that are different from one another; and
      a first second magnet array comprising a plurality of first second magnetization segments generally linearly elongated in a stage Y-direction generally orthogonal to the stage X-direction, each first second magnetization segment having a magnetization direction generally orthogonal to the stage Y-direction and at least two of the first second magnetization segments having magnetization directions that are different from one another;
   providing a second moveable stage comprising:
      a second first magnet array comprising a plurality of second first magnetization segments generally linearly elongated in the stage X-direction, each second first magnetization segment having a magnetization direction generally orthogonal to the stage X-direction and at least two of the second first magnetization segments having magnetization directions that are different from one another; and
      a second second magnet array comprising a plurality of second second magnetization segments generally linearly elongated in the stage Y-direction generally orthogonal to the stage X-direction, each second second magnetization segment having a magnetization direction generally orthogonal to the stage Y-direction and at least two of the second second magnetization segments having magnetization directions that are different from one another;
   causing the first moveable stage to move past the second moveable stage in the stator X-direction, wherein causing the first moveable stage to move past the second moveable stage in the stator X-direction comprises:

imparting momentum on the first moveable stage in the stator-X direction by selectively driving current in at least one driver coil trace of the second plurality of coil traces to thereby effect movement of the first moveable stage in the stator X-direction relative to the second moveable stage;

overlapping a first portion of the first moveable stage with a first portion of the second moveable stage in the stator Y-direction;

after imparting momentum on the first moveable stage in the stator-X direction, using the momentum of the first moveable stage to cause the first moveable stage to move in the stator X-direction at least until a second portion of the first moveable stage is non-overlapping with a second portion of the second movable stage in the stator Y-direction by selectively reducing current in at least one shared coil trace of the second plurality of coil traces, the at least one shared coil trace comprising a coil trace that overlaps at least one first second magnetization segment and at least one second second magnetization segment in the stator Z-direction;

after the second portion of the first moveable stage is non-overlapping with the second portion of the second movable stage in the stator Y-direction, controlling the first moveable stage in the stator X-direction by selectively driving current in at least one non-shared coil trace of the second plurality of coil traces, the at least one non-shared coil trace overlapping only one or more first second magnetization segments of the first moveable stage from among the first second and second second magnetization segments.

2. The method according to claim 1 wherein selectively reducing current in the at least one shared coil trace of the second plurality of coil traces comprises turning off the at least one shared coil trace of the second plurality of coil traces.

3. The method according to claim 1 wherein the at least one driver coil trace of the second plurality of coil traces is on a first stator X-direction side of each second second magnetization segment.

4. The method according to claim 1 wherein the at least one non-shared coil trace is on a second stator X-direction side, opposite a first stator X-direction side, of each second second magnetization segment.

5. The method according to claim 1 comprising controlling the first moveable stage in the stator Y-direction while causing the first moveable stage to move past the second moveable stage in the stator X-direction.

6. The method according to claim 5 wherein controlling the first moveable stage in the stator Y-direction comprises selectively driving current in the first plurality of coil traces to cause relative movement between the second moveable stage and the stator.

7. The method according to claim 1 wherein selectively reducing current in the at least one shared coil trace of the second plurality of coil traces comprises reducing current in each of the shared coil traces of the second plurality of coil traces.

8. The method according to claim 1 wherein overlapping the at least a first portion of the first moveable stage with the first portion of the second moveable stage in the stator Y-direction comprises driving current in at least one coil trace of the second plurality of coil traces to thereby effect movement of the first moveable stage in the stator X-direction relative to the second moveable stage until the at least a first portion of the first moveable stage overlaps with the first portion of the second moveable stage in the stator Y-direction.

9. The method according to claim 1 wherein overlapping the at least a first portion of the first moveable stage with the first portion of the second moveable stage in the stator Y-direction comprises using the momentum of the first moveable stage to cause the first moveable stage to move in the stator X-direction until the at least a first portion of the first moveable stage overlaps with the first portion of the second moveable stage in the stator Y-direction.

10. The method according to claim 1 wherein selectively reducing the current in the at least one shared coil trace of the second plurality of coil traces comprises selectively reducing the current in the at least one shared coil trace of the second plurality of coil traces when more than half of a stage X-direction dimension of the first moveable stage overlaps the second moveable stage in the stator Y-direction.

11. The method according to claim 1 wherein the at least a first portion of the first moveable stage comprises at least one first second magnetization segment.

12. The method according to claim 1 wherein the at least a second portion of the first moveable stage comprises at least one first second magnetization segment.

13. The method according to claim 1 wherein the magnetization directions of the plurality of first magnetization segments exhibit a first spatial magnetic period $\lambda_1$ over a stage Y-direction width $W_{m1}$ of the first magnet array and the magnetization directions of the plurality of second magnetization segments exhibit a second spatial magnetic period $\lambda_2$ over a stage X-direction width $W_{m2}$ of the second magnet array.

14. The method according to claim 1 wherein the first moveable stage comprises:
a first third magnet array comprising a plurality of first third magnetization segments generally linearly elongated in the stage X-direction, each first third magnetization segment having a magnetization direction generally orthogonal to the stage X-direction and at least two of the first third magnetization segments having magnetization directions that are different from one another; and
a first fourth magnet array comprising a plurality of first fourth magnetization segments generally linearly elongated in the stage Y-direction, each first fourth magnetization segment having a magnetization direction generally orthogonal to the stage Y-direction and at least two of the first fourth magnetization segments having magnetization directions that are different from one another.

15. The method according to claim 14 wherein the second moveable stage comprises:
a second third magnet array comprising a plurality of second third magnetization segments generally linearly elongated in the stage X-direction, each second third magnetization segment having a magnetization direction generally orthogonal to the stage X-direction and at least two of the second third magnetization segments having magnetization directions that are different from one another; and
a second fourth magnet array comprising a plurality of second fourth magnetization segments generally linearly elongated in the stage Y-direction, each second fourth magnetization segment having a magnetization direction generally orthogonal to the stage Y-direction and at least two of the second fourth magnetization segments having magnetization directions that are different from one another.

16. The method according to claim 14 wherein the stage locations of the first first and first third magnet arrays are offset from one another in the stage X-direction.

17. The method according to claim 16 wherein the stage locations of the first first and first third magnet arrays are offset from one another in the stage X-direction by a first offset distance, the first offset distance less than a stage X-direction length $L_{m1}$ of the first first magnet array.

18. The method according to claim 16 wherein the first first and first third magnet arrays are spaced apart from one another in the stage Y-direction.

19. The method according to claim 18 wherein the first second and first fourth magnet arrays are offset from one another in the stage Y-direction.

20. The method according to claim 19 wherein the first second and first fourth magnet arrays are spaced apart from one another in the stage X-direction.

* * * * *